US007435935B2

(12) United States Patent
Hirotsu et al.

(10) Patent No.: US 7,435,935 B2
(45) Date of Patent: Oct. 14, 2008

(54) SEMICONDUCTOR IMAGE PICKUP DEVICE WITH DUAL CURRENT GENERATION CIRCUIT CAPABLE OF SENSING LIGHT OVER WIDER RANGE

(75) Inventors: Fusayoshi Hirotsu, 2-6, Hanatachibana 1-chome, Shingumachi, Kasuya-gun, Fukuoka (JP); Junichi Hirotsu, Kitakyushu (JP)

(73) Assignee: Fusayoshi Hirotsu, Fukuoka (JP)

( * ) Notice: Subject to any disclaimer, the term of this patent is extended or adjusted under 35 U.S.C. 154(b) by 897 days.

(21) Appl. No.: 10/975,993

(22) Filed: Oct. 29, 2004

(65) Prior Publication Data

US 2005/0117042 A1 Jun. 2, 2005

(30) Foreign Application Priority Data

Oct. 30, 2003 (JP) ............................ 2003-370574
Sep. 17, 2004 (JP) ............................ 2004-271378

(51) Int. Cl.
*H01L 27/00* (2006.01)

(52) U.S. Cl. ................................ 250/208.1; 250/214 R

(58) Field of Classification Search .............. 250/208.1, 250/214 R; 348/296–314; 257/290–292, 257/440

See application file for complete search history.

(56) References Cited

U.S. PATENT DOCUMENTS

| | | | | |
|---|---|---|---|---|
| 5,481,118 | A | 1/1996 | Tew | |
| 6,323,479 | B1 | 11/2001 | Hynecek et al. | |
| 7,139,024 | B2 * | 11/2006 | Lu et al. | 348/303 |

FOREIGN PATENT DOCUMENTS

| | | |
|---|---|---|
| JP | 2000-340779 | 12/2000 |
| WO | WO 02/059979 A1 | 8/2002 |

OTHER PUBLICATIONS

Taiwanese Office Action dated Aug. 30, 2005 for Appln. No. 093131581, inventor Fusayoshi Hirotsu.

Takada, K. et al., "Chapter 3: Logarithmic Transformation CMOS Image Sensor Technology and Application in Minolta/ROHM in *CCD/CMOS Image Sensor Technology*", TRICEPS, pp. 107-117, (Jul. 2000).

* cited by examiner

*Primary Examiner*—Que T Le
(74) *Attorney, Agent, or Firm*—Finnegan, Henderson, Farabow, Garrett & Dunner, L.L.P.

(57) ABSTRACT

A semiconductor image pickup device's pixel circuits each include a photodetection element, and first and second current mirror circuits provided as current generation circuit. The photodetection element generates at a node a photocurrent corresponding to a quantity of light received. The first current mirror circuit passes first and second currents corresponding to the photocurrent to an internal node and an output node, respectively. The second current mirror circuit is connected to generate a fourth current corresponding to a third current passing through the internal node and also allow a differential current between the second and fourth currents to flow through the output node. Each pixel circuit has its internal node electrically connected by a resistance component, which implements an inter-pixel connect, to the internal node of at least one of adjacent pixel circuits. An output current will be a current corresponding to a relative difference between the photocurrent of the pixel circuit of interest and the third current corresponding to an average quantity of light received at adjacent pixels. Thus a high precision, miniaturized semiconductor image pickup device can be provided that can detect bright and dark portions in sufficient contrast even if there is a large brightness distribution within a single field of view.

16 Claims, 23 Drawing Sheets

SEMICONDUCTOR IMAGE PICKUP DEVICE WITH DUAL CURRENT GENERATION CIRCUIT CAPABLE OF SENSING LIGHT OVER WIDER RANGE

BACKGROUND OF THE INVENTION

1. Field of the Invention

The present invention relates generally to semiconductor image pickup devices and particularly to those which can pick up an image in a wide dynamic range if in a field of view there concurrently exist regions having a large difference in brightness, and which can also detect sufficient contrast in all regions.

2. Description of the Background Art

Charge coupled devices (CCDs), complementary metal-oxide semiconductors (CMOSs), imagers and other similar solid pickup devices, or so-called semiconductor image sensors (hereinafter also referred to as "semiconductor image pickup devices") are incorporated in video cameras, digital cameras and the like. Such semiconductor image pickup devices are now also incorporated in mobile phones and the like and widely used as inexpensive and less power consuming pickup devices.

A semiconductor image pickup device, however, has a sensing ability significantly inferior to human visual perception. Human vision can sufficiently detect a contrast between a bright place and a dark place if in a single field of view there is a distribution in brightness of approximately four to five digits. This excellent ability to sense contrast is implemented because retina has therein photoreceptive cells, which can each adjust its receiving-light sensitivity individually.

In contrast, conventional semiconductor image pickup devices have pixels all having a uniform receiving-light sensitivity, and it is difficult to simultaneously obtain sufficient contrast at bright the dark spaces in a field of view.

FIGS. 29 and 30 show by way of example images picked up by a conventional semiconductor image pickup device. These images show a view which is shot in a sunny day inside a room with a fluorescent lamp turned on and also includes a view outside a window. Such a view is a common one often seen in daily life. It is apparent through experience that in such an ordinary view, the human eye can see the indoor view as well as that outside the window without difficulty in sufficient contrast.

Conventional semiconductor image pickup devices, however, have pixels all having identical receiving-light sensitivity and its dynamic range itself is significantly small. As such, if a user desires to pick up an image of a particular region in a single field of view, the other regions would be outside a region allowing an image to be picked up.

For example in the FIG. 29 example each pixel has its receiving-light sensitivity adjusted to be suitable for shooting an image of a darker region or an indoor view. This results in too bright an outdoor image, causing so-called whiteout, and the brighter portion's contrast cannot be detected.

In contrast, in the FIG. 30 example, each pixel has its receiving-light sensitivity adjusted to be suitable for shooting the brighter outdoor image. This results in too dark an indoor image, having so-called blackout, and the darker portion's contrast can hardly be detected.

Thus when there exist bright and dark regions simultaneously in a field of view, conventional image sensors have a significantly inferior capability of detecting sufficient contrast in all regions to human visual detection.

Furthermore, CDD/CMOS image technology: chapter 3 "Logarithmic transformation CMOS image sensor technology and application in Minolta/ROHM," Kenji Takada et. al., Triceps, pp. 107-117 suggests a technique to address a limit in detecting whiteout, blackout and the like attributed to narrow dynamic range by a technique of a wide dynamic range camera employing a log amplifier and the like.

FIG. 31 shows by way of example an image picked up with a wide dynamic range camera employing a log amplifier as described above. A configuration employing a log amplifier does allow a wide dynamic range for each pixel, however a system is adapted to compress an image with the pixels all having a common receiving-light sensitivity. Less clear contrast is provided and the entirety of an image is blurred.

To address such a disadvantage, Japanese Patent Laying-Open No. 2000-340779 (herein after referred to as Patent Document 1) discloses that a wide photosensitivity range and a high contrast detection function are implemented by a configuration of a semiconductor image pickup device that can be driven by a quantity of light incident on an adjacent pixel to shift a photosensitivity range at each pixel circuit.

The configuration disclosed in Patent Document 1, however, requires that each pixel circuit be provided with a first photodetection element detecting a quantity of light received by the pixel circuit and a second photodetection element connected to that of another pixel circuit via a resistor to detect an average quantity of light received at adjacent pixel. This is an obstacle to providing a pixel having reduced size essential to meeting a recent demand for higher resolution.

Furthermore, as a single pixel circuit requires two photodetection elements therein, their quantities of light received, which should be equal, vary with their locations. More specifically, if the two photodetection elements are laterally arranged, incident light itself would not be uniform. If they are longitudinally arranged, then while incident light is uniform, wavelength dependence would be introduced, and the two photodetection elements hardly detect the same quantity of light received. This provides an inaccurate relationship between a quantity of light received and a voltage output and may provide impaired precision of detection.

Furthermore, the first and second photodetection elements are connected in each pixel circuit in series, a noise introduced into a node electrically connected to an adjacent pixel circuit may be superimposed on a photocurrent of the first photodetection element. This allows noise to be readily picked up, and impaired precision of detection may be provided.

SUMMARY OF THE INVENTION

The present invention has been made to overcome such disadvantages and it contemplates a high precision and miniature semiconductor image pickup device that can detect bright and dark portions in sufficient contrast if there is a large distribution in brightness in a single field of view.

The present semiconductor image pickup device includes a plurality of pixel circuits and an inter-pixel connect. The plurality of pixel circuits each include a photodetection element generating at a first node a photocurrent corresponding to a quantity of light received, a first current generation circuit connected to the first node and a second node and an output node to generate first and second currents corresponding to the photocurrent flowing through the first node and pass the first and second currents to the second node and the output node, respectively, and a second current generation circuit connected to the second node and the output node to generate a fourth current corresponding to a third current passing through the second node and allow a differential current between the second and fourth currents to flow through the output node. The inter-pixel connect electrically connects the second node of each of the pixel circuits to the second node of an adjacent, at least one of the pixel circuit.

In the above semiconductor image pickup device each pixel circuit can be provided with a single photodetection element and in addition thereto at a second node an average current corresponding to an average quantity of light received at adjacent pixels can be generated, and by the first and second current generation circuits, an output corresponding to a relative difference between a photocurrent of the pixel circuit of interest and average current can be obtained without directly calculating a photocurrent.

Each pixel circuit's photosensitivity range can be modified and shifted in accordance with brightness therearound, as is done by the human retina, without arranging a plurality of photodetection elements. A sensitivity curve can be shifted to enlarge an effective dynamic range to achieve a wider photosensitivity range, and detection in high contrast and the pixel circuit can also be miniaturized to help to address the trend toward higher resolution associated with that toward larger numbers of pixels. Furthermore, in contrast to a configuration requiring a plurality of photodetection elements for each pixel circuit, the present semiconductor image pickup device can provide increased precision of detection as it does not suffer from reduced precision of detection attributed to a difference in location for arrangement. Furthermore, it is less affected by noise and thus provides higher precision of output as a node (a first node) having a photocurrent flowing therethrough is not connected to a node (the second node and output node) having another current flowing therethrough.

Preferably in the present semiconductor image pickup device the inter-pixel connect includes a resistance component connected between the second nodes of different ones of the pixel circuits, respectively.

The above semiconductor image pickup device can have an inter-pixel connect implemented by a resistance component. Pickup sensitivity or photosensitivity and the range for averaging a quantity of light received can be adjusted in accordance with the resistance component's resistance value.

Still preferably in the present semiconductor image pickup device the first current generation circuit is designed to provide the first and second currents larger than the photocurrent.

In the above semiconductor image pickup device, a differential current between a current obtained by amplifying a photocurrent by the first current generation circuit and the above average current can be obtained. A current calculated can have a large value and further enhanced noise resistance can be provided.

Alternatively, preferably in the present semiconductor image pickup device the pixel circuits each further include an integrator circuit operative to provide an integral of a current passing through the output node, and a reset circuit operative to reset the integral.

The above semiconductor image pickup device that further includes an integrator circuit and a reset circuit can be free of a disadvantage such as a flickering screen in shooting an image of a fluorescent lamp or similar subject continuously varying in brightness. Furthermore, as compared with a configuration outputting only an instant value, it can substantially enhance sensitivity and allows an image to be also picked up for lower illuminance.

Preferably, in the present semiconductor image pickup device, the first current generation circuit includes a first transistor electrically connected between a first power supply node supplying a first prescribed voltage and the first node, a second transistor electrically connected between the first power supply node and the second node, and a third transistor electrically connected between the first power supply node and the output node. The second current generation circuit includes a fourth transistor electrically connected between a second power supply node supplying a second prescribed voltage different from the first prescribed voltage and the second node, and a fifth transistor electrically connected between the output node and the second power supply node. The first, second and third transistors each have a control electrode electrically connected to the first node. The fourth and fifth transistors each have a control electrode electrically connected to the second node.

In the above semiconductor image pickup device the first and second current generation circuits can be implemented by a current mirror circuit implemented by a transistor. A simplified circuit configuration can be achieved.

Still preferably the pixel circuits each further include a capacitor electrically connected to the output node, and a sixth transistor electrically connected between a node supplying a prescribed reset voltage and the output node to turn on when reset.

In the above semiconductor image pickup device an integrator circuit and the reset circuit can also simply be configured by a single capacitor and transistor.

Preferably in the present semiconductor image pickup device the photodetection element is implemented by a photodiode electrically connected between a first power supply node supplying a first prescribed voltage and the first node to be reversely biased. Furthermore the first current generation circuit includes a first transistor electrically connected between a second power supply node supplying a second prescribed voltage different from the first prescribed voltage and the first node to generate at the first node a voltage corresponding to the photocurrent, a second transistor electrically connected between the first power supply node and the second node and having a control electrode electrically connected to the first node, and a third transistor electrically connected between the first power supply node and the output node and having a control electrode electrically connected to the first node, and the second current generation circuit includes a fourth transistor electrically connected between the second power supply node and the second node and having a control electrode electrically connected to the second node, and a fifth transistor electrically connected between the second power supply node and the output node and having a control electrode electrically connected to the second node.

In the above semiconductor image pickup device, an output corresponding to a difference between a quantity of light received of each pixel circuit and an average quantity of light received at adjacent pixels can be obtained by photoelectric conversion implemented by a current generation circuit simply configured by first to fifth transistors.

Still preferably in the present semiconductor image pickup device the first prescribed voltage is higher than the second prescribed voltage, the first transistor is implemented by a p channel field effect transistor having a gate and a drain mutually connected, and a source electrically connected to the first node, and the photodiode has a cathode electrically connected to the first power supply node, and an anode electrically connected to the first node.

In the above semiconductor image pickup device the first transistor can be operated as a log transistor to set variation in Ids (gate-drain current) relative to that in Vds (gate-drain voltage) like a logarithmic function. This can prevent saturation for a wide range of illuminance and also allows current-voltage conversion with sensitivity for lower illuminance range increased. A wider pickup range can be ensured and further enhanced pickup sensitivity for lower illuminance area can be achieved. Furthermore, it is excellent in blooming resistance as when light is received the photodetection element, or the photodiode, at an electrode biased by fixed voltage, or a cathode, generates minority carrier, which is a hole relatively short in lifetime.

Furthermore still preferably in the present semiconductor image pickup device the first prescribed voltage is lower than the second prescribed voltage, the first transistor is implemented by an n channel field effect transistor having a gate and a drain mutually connected, and a source electrically connected to the first node, and the photodiode has a cathode electrically connected to the first node, and an anode electrically connected to the first power supply node.

In the above semiconductor image pickup device the first transistor can be operated as a log transistor to prevent saturation for a wide range of illuminance and also allow current-voltage conversion with sensitivity for lower illuminance range increased.

In such a configuration, in particular, more than one field effect transistor are connected between the second power supply node and the first node in series.

In the semiconductor image pickup device thus configured a photocurrent can be converted via the first node's voltage to an output at a photoelectric conversion rate (an amount of variation of output/an amount of variation of photocurrent) that can be increased as the number of field effect transistors to be arranged is increased. Although this results in a layout area increased by an increased number of field effect transistors, substantially enhanced pickup sensitivity can be provided to allow shooting an image despite low illuminance.

Still preferably in the present semiconductor image pickup device the pixel circuits each include a reset circuit provided between a reset voltage node supplying a prescribed reset voltage and the first node and operative at prescribed periods to electrically connect the first node to the reset voltage node. The reset voltage is determined to have a difference in voltage from the second prescribed voltage to fall within a range of a gate-source voltage corresponding to a weak inversion region of the first transistor.

In the above semiconductor image pickup device the photodetection element (or photodiode) is directly subjected to a reset operation. A pixel circuit can be configured that responds quickly while reducing lag. In particular, by setting a reset voltage within a range so that immediately after the reset operation the first transistor operates in a weak inversion region, variation in voltage (i.e., variation in voltage of the first node) relative to that in current (i.e., that in photocurrent) can be increased as the first transistor's current-voltage characteristic is considered. Photoelectric conversion can be performed with a further quicker response to further improve the pixel circuit's response.

Still more preferably in the present semiconductor image pickup device the pixel circuits each include a reset circuit provided between a reset voltage node supplying a prescribed reset voltage and the first node to operate at prescribed periods. The reset circuit in each operation is driven by a difference between a current level in voltage of the first node and the reset voltage to determine whether to perform a reset operation setting the first node's voltage to the reset voltage.

In the above described semiconductor image pickup device, at each timing for reset, whether a difference in voltage between the reset voltage and the first node's voltage, i.e., an integral in illuminance of light incident on each pixel circuit since the previous reset operation exceeds a prescribed value can be referred to to control whether to perform a subsequent reset operation. A resetting period of a pixel circuit of low illuminance can be increased to equivalently reduce a frame rate. As a result a sufficient quantity of light can also be ensured for a lower illuminance area to allow lowered minimum illuminance required for pickup.

In such a configuration, in particular, he first prescribed voltage is higher than the second prescribed voltage. The photodiode has a cathode electrically connected to the first power supply node, and an anode electrically connected to the first node. The reset circuit includes an n channel, adjustable gain transistor connected between the reset voltage node and the first node and having a gain coefficient increasing in analog manner in response to a control gate increasing in potential. The n channel, adjustable gain transistor has a normal gate receiving a reset signal activated to a logically high level at the prescribed periods for a fixed period of time, and the control gate electrically connected to the first node.

In the above semiconductor image pickup device a single semiconductor device (an adjustable gain transistor) can be employed to configure the above reset circuit, and the pixel circuit can be reduced in size. Furthermore, it is excellent in blooming resistance as when light is received the photodetection element, or the photodiode, at an electrode biased by fixed voltage, or a cathode, generates minority carrier, which is a hole relatively short in lifetime.

Alternatively, in such a configuration, in particular, the first prescribed voltage is lower than the second prescribed voltage. The photodiode has a cathode electrically connected to the first node, and an anode electrically connected to the first power supply node. The reset circuit includes a p channel, adjustable gain transistor connected between the reset voltage node and the first node and having a gain coefficient increasing in analog manner in response to a control gate decreasing in potential. The p channel, adjustable gain transistor has a normal gate receiving a reset signal activated to a logically low level at the prescribed periods for a fixed period of time, and the control gate electrically connected to the first node.

In the above semiconductor image pickup device a single semiconductor device (an adjustable gain transistor) can be employed to configure the above reset circuit, and the pixel circuit can be reduced in size.

Furthermore the reset voltage is determined to have a difference in voltage from the second prescribed voltage to fall within a range of a gate-source voltage corresponding to a weak inversion region of the first transistor.

In the above described semiconductor image pickup device, by setting a reset voltage within a range so that immediately after the reset operation the first transistor operates in a weak inversion region, variation in voltage (i.e., variation in voltage of the first node) relative to that in current (i.e., that in photocurrent) can be increased as the first transistor's current-voltage characteristic is considered. Photoelectric conversion can be performed with a further quicker response to further improve the pixel circuit's response.

The present invention's main advantage lies in that it has pixel circuits each provided with a single photodetection element and in addition thereto each pixel circuit's photosensitivity range can be modified and shifted in accordance with brightness therearound, as is done by the human retina. A sensitivity curve can be shifted to enlarge an effective dynamic range to implement a wider photosensitivity range, and detection of high contrast, and the pixel circuit can also have a smaller size. This can help to accommodate the trend toward higher resolution associated with that toward larger numbers of pixels. Furthermore, in contrast to a configuration requiring a plurality of photodetection elements for each pixel circuit, the present semiconductor image pickup device can provide increased precision of detection as it does not suffer from reduced precision of detection attributed to a difference in location for arrangement.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
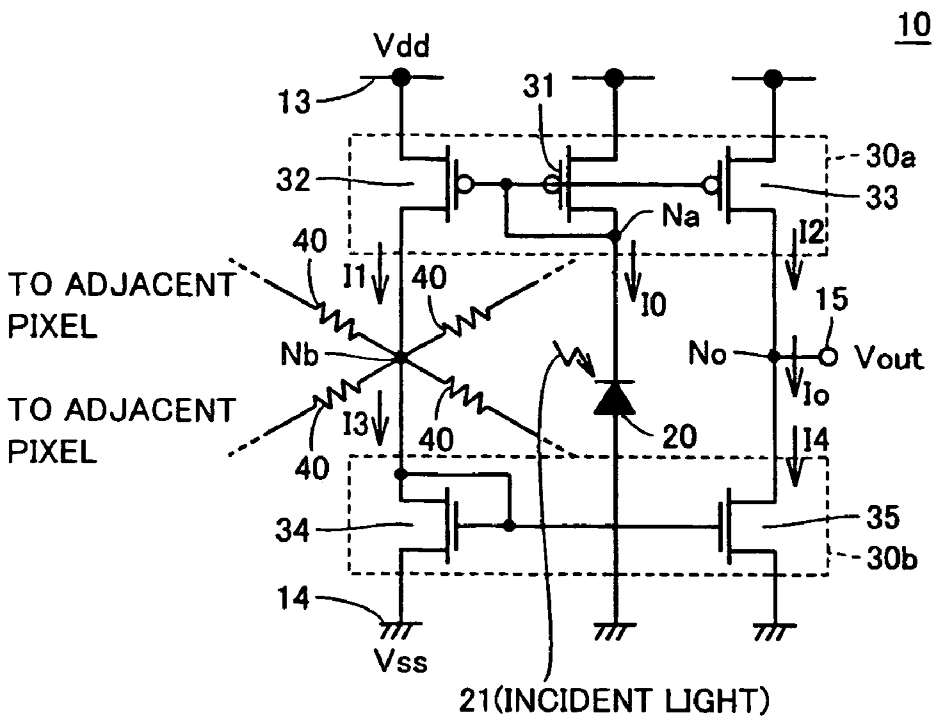
FIG. 1 is a circuit diagram showing a configuration of each of a plurality of pixel circuits configuring a semiconductor image pickup device in accordance with a first embodiment of the present invention.

Hereinafter the present invention in embodiments will be described with reference to the drawings more specifically. Note that in the following description, identical or corresponding components are denoted by identical reference characters.

First Embodiment

FIG. 1 is a circuit diagram showing a configuration of each of a plurality of pixel circuits configuring the present semiconductor image pickup device in a first embodiment.

With reference to FIG. 1, the first embodiment provides a pixel circuit 10 including a photodetection element (representatively, a photodiode) 20, and current mirror circuits 30*a*, 30*b* provided as a "current generation circuit."

Current mirror circuit 30*a* has p channel MOS transistors 31-33. Note that in the following embodiments of the present invention, p and n channel MOS transistors will be indicated as a representative example of transistor (field effect transistor in particular).

P channel MOS transistor 31 is electrically connected between a power supply node 13 supplying a power supply voltage Vdd and a node Na. P channel MOS transistor 32 is electrically connected between power supply node 13 and a node Nb. P channel MOS transistor 33 is electrically connected between power supply node 13 and an output node No. Furthermore, p channel MOS transistors 31-33 each have its gate (or control electrode) connected to node Na to form the current mirror circuit.

Photodetection element or photodiode 20 has a cathode connected to node Na and an anode to a ground node 14. Node Na thus has flowing therethrough from power supply node 13 toward ground node 14 a photocurrent I0 corresponding to a quantity of light received or that of incident light 21 on photodiode 20.

Furthermore by current mirror circuit 30*a* a current I1 proportional to photocurrent I0 is generated toward node Nb and a current I2 proportional to photocurrent I0 is generated toward output node No. A current ratio I0:I1 is determined by the p channel MOS transistors 31 and 32 current driving ability and a current ratio I0:I2 is determined by the p channel MOS transistors 31 and 33 current driving ability ratio.

A MOS transistor has a current driving ability in proportion to its size indicated by gate width/gate length. Specifically, p channel MOS transistors 31-33 have their gate length and width designed to have a dimension providing current mirror circuit 30*a* with current ratios I0:I1 and I0:I2 of desired values, respectively. Preferably, they are designed to provide I1/I0>1 and I2/I0>1 so that current mirror circuit 30*a* amplifies photocurrent I0.

Note that if similar currents I1, I2 corresponding to photocurrent I0 can be generated at node Nb and output node No, current mirror circuit 30*a* may be replaced with a current generation circuit having any configuration. Introducing a current mirror circuit, however, allows the current generation circuit to be simplified in configuration.

Current mirror circuit 30*b* has an n channel MOS transistor 34 electrically connected between node Nb and ground node 14, and an n channel MOS transistor 35 electrically connected between output node No and ground node 14. N channel MOS transistors 34 and 35 each have its gate (or control electrode) connected to node Nb to form the current mirror circuit.

Current mirror circuit 30*b* generates a current I4 proportional to current I3 passing through node Nb. Current I4 is passed to be drawn (pulled) from output node No. More specifically, current mirror circuit 30*b* is so arranged that a differential current between current I2 by current mirror circuit 30*a* and current I4 proportional to current I3 passes through output node No. Note that a current ratio I3:I4 in current mirror circuit 30*b* is designed in accordance with the n channel MOS transistors 34 and 35 current driving ability ratio (or transistor size ratio).

Note that if a differential current similar to the above can be generated at output node No, current mirror circuit 30*b* may be replaced with a current generation circuit having any configuration. Applying a current mirror circuit, however, allows the current generation circuit to be simplified in configuration.

Furthermore in each pixel circuit 10 node Nb is electrically connected via a resistance component 40, which is provided as an "inter-pixel connect," to node Nb of at least one adjacent pixel circuit 10. Thus current I1 corresponding to photocurrent I0 in each pixel circuit is divided by resistance component 40 and thus also passed to node Nb of the adjacent pixel circuit 10, and each pixel circuit 10 also has passing through node Nb current I3 corresponding to the sum of current I1 of itself and that divided and flowing thereinto from the adjacent pixel circuit. As a result, current I3 is a current corresponding to an average quantity of light received in an adjacent region including the region of interest.

Figure 2:
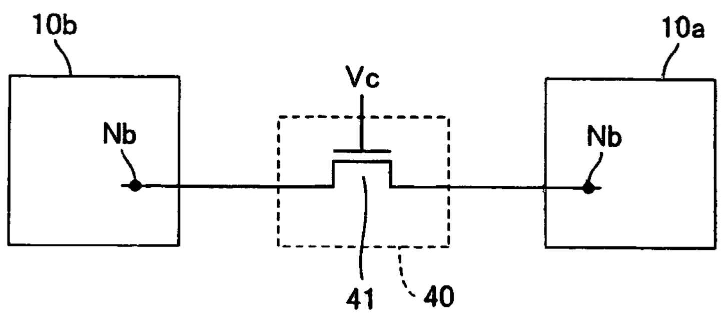
FIG. 2 shows an exemplary configuration of a resistance component shown in FIG. 1.

Resistance component 40 can be implemented for example by a resistance element formed on a substrate. Alternatively, as shown in FIG. 2, resistance component 40 may be implemented by a field effect transistor 41 connected between nodes Nb of different pixel circuits 10*a* and 10*b* and capable of adjusting a gate voltage Vc.

Pickup sensitivity, a range for averaging a quantity of light received, and the like can be adjusted in accordance with a value in resistance of resistance component 40 connected between pixel circuit 10. By configuring resistance component 40, as shown in FIG. 2, a load can be alleviated in setting a resistance value in designing, and adjustment corresponding to a subject to be picked up can also be readily done in mounting.

Again with reference to FIG. 1 output node No outputs a current Io, which is a differential current between current I2 corresponding to photocurrent IO at pixel circuit 10 of interest and current I4 corresponding to an average of light received in adjacent pixel circuits, and it is represented by Io=I2-I4. Output node No, connected to an output terminal 15, is connected between power supply node 13 and ground node 14 via p and n channel MOS transistors 33 and 35.

Thus output terminal 15 outputs an output voltage Vout having a value corresponding to output current lo. More specifically, output voltage Vout is determined by a relative difference between photocurrent I0 corresponding to a quantity of light received at pixel circuit 10 of interest and current I3 corresponding to an average quantity of light received at adjacent pixels.

The pixel circuit 10 configuration shown in FIG. 1 and the present invention's configuration have a correspondence, described as follows: current mirror circuit 30*a* corresponds to the present invention's "first current generation circuit," and current mirror circuit 30*b* to the present invention's "second current generation circuit." Furthermore, p channel MOS transistors 31-33 correspond to the present invention's (in particular, claim 5's) "first transistor" to "third transistor" and n channel MOS transistors 34 and 35 to the present invention's (in particular, claim 5's) "fourth transistor" and "fifth transistor."

Figure 3:
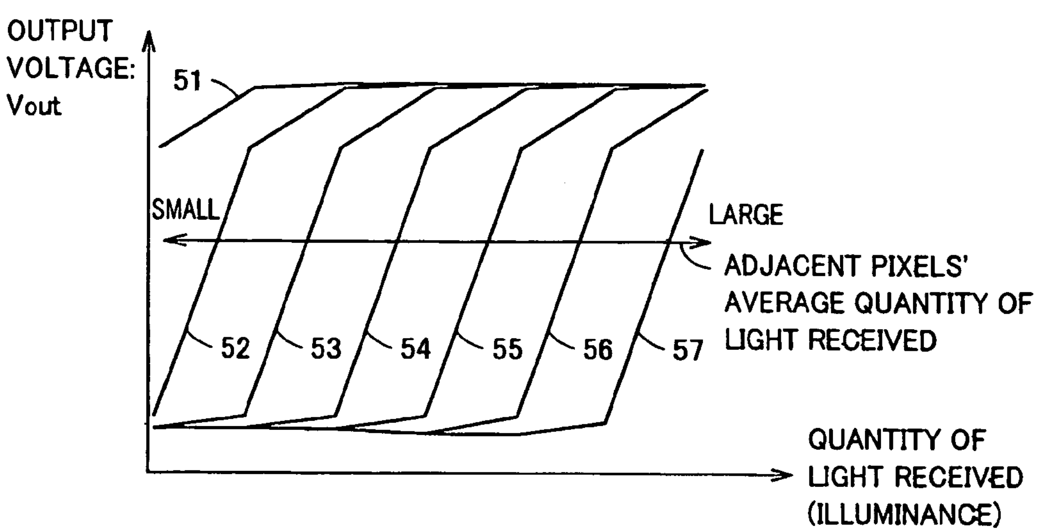
FIG. 3 shows a concept representing a relationship between a quantity of light received and a voltage output in the pixel circuit in accordance with the first embodiment.

FIG. 3 shows a concept representing a relationship between a quantity of light received in the pixel circuit in accordance with the first embodiment and output voltage Vout.

In FIG. 3 the horizontal axis represents a quantity of light received (or illuminance) of pixel circuit 10 and the vertical axis represents output voltage Vout at output terminal 15 of each pixel circuit 10.

While output voltage Vout varies with the quantity o light received, a quantity of light received-output voltage characteristic varies with an average quantity of light received at adjacent pixels, as indicated by lines 51-57.

More specifically, for smaller average quantities of light received at adjacent pixels, in FIG. 1 a relatively reduced current I4 is pulled from output node No. Accordingly, output current Io will significantly vary in a range associated with a small quantity of light received. As a result, satisfactory sensitivity can be ensured at a range associated with a relatively small quantity of light received corresponding to an average quantity of light received at adjacent pixels.

In contrast, for larger average quantities of light received at adjacent pixels, in FIG. 1 a relatively increased current I4 is provided, and output current Io will significantly vary at a range associated with a large quantity of light received. As a result, satisfactory sensitivity can be ensured at a range associated with a relatively large quantity of light received corresponding to an average quantity of light received at adjacent pixels.

As a result in the first embodiment pixel circuit 10 can each modify and shift its photosensitivity range in accordance with brightness therearound, as does the human retina. Enlarged effective dynamic range can be provided, and wider photosensitivity range and high contrast detection can be achieved.

Furthermore with reference again to FIG. 1 the first embodiment provides pixel circuit 10 configured with a single photodiode (photodetection element) allowing a photosensitivity range in each pixel circuit to be varied with an average quantity of light received at adjacent pixels. The configuration can provide a smaller number of photodetection elements to be arranged than that of the pixel circuit disclosed in Patent Document 1.

In particular, in contrast to a transistor reducible depending on a process limit value, a photodetection element needs to have a dimension so ensured that incident light can be detected. As such, its miniaturization has a limit. The present pixel circuit having a reduced number of photodetection elements to be arranged is more disadvantageous than that disclosed in Patent Document 1 in that the former has an increased number of transistors. However, the former is more advantageous in size reduction. This can help to address the trend for higher resolution associated with that for more pixels.

Furthermore, as has been described previously, Patent Document 1 discloses a configuration requiring a single pixel circuit to have two photodetection elements arranged therein, and their quantities of light received, which should be equal, vary with their respective locations. In contrast, the present semiconductor image pickup device has each pixel circuit 10 with a single photodetection device detecting a quantity of light received. A more accurate relationship can be provided between a voltage output and a quantity of light received and high precision of output can be provided.

Furthermore, in contrast to the configuration disclosed in Patent Document 1, node Nb (FIG. 1) connected to a different pixel circuit or the like and having a tendency to have noise superimposed thereon, is not directly connected to photodetection element 20. Reduced noise can be generated and high precision of output can be achieved.

In particular, by causing current mirror circuit 30*a* to generate currents I1, I2 to amplify photocurrent I0, currents I1-I4 added and subtracted to obtain output current Io can have a large value to provide further enhance noise resistance.

Figure 4:
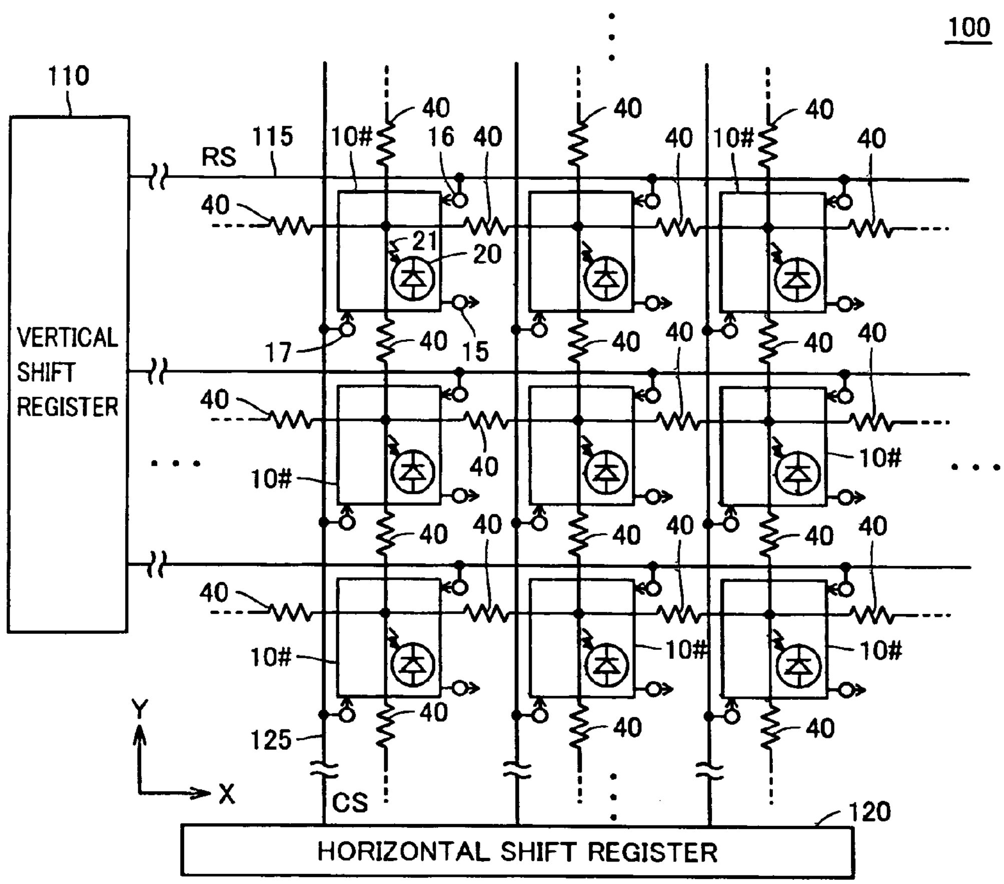
FIG. 4 generally shows a configuration of the semiconductor image pickup device in accordance with the first embodiment.

FIG. 4 shows a general configuration of a semiconductor image pickup device in accordance with the first embodiment configured by arranging pixel circuits of the first embodiment in rows and columns.

With reference to FIG. 4, the first embodiment provides a semiconductor image pickup device 100 including a plurality of pixel circuits 10# arranged in rows and columns, a vertical shift register 110, a plurality of rows select line 115, a horizontal shift register 120, and a plurality of column select lines 125.

Row select line 115 is arranged in a direction X for each row of pixel circuits 10# (hereinafter referred to as a "pixel row") to transmit a row select signal RS indicating whether a corresponding pixel row has a selected state or a non-selected state. Column select line 125 is arranged in a direction Y for each column of pixel circuits 10# (hereinafter referred to as a "pixel column") to transmit a column select signal CS indicating whether a corresponding pixel column has a selected state or a non-selected state.

Vertical shift register 110 selects a plurality of pixel rows periodically as prescribed, and sequentially and sets in an active state row select signal RS corresponding to a selected pixel row and set in an inactive state row select signal RS corresponding to a non-selected pixel row. Similarly, horizontal shift register 120 selects a plurality of pixel columns periodically as prescribed, and sequentially and sets in an active state column select signal CS corresponding to a selected pixel column and sets in an inactive state column select signal CS corresponding to a non-selected pixel column. Hereinafter, each pixel has an active state of a logically high level and an inactive state of a logically low level.

Pixel circuit 10# is basically similar in configuration to the FIG. 1 pixel circuit 10, although the former further includes a row select terminal 16 and a column select terminal 17. Row select terminal 16 receives row select signal RS of a corresponding pixel row and column select terminal 17 receives column select signal CS of a corresponding pixel column. Output terminal 15 outputs output voltage Vout, similarly as described for pixel circuit 10.

Figure 5:
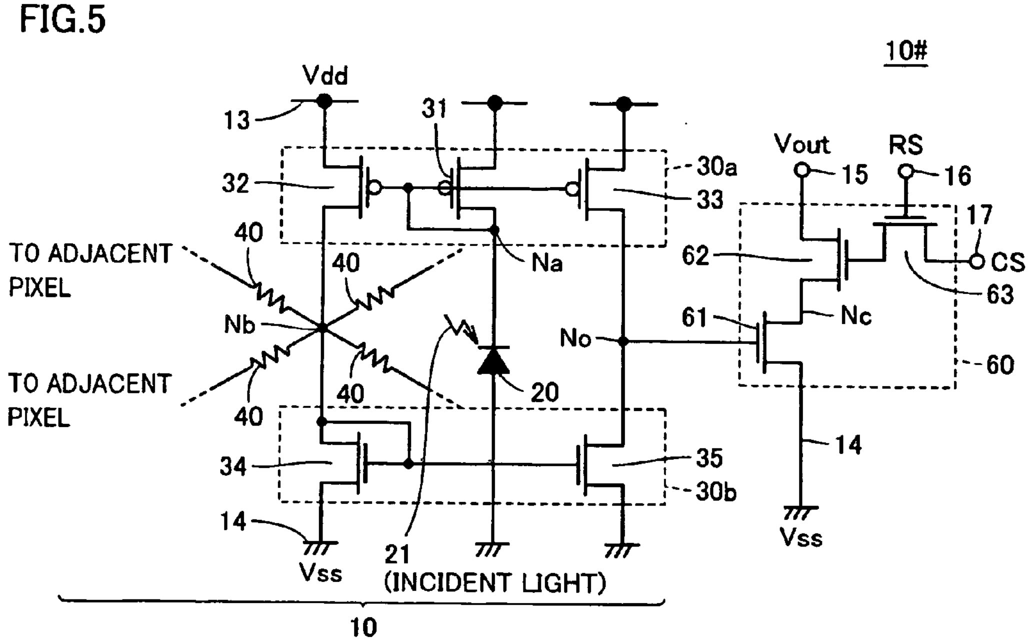
FIG. 5 is a circuit diagram for illustrating a configuration of a pixel circuit shown in FIG. 4.

With reference to FIG. 5, the FIG. 4 pixel circuit 10# has the basic configuration of pixel circuit 10 in accordance with the first embodiment as shown in FIG. 1 plus an output select circuit 60.

Output select circuit 60 includes n channel MOS transistors 61-63.

N channel MOS transistors 61 and 62 are connected in series between ground node 14 and output terminal 15. N channel MOS transistor 61 has its gate (or control electrode) connected to output node No, and n channel MOS transistor 62 has its gate (or control electrode) connected via n channel MOS transistor 63 to column select terminal 17. N channel MOS transistor 63 is connected between n channel MOS transistor 62 at the gate and column select terminal 17 and has its gate connected to row select terminal 16.

N channel MOS transistor 61 configures a source follower amplifier and generates at a drain, or a node Nc, output voltage Vout corresponding to the voltage of output node No. As in pixel circuit 10, output voltage Vout is determined by a relative value of photocurrent I0 of pixel circuit 10# of interest and current I3 corresponding to an average quantity of light received at adjacent pixels.

N channel MOS transistor 62 is responsive to corresponding row and column select signals RS and CS both having the active state or high level to turn on to connect node Nc to output terminal 15. As a result, when corresponding pixel row and column are both selected, pixel circuit 10# outputs output voltage Vout at output terminal 15.

Thus there can be configured a semiconductor image pickup device having pixel circuits of the first embodiment successively arranged therein. This semiconductor image pickup device can modify and shift each pixel circuit's photosensitivity range in accordance with brightness therearound, as does the human retina. Wider photosensitivity range and high contrast detection can be achieved. Furthermore, each pixel circuit can be reduced in size, which is advantageous in providing higher resolution associated with the trend toward more pixels, and an output voltage can be obtained less affected by noise and thus with high precision.

Second Embodiment

Figure 6:
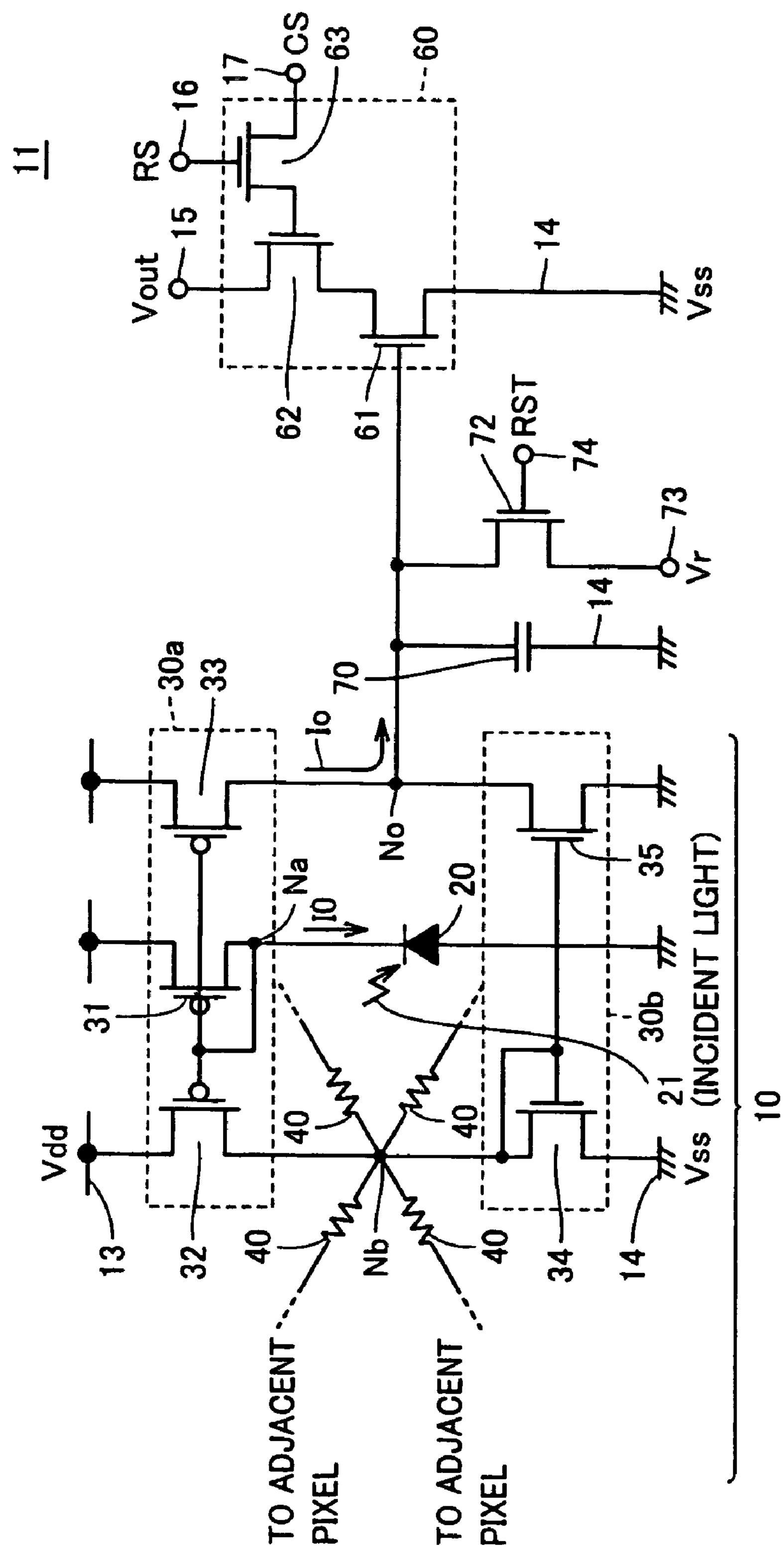
FIG. 6 is a circuit diagram showing a configuration of a pixel circuit in accordance with a second embodiment of the present invention.

With reference to FIG. 6, a second embodiment provides a pixel circuit 11 having the pixel circuit 10# configuration shown in FIG. 4 plus a capacitor 70 provided as an "integrator circuit" and an n channel MOS transistor 72 provided as a "reset circuit."

Capacitor 70 has one end connected to output node No and the other end for example to ground node 14. N channel MOS transistor 72 is electrically connected between a reset voltage node 73 supplying a reset voltage Vr and output node No. N channel MOS transistor 72 has its gate connected to a reset terminal 74 receiving a reset pulse RST. Thus whenever reset terminal 74 receives reset pulse RST set to the active state (or high level) output node No is connected to the reset voltage node to be set to reset voltage Vr.

Reset pulse RST is set periodically in a pulse to have the active state. When reset pulse RST has the inactive state (or the low level) output node No is disconnected from reset voltage node 73. Accordingly, output node No is charged/discharged by output current Io corresponding to a quantity of light received, and output voltage Vout varies with a time quadrature of output voltage Io.

In the first embodiment's pixel circuit 10, 10#, output current lo is a value corresponding to an instant quantity of light received. They only allow picking up an image for an instant value, and if a fluorescent lamp or similar object constantly varying in brightness is shot, a flickering screen or a similar disadvantage may be caused. In the second embodiment, in contrast, pixel circuit 11 can output a time quadrature of output current Io and such disadvantages can thus be overcome.

Figure 7:
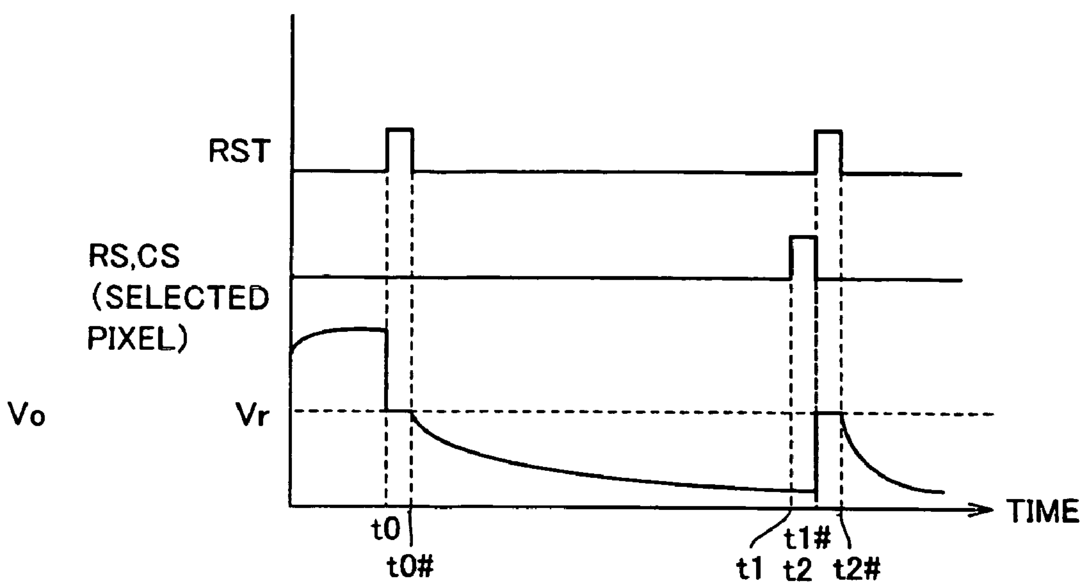
FIG. 7 shows a concept for illustrating an operation of the pixel circuit in accordance with the second embodiment.

FIG. 7 is a diagram as shown in a concept for describing an operation of the pixel circuit of the second embodiment.

With reference to FIG. 7, reset pulse RST is activated or set high at predetermined intervals for a fixed period (time periods t0-T0# and t2-t2#).

While reset pulse RST has the active state, output node No is charged to attain reset voltage Vr. While reset pulse RST has the inactive state (or the low level) output node No is charged/discharged in accordance with a differential current between a quantity of light received of the pixel circuit of interest and that of light received of adjacent pixel circuit, and voltage Vo also varies in accordance therewith temporally.

Furthermore, at a timing of selecting a pixel of interest (or time t1-t1#), row and column select signals RS and CS are both set high or activated. Voltage Vo at this timing is amplified by a source follower amplifier implemented by transistor 61, and output as output voltage Vout at output terminal 15.

Thus the integrator circuit and source follower amplifier additionally introduced allows substantially higher sensitivity than the pixel circuit of the first embodiment, allowing an image to be picked up for lower illuminance.

Note that in the FIG. 4 semiconductor image pickup device 100 pixel circuit 10# can be replaced with pixel circuit 11 (FIG. 6) to configure a semiconductor image pickup device having pixel circuits of the second embodiment successively arranged.

Figure 8:
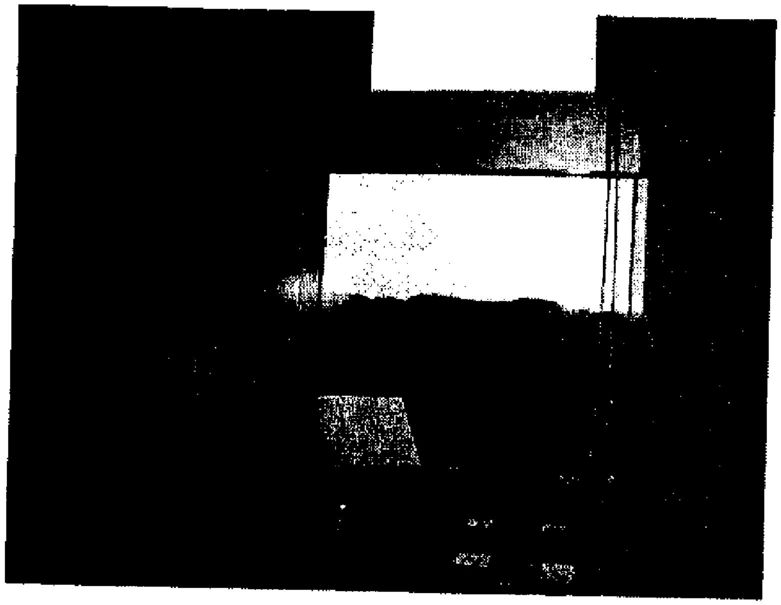
FIGS. 8 and 9 show exemplary first and second images picked up by the present semiconductor image pickup device.
Figure 9:

FIGS. 8 and 9 indicate a result of simulation of an exemplary image picked up by the present semiconductor image pickup device.

Figure 29:
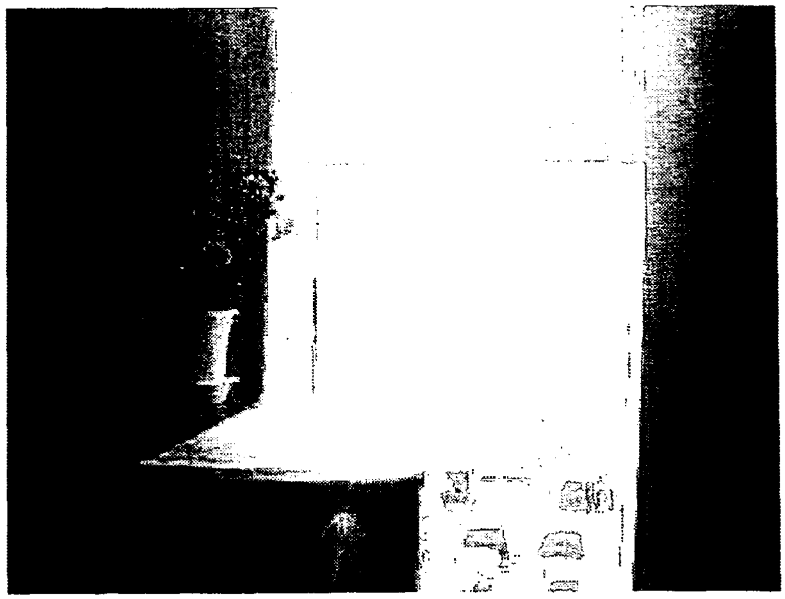
FIGS. 29 and 30 show first and second exemplary images, respectively, picked up with a conventional semiconductor image pickup device.
Figure 30:
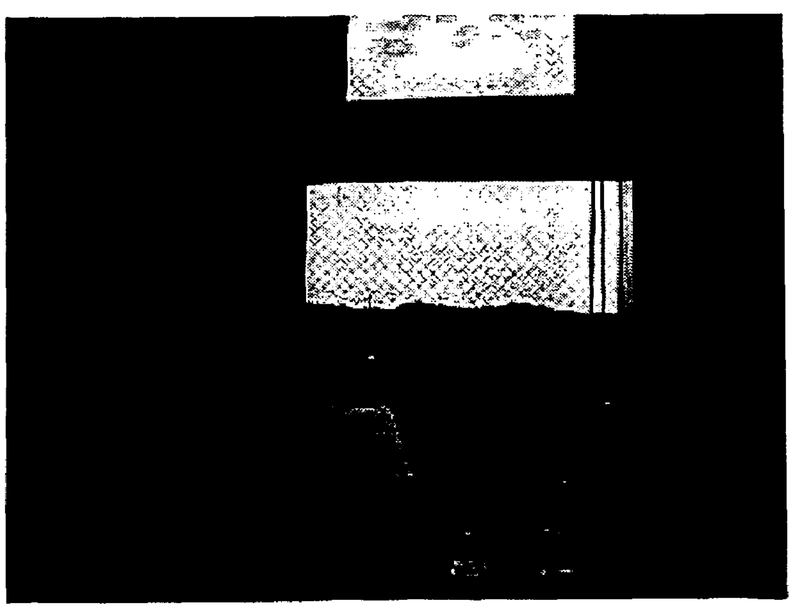
Figure 31:
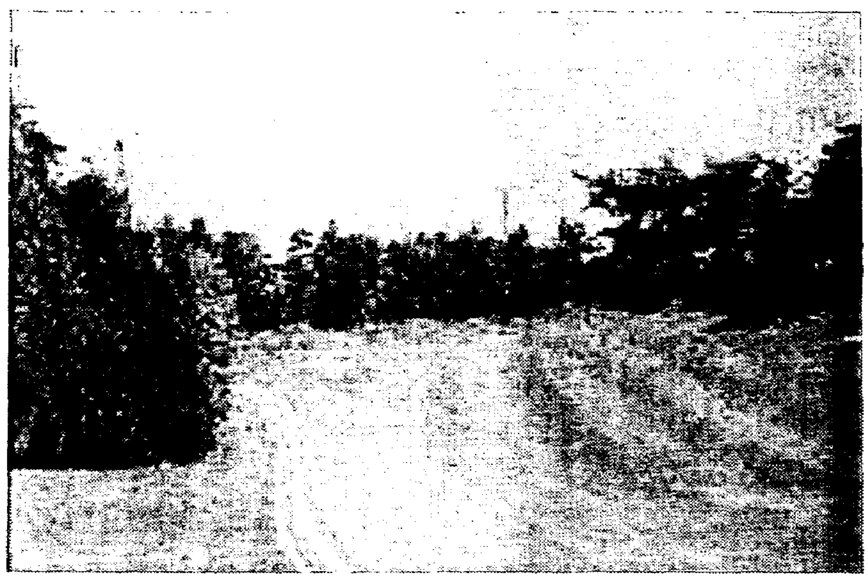
FIG. 31 shows an exemplary image picked up with a semiconductor image pickup device employing a log amplifier as conventional.
Figure 28:
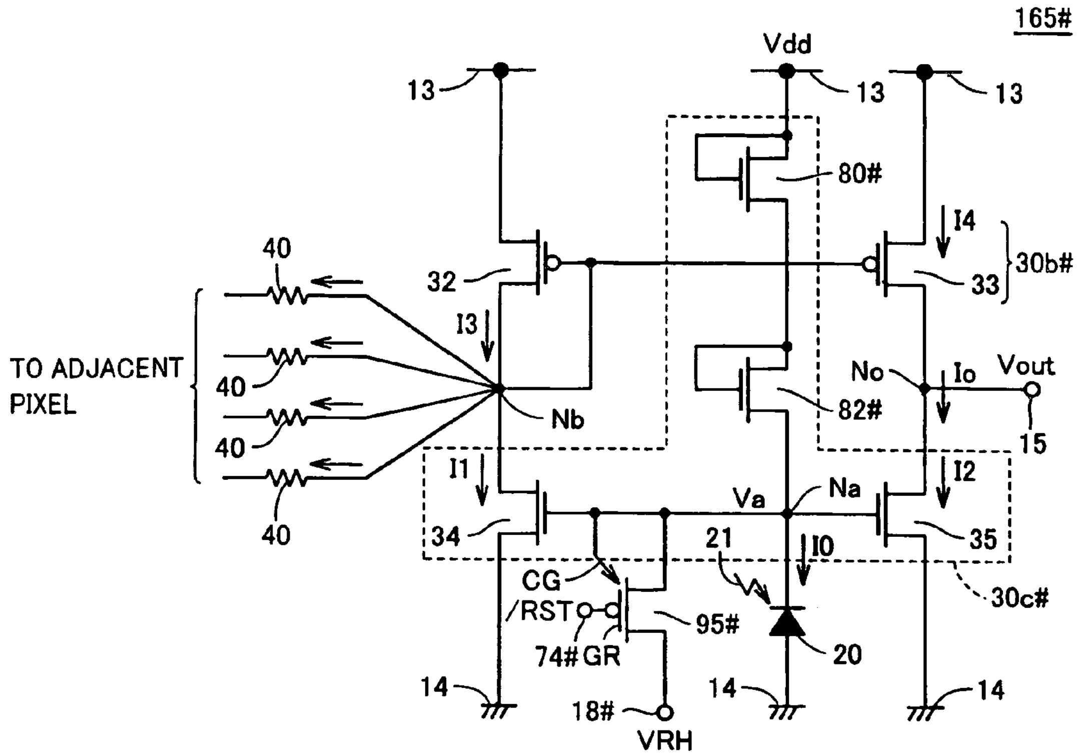
Figure 29:
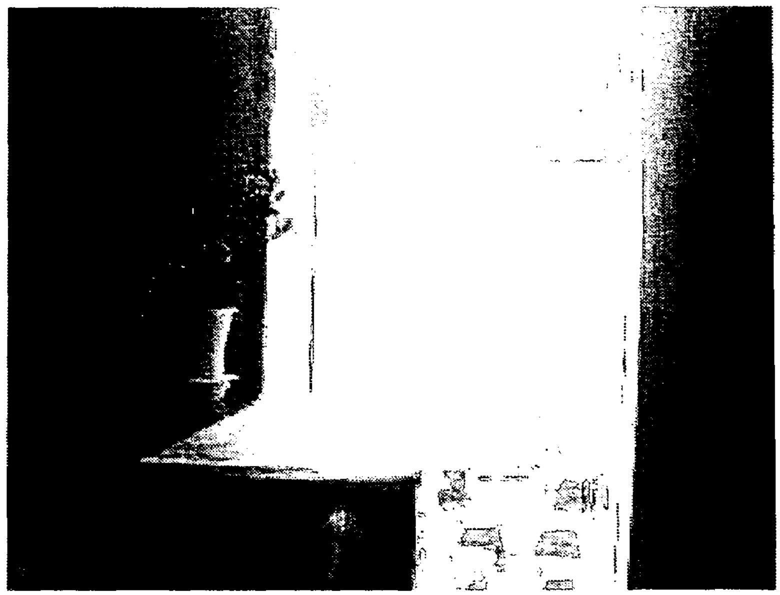
Figure 30:
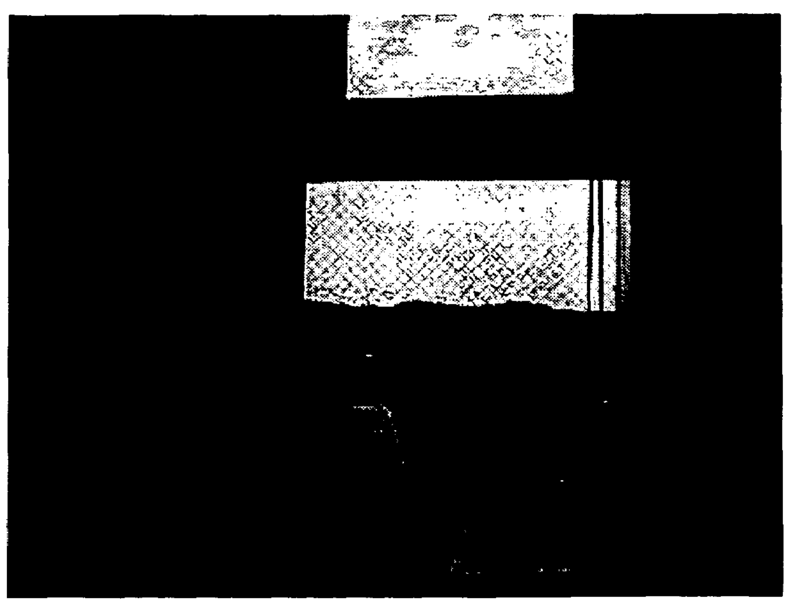
Figure 31:
Figure 2:
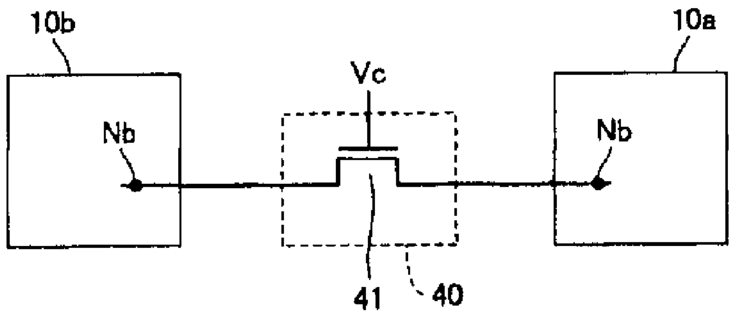
Figure 3:
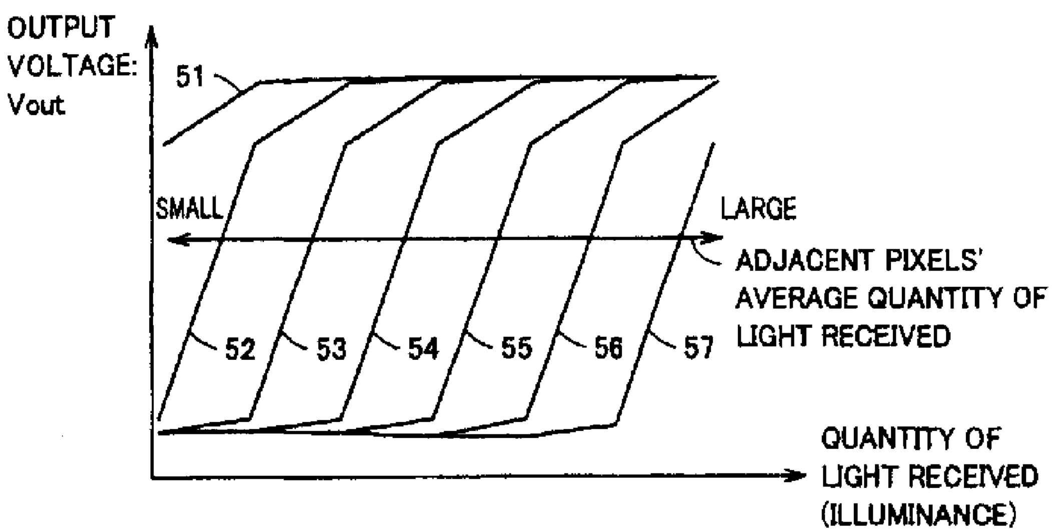
Figure 4:
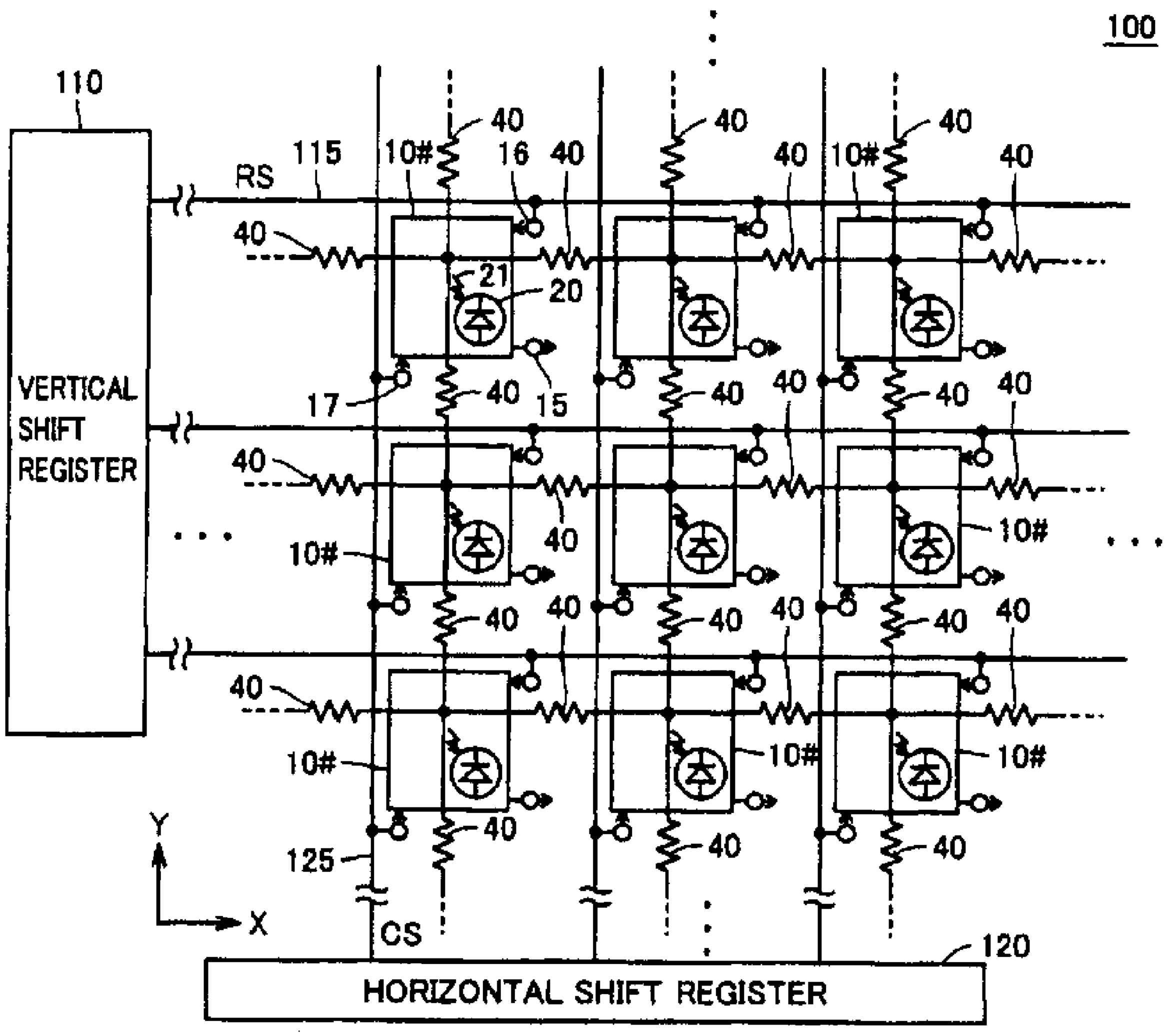
Figure 5:
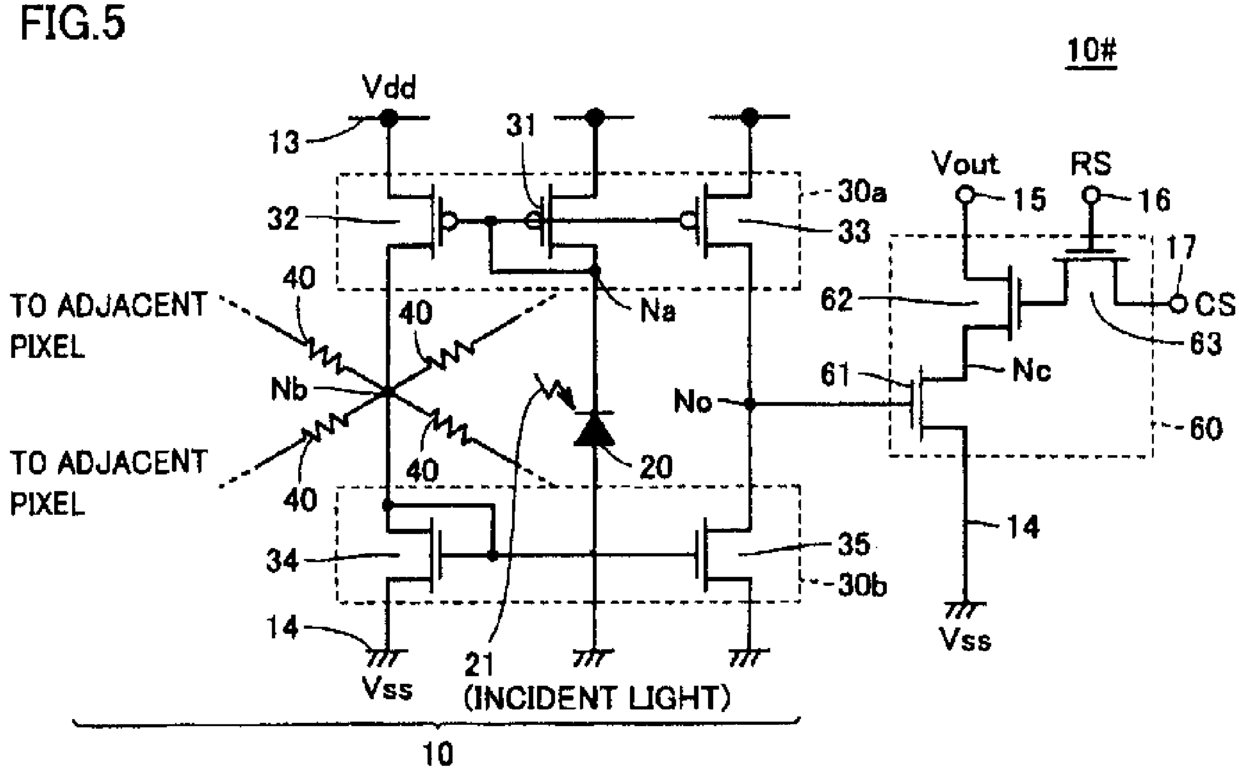
Figure 6:
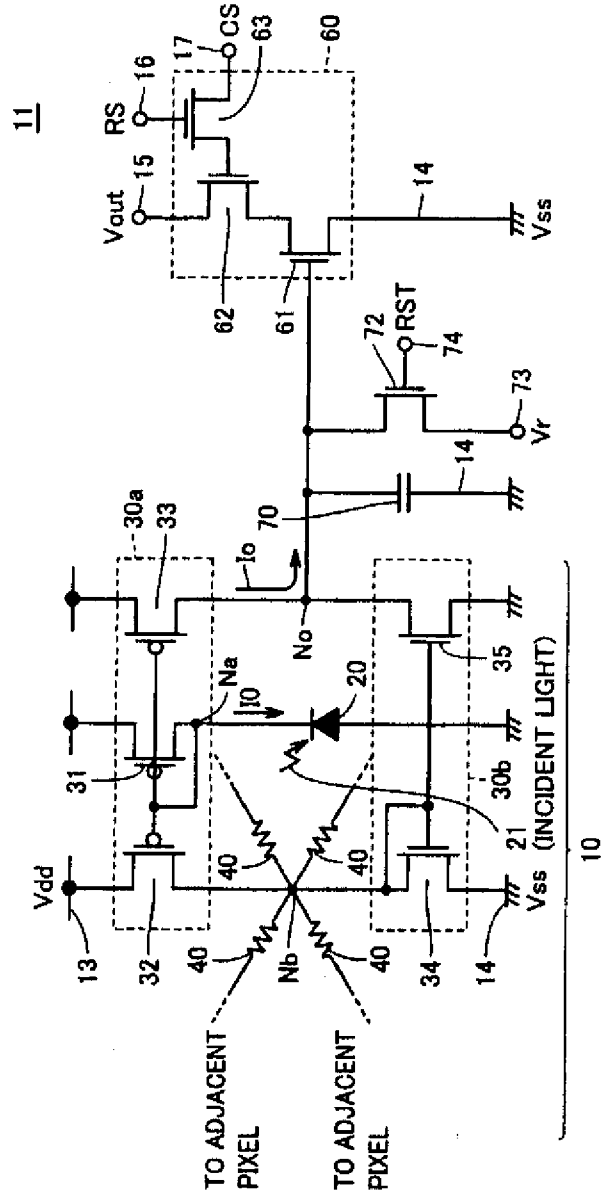
Figure 7:
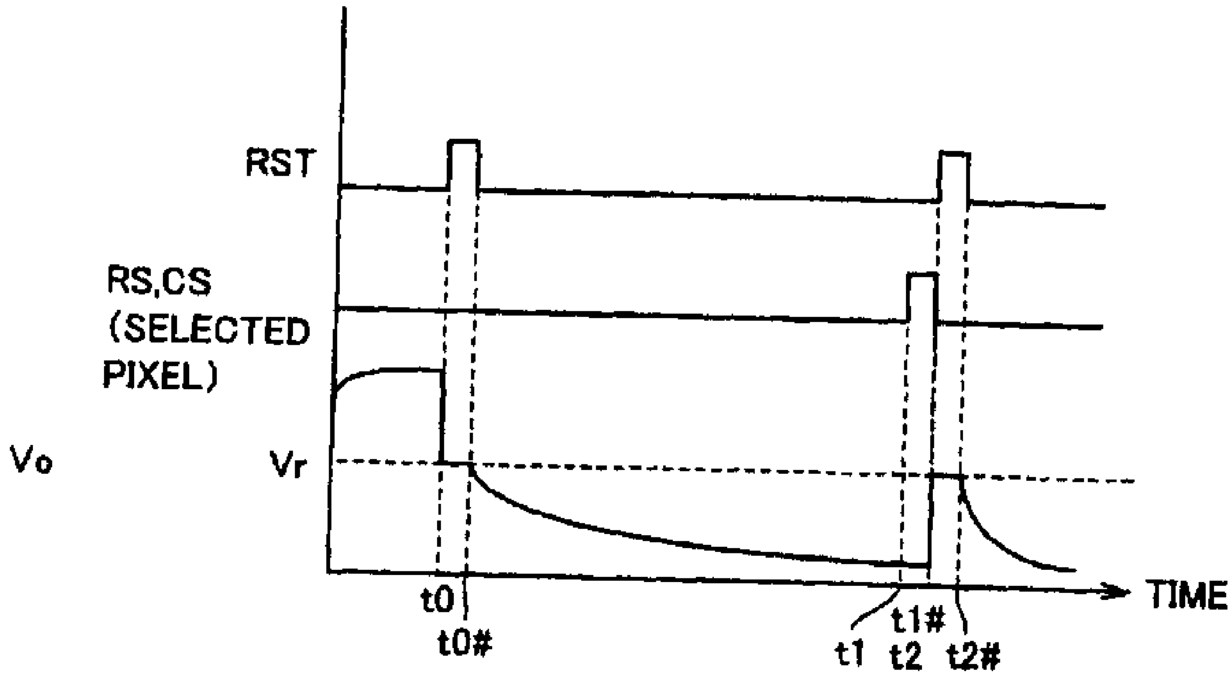

FIG. 8 is an image of the same subject as the FIGS. 29 and 30 exemplary image picked up with a conventional semiconductor image pickup device. Similarly, FIG. 9 shows a picked-up image of the same subject as the FIG. 31 exemplary image picked up with a semiconductor image pickup device employing a log amplifier as conventional. As shown in FIGS. 8 and 9, the present invention can modify and shift a photosensitivity range in each pixel circuit in accordance with brightness therearound, as does the human retina,. A semiconductor pickup can thus be implemented that can detect bright and dark portions in a single field of view in sufficient contrast.

Third Embodiment

In a third embodiment a current generation circuit generating current I1 and I2 corresponding to photocurrent I0 (or current mirror circuit 30*a* shown in FIG. 1) will be described in another exemplary configuration.

Figure 10:
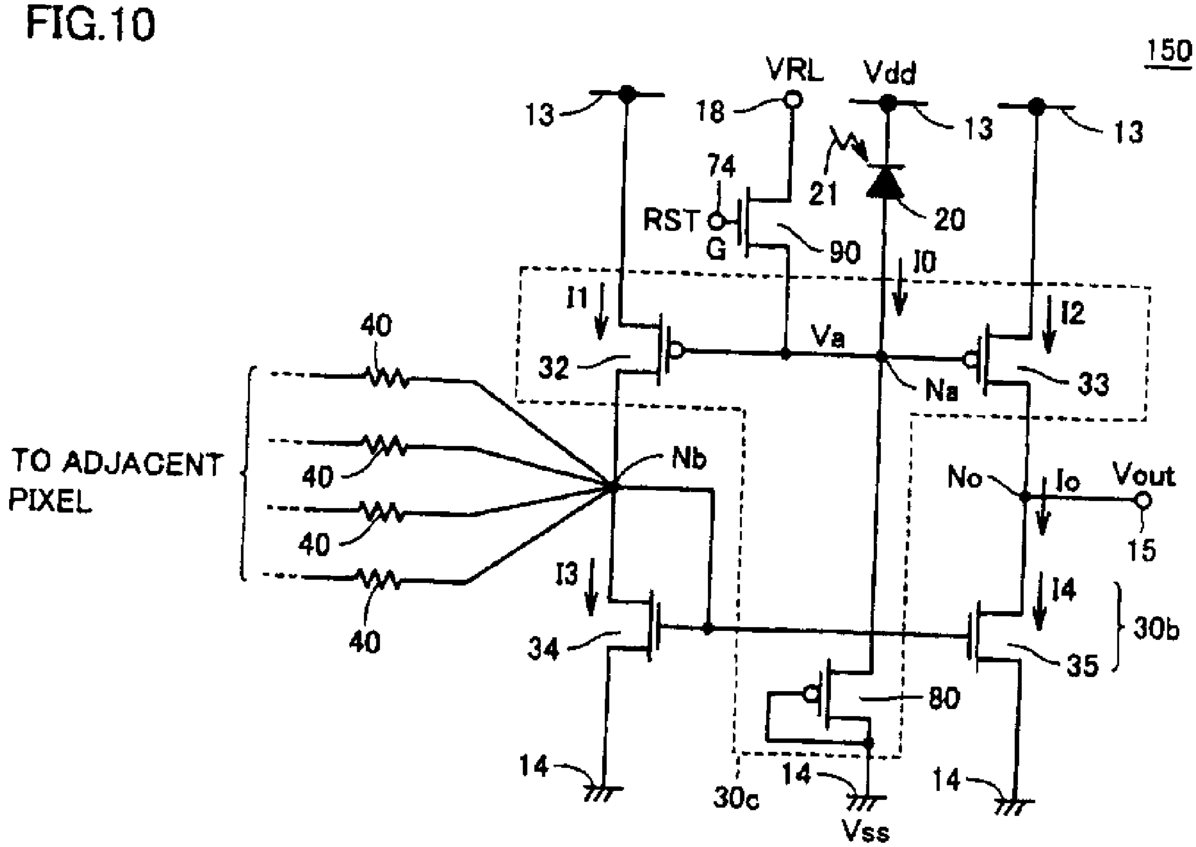
FIG. 10 is a circuit diagram showing a configuration of a pixel circuit in accordance with a third embodiment of the present invention.

With reference to FIG. 10, the third embodiment provides a pixel circuit 150 different from the FIG. 1 pixel circuit 10 (the first embodiment) in that: current mirror circuit (current generation circuit) 30*a* is replaced with a current generation circuit 30*c;* the photodetection element, or photodiode 20, is connected between node Na and power supply node 13; and a reset transistor 90 acting as a "reset circuit" is further included.

Photodiode 20 has its cathode electrically connected to power supply node 13 and its anode electrically connected to node Na and reversely biased.

Current generation circuit 30*c* includes p channel MOS transistors 32 and 33, and a p channel MOS transistor 80 acting as a current voltage converter generating at node Na a voltage Va corresponding to photocurrent I0.

P channel MOS transistor 80 has its source connected to node Na and its drain to ground node 14. P channel MOS transistor 80 has its gate also connected to ground node 14 to fix a gate voltage at a ground voltage Vss so that increased current driving force can be provided.

N channel MOS transistors 34 and 35 configure current mirror circuit 30*b*, similarly as provided in the FIG. 1 pixel circuit 10.

Reset transistor 90 is implemented by an n channel MOS transistor and connected between reset voltage node 18 and node Na. Reset transistor 90 has its gate connected to reset terminal 74 applying reset pulse RST. As well as that indicated in FIG. 7, reset pulse RST is set in an active state (herein, the high level) periodically as prescribed, for a fixed period of time. Reset voltage node 18 supplies a reset voltage VRL, which is set to a positive voltage close to the ground node 14 voltage Vss. In other words, Vss≦VRL<Vdd and VRL≈Vss.

The remainder of pixel circuit 150 is configured similarly as shown in the FIG. 1 pixel circuit 10.

The pixel circuit 150 configuration shown in FIG. 10 and the present invention's configuration have a correspondence, as follows: current generation circuit 30*c* corresponds to the present invention's "first current generation circuit" and current mirror circuit 30*b* to the present invention's "second current generation circuit." Furthermore in the FIG. 10 configuration power supply node 13 corresponds to a "first power supply node" and ground node 14 to a "second power supply node." More specifically, p channel MOS transistor 80 corresponds to the present invention's (in particular, claim 7's) "first transistor" and p channel MOS transistors 32 and 33 to the present invention's (in particular, claim 7's) "second transistor" and "third transistor," respectively, and n channel MOS transistors 34 and 35 correspond to the present invention's (in particular, claim 7's) "fourth transistor" and "fifth transistor," respectively.

Current generation circuit 30*c* operates, as described hereinafter. P channel MOS transistor 80 passes as a source-drain current Ids photocurrent I0 provided by photodiode 20 connected in series. As such, p channel MOS transistor 80 follows its source-drain voltage Vds-Ids characteristic to generate at node Na voltage Va corresponding to photocurrent I0. As will be described hereinafter, a MOS transistor has a Vds-Ids characteristic showing a logarithmic response. Accordingly, hereinafter this transistor will also be referred to as a "log transistor."

Figure 11:
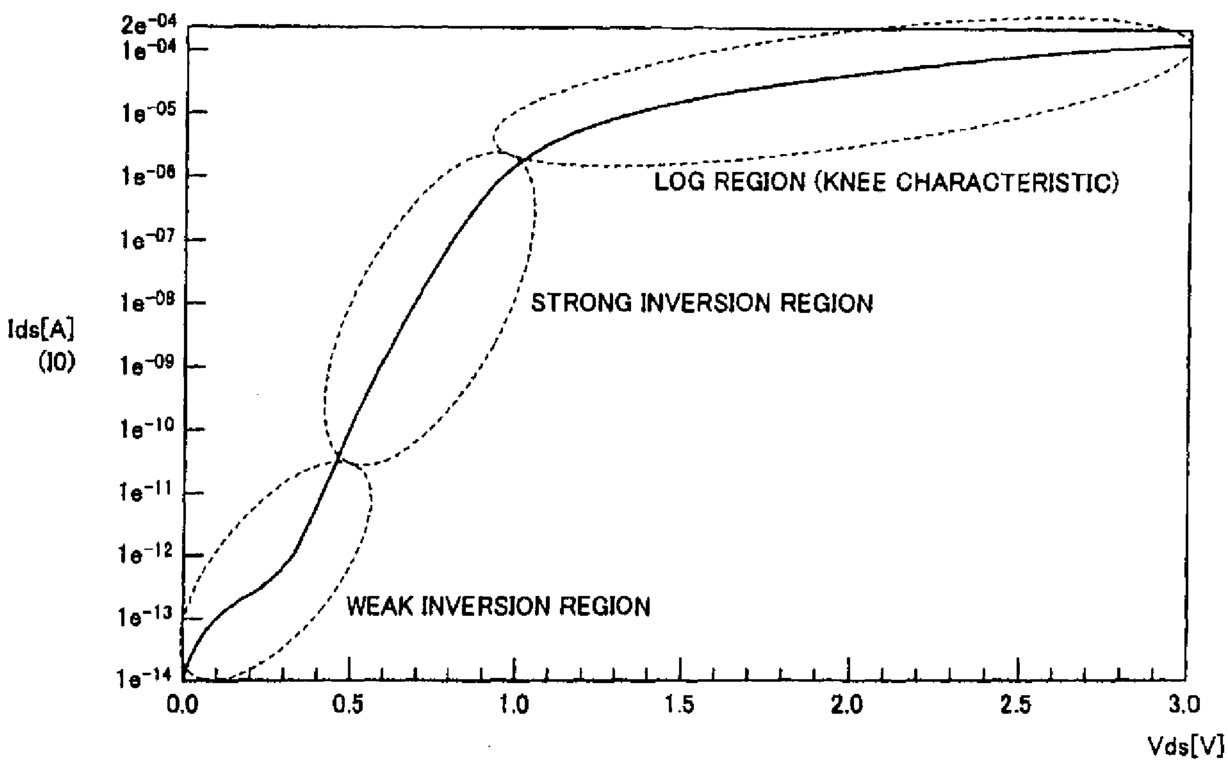
FIG. 11 shows a result of simulation of a log transistor's Vds-Ids characteristic.
Figure 12:
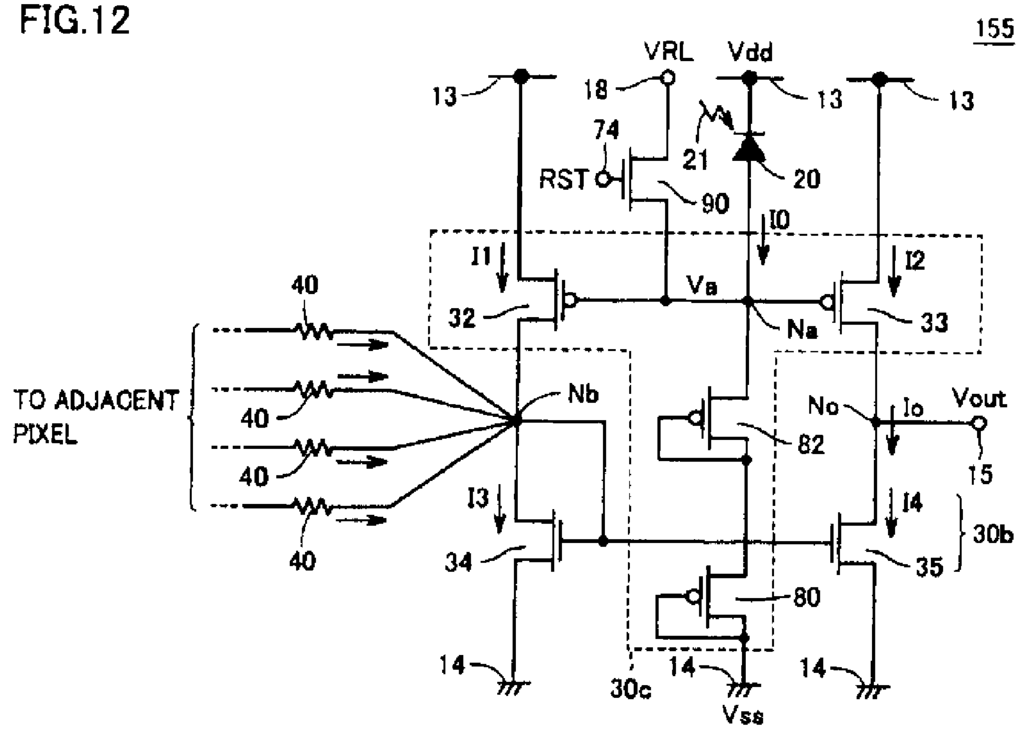
Figure 13:
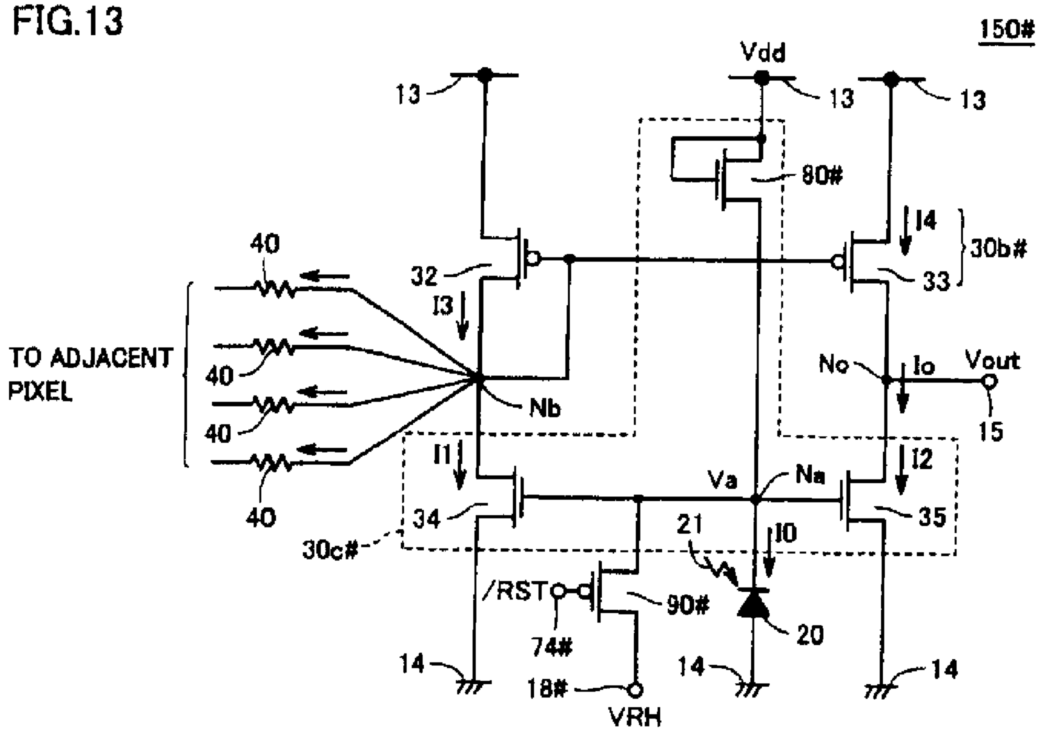
Figure 14:
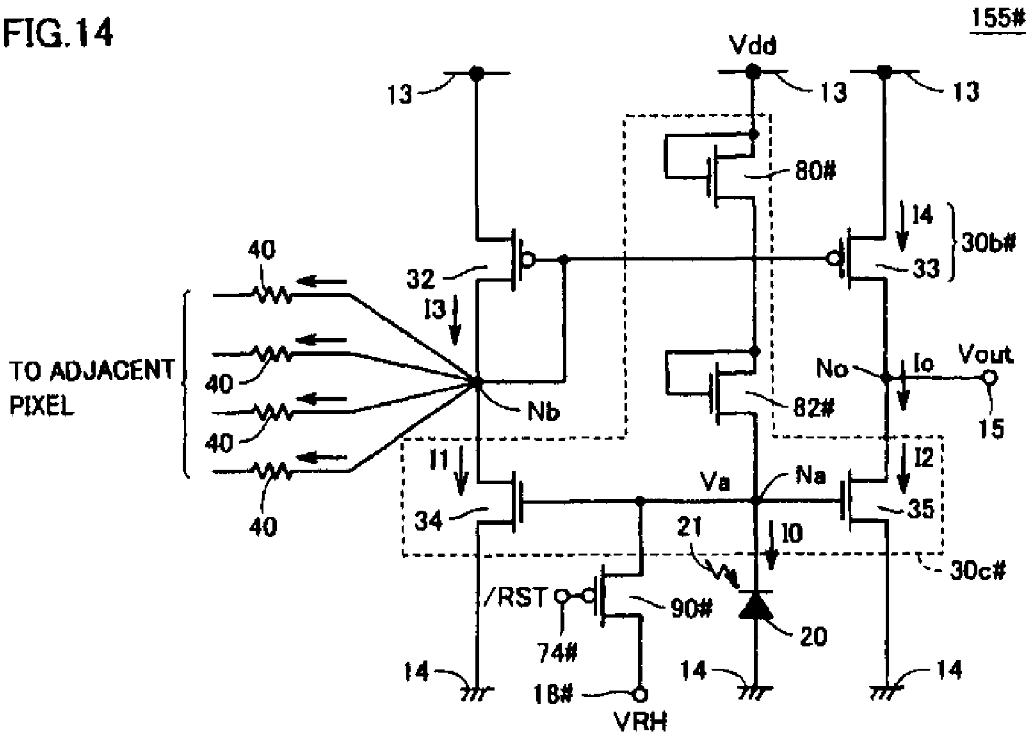
Figure 15:
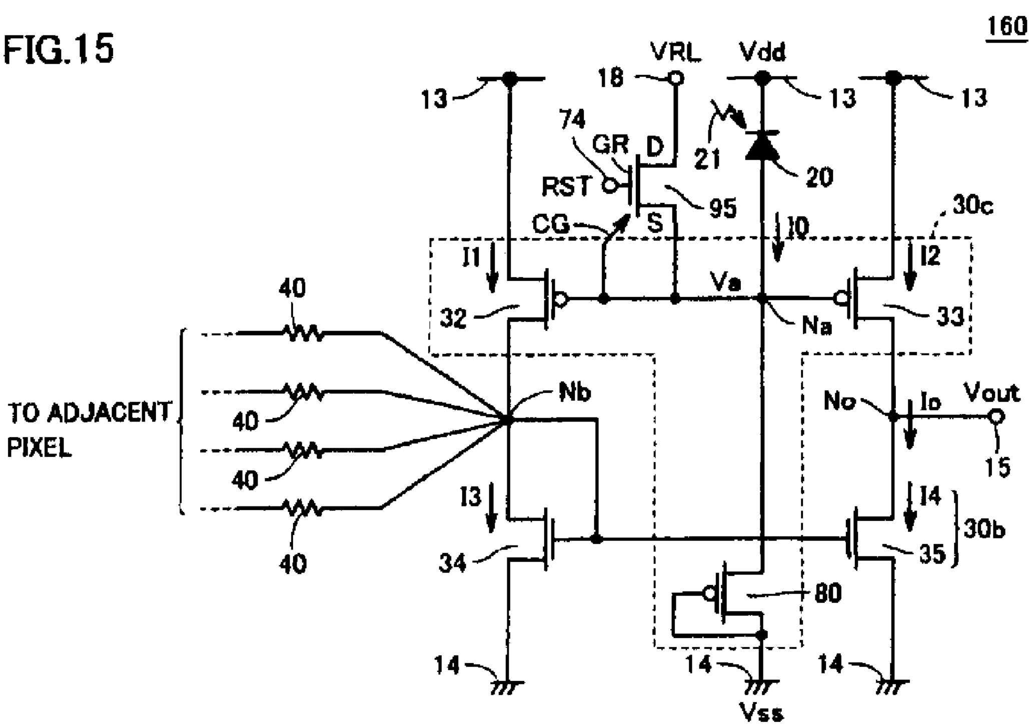
Figure 16A:
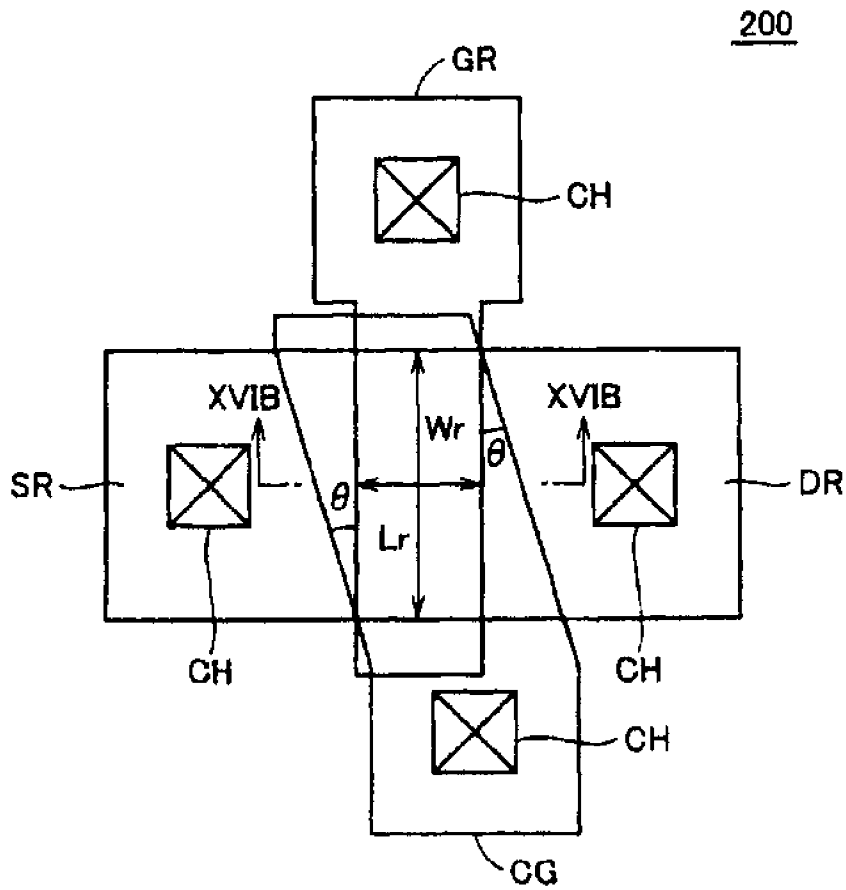
Figure 16B:
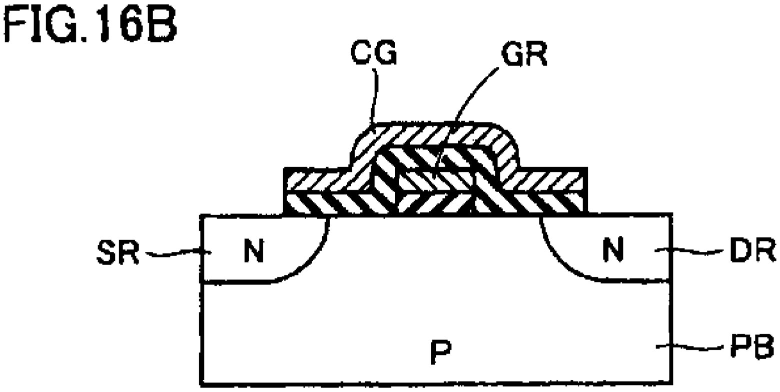
Figure 17A:
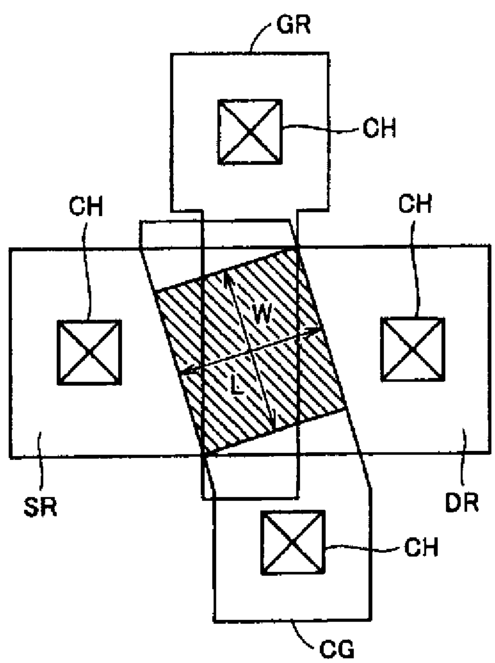
Figure 17B:
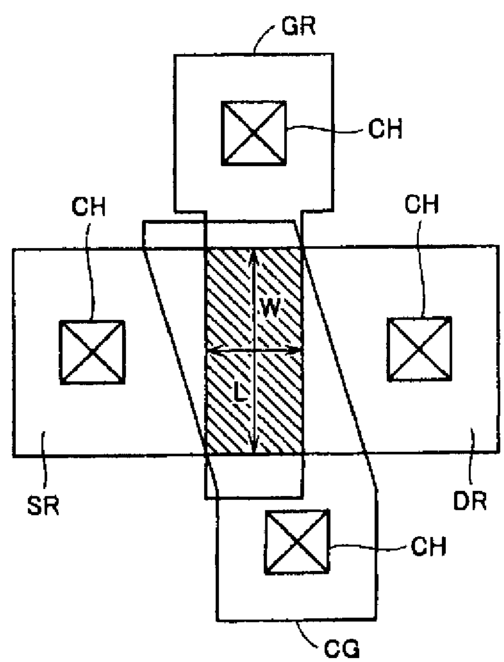
Figure 18:
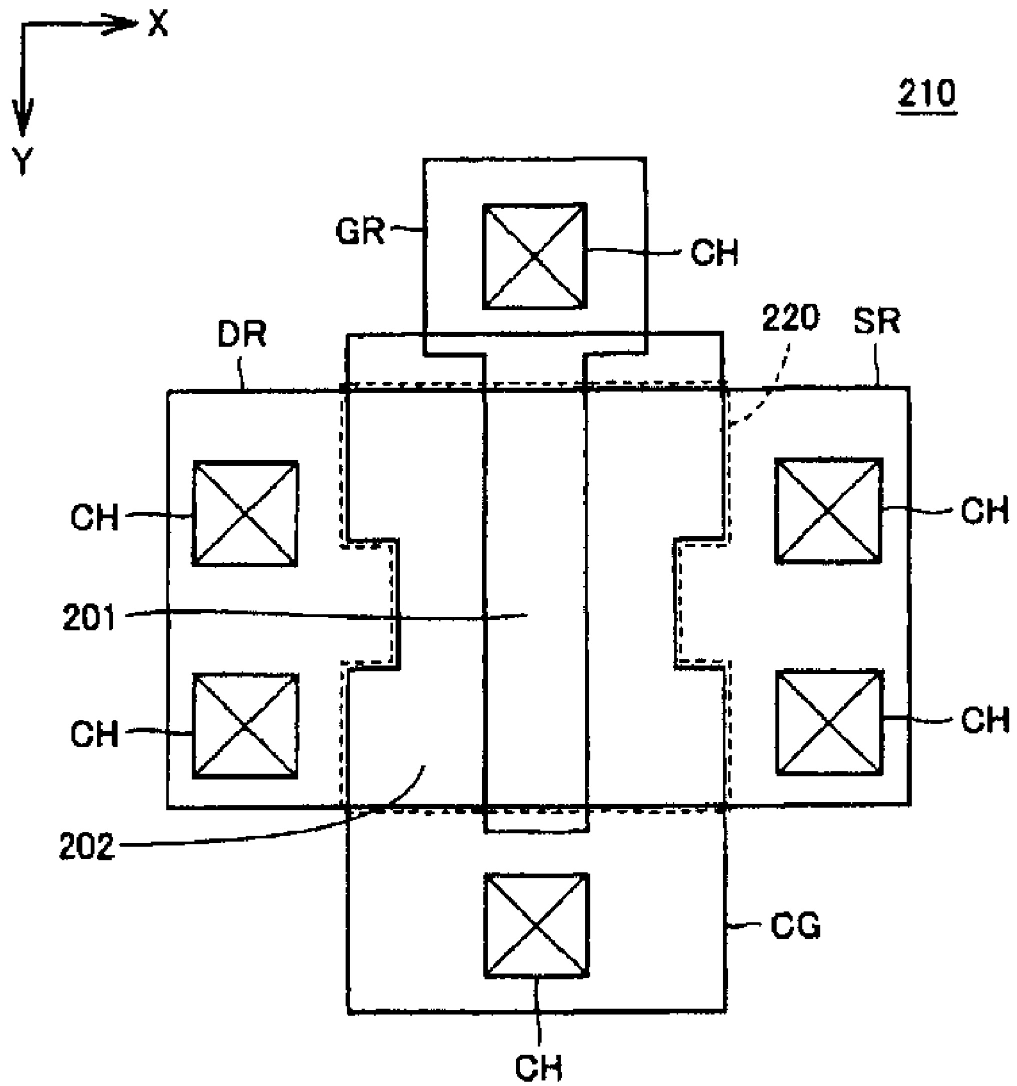
Figure 19:
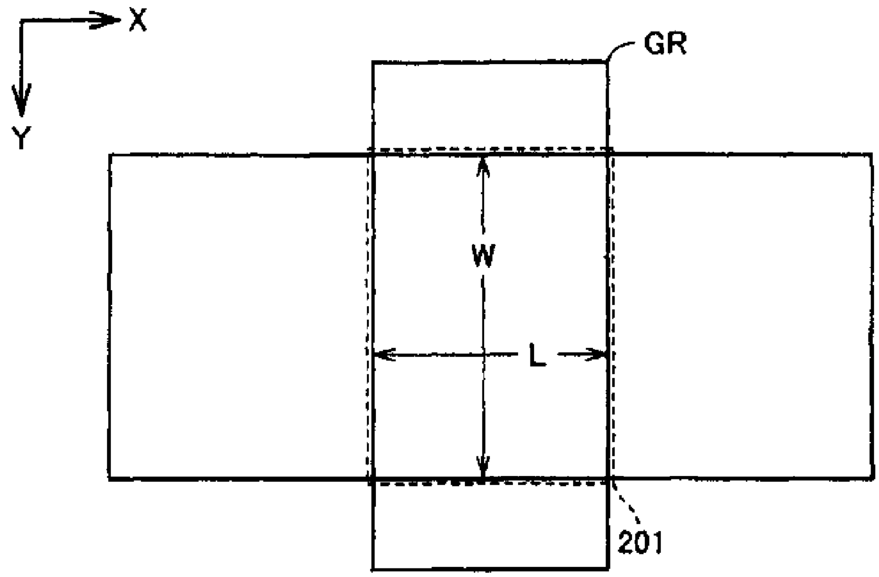
Figure 20:
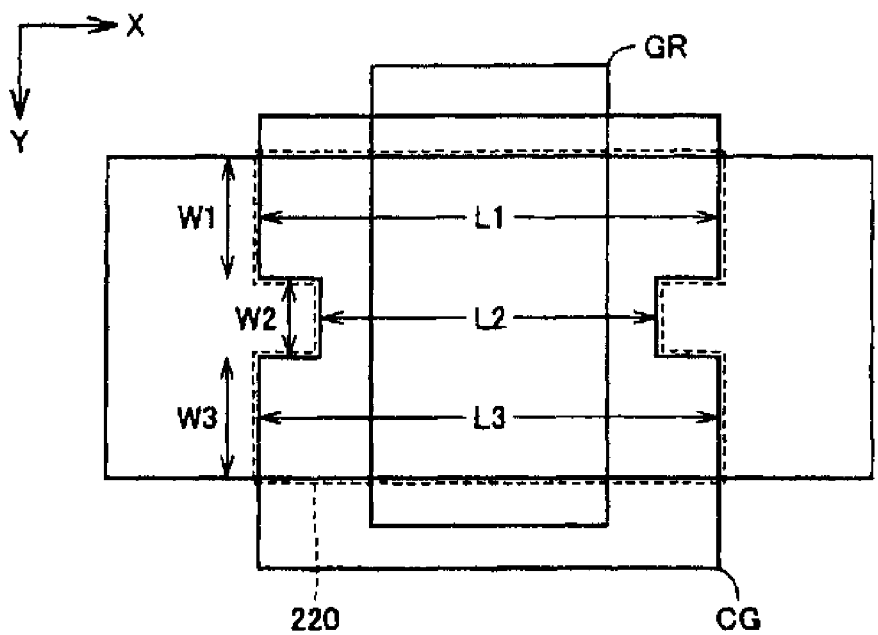
Figure 21:
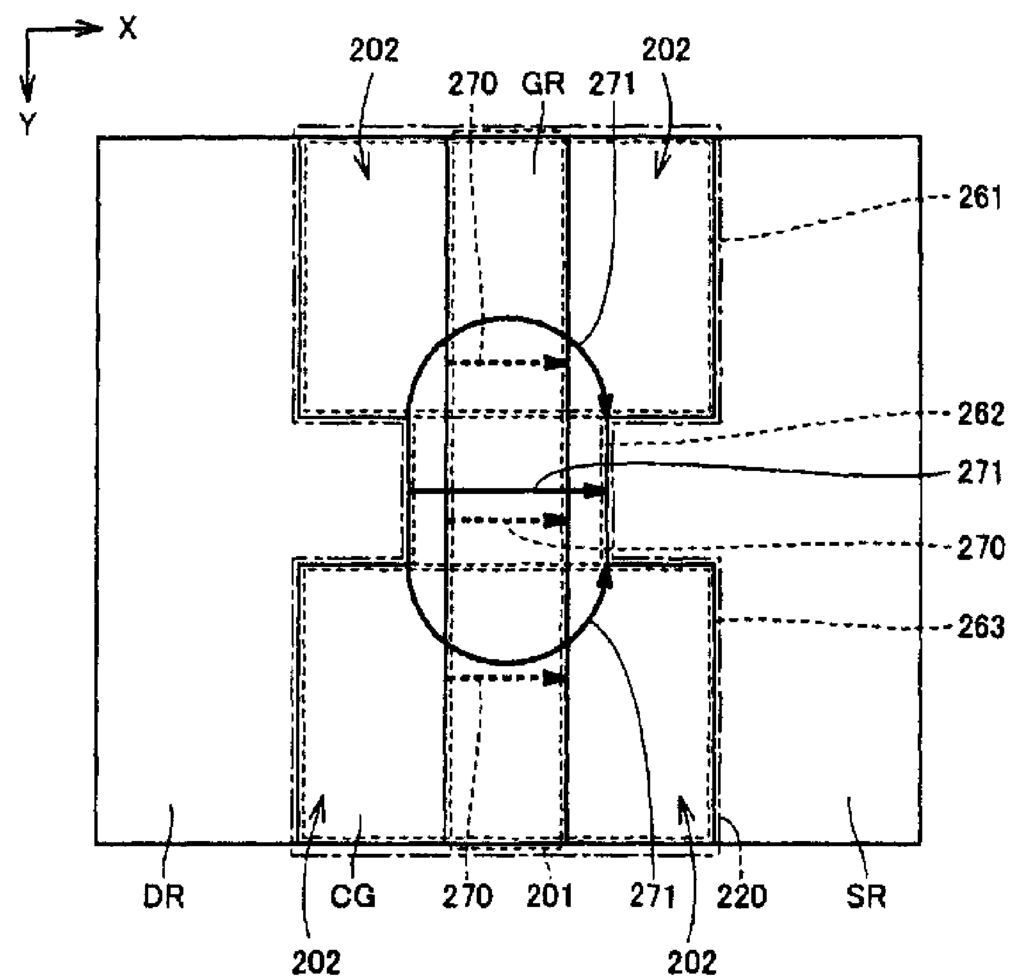
Figure 22:
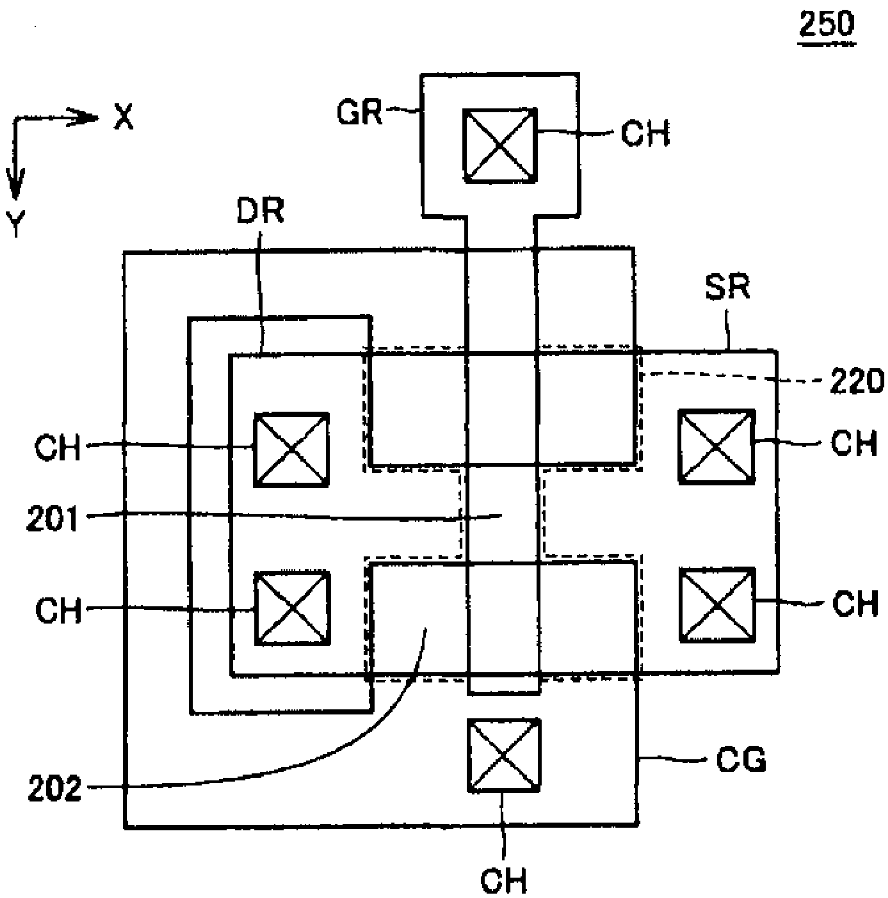
Figure 23:
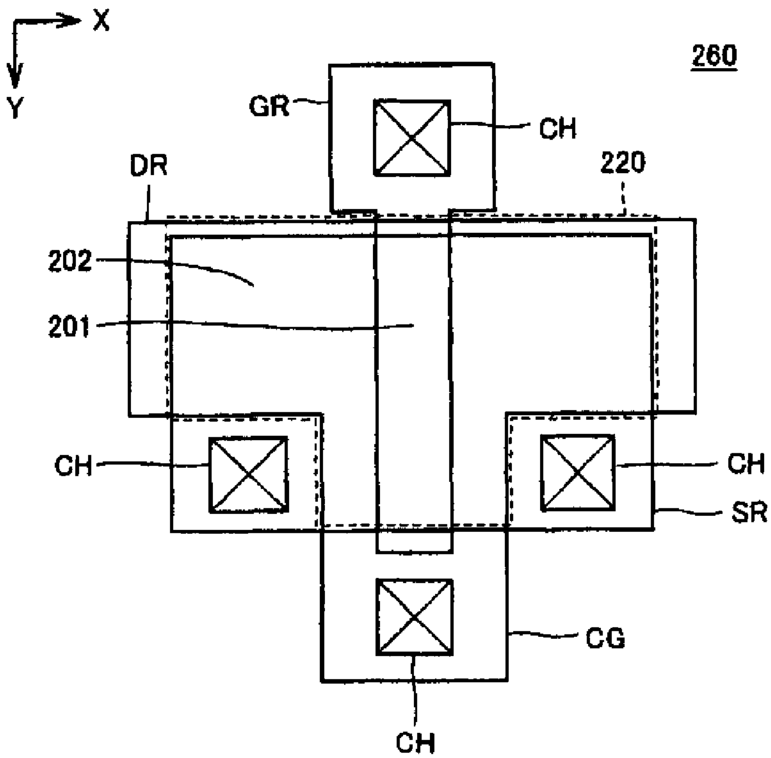
Figure 24:
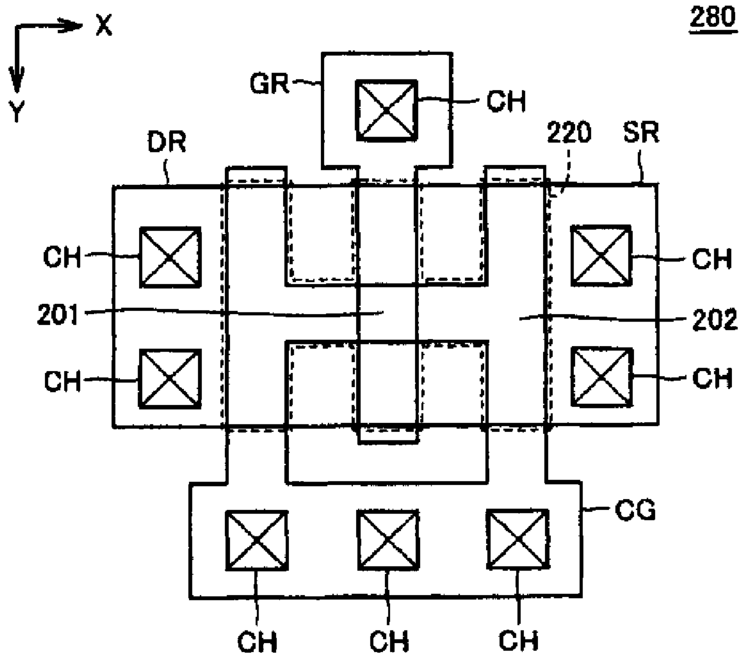
Figure 25:
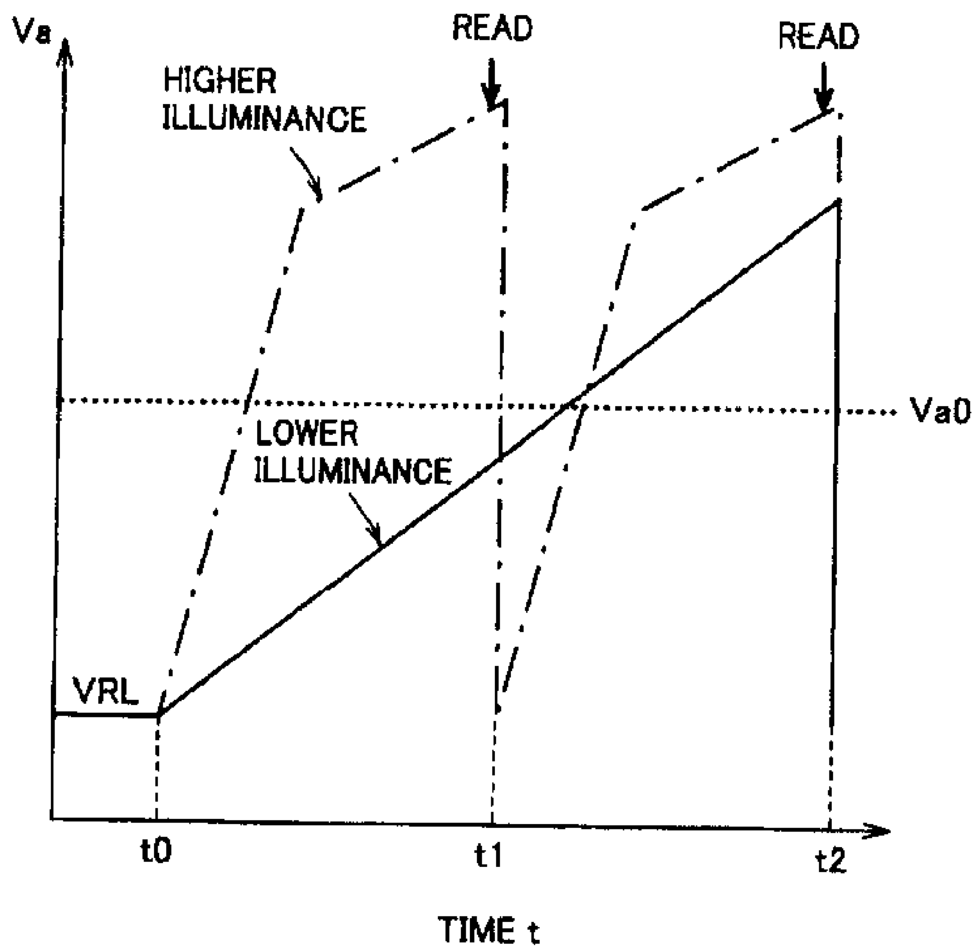
Figure 26:
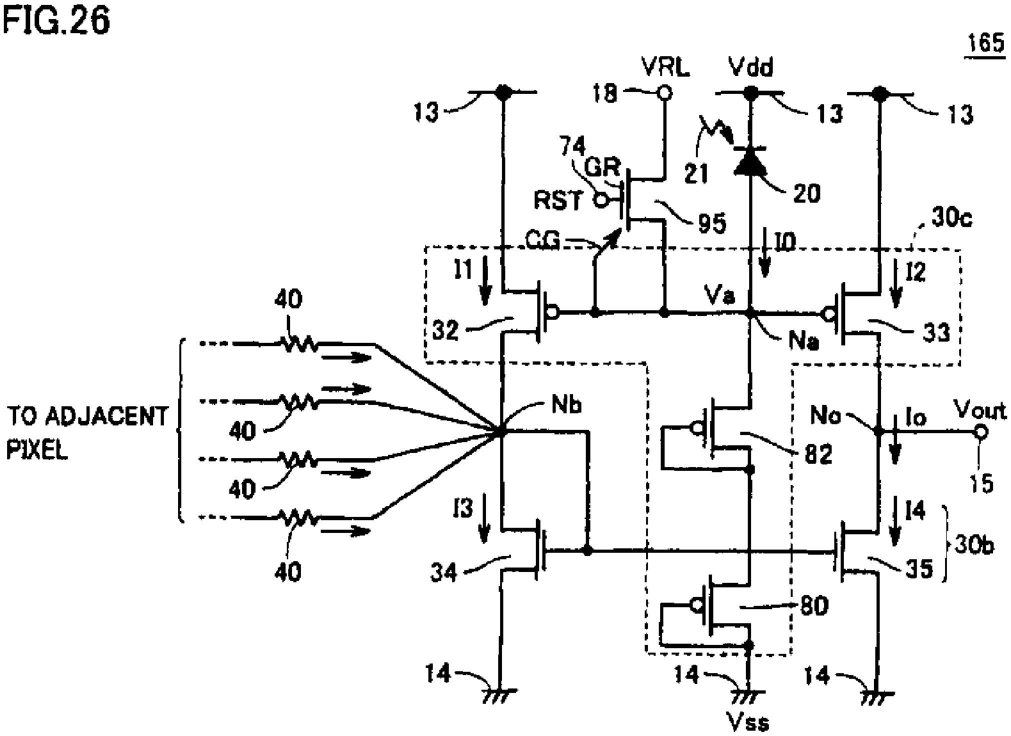
Figure 27:
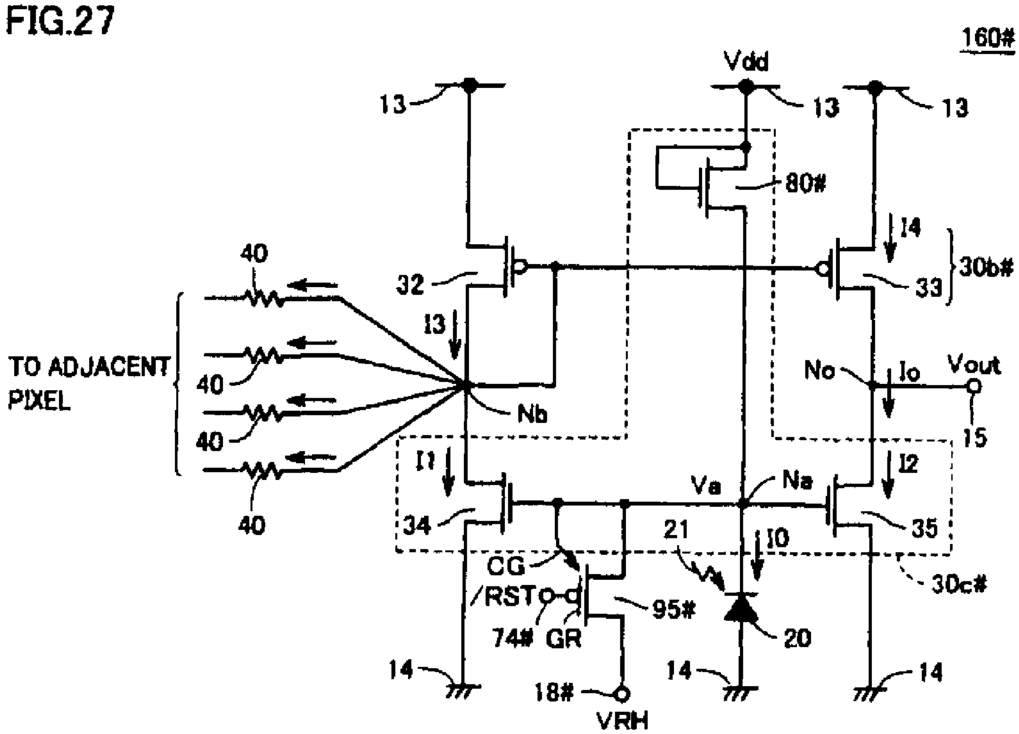
Figure 28:
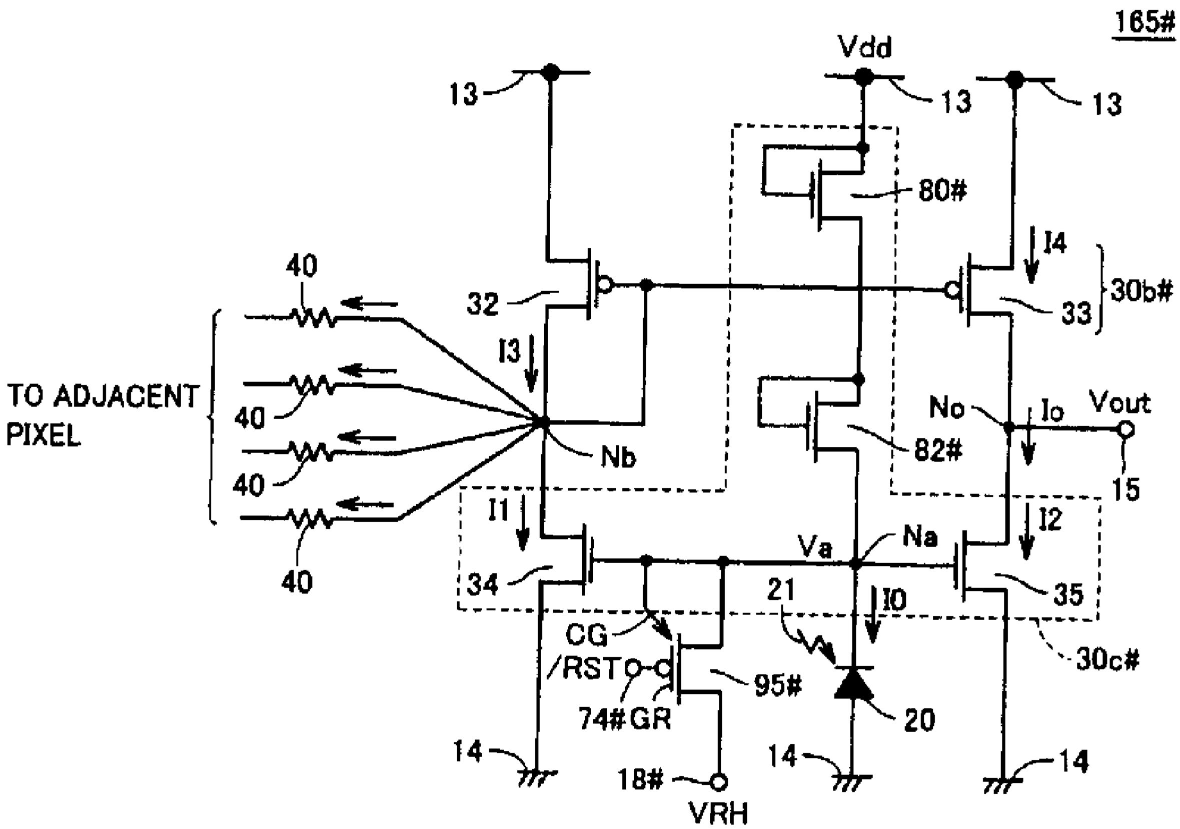
Figure 29:
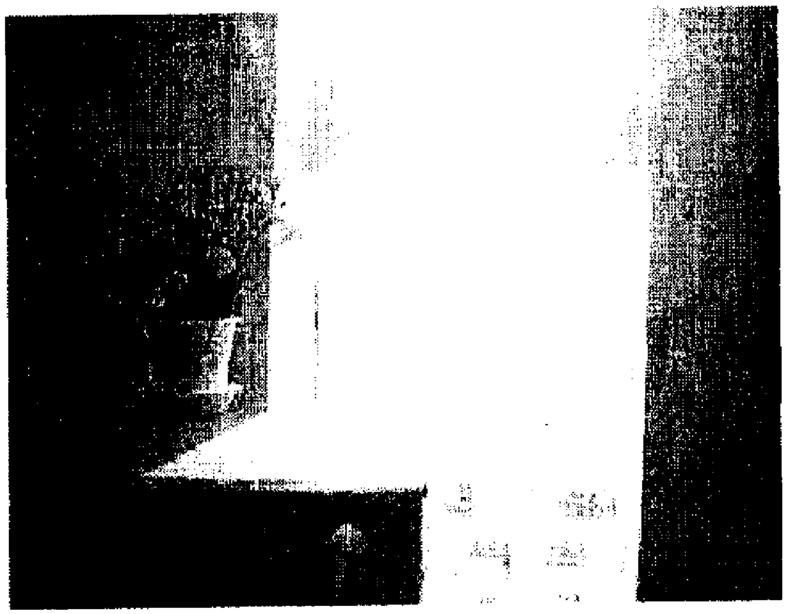
Figure 30:
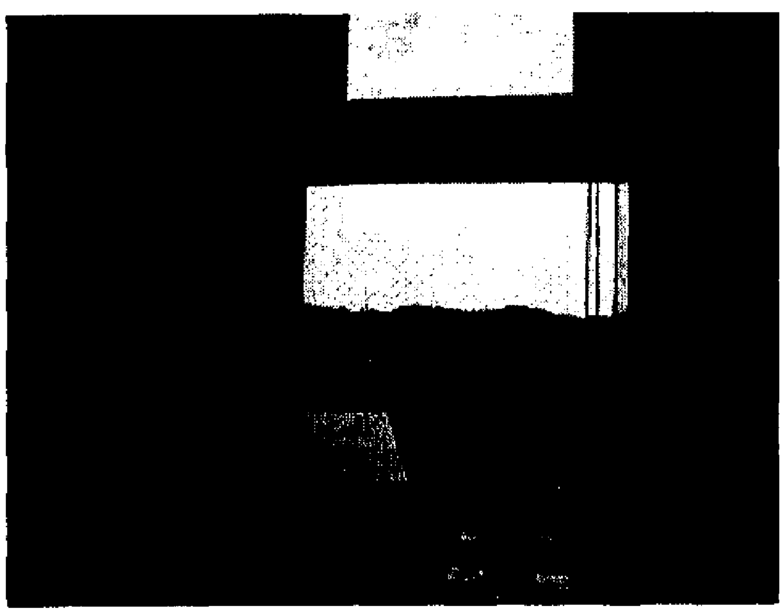
Figure 31:
Figure 1:
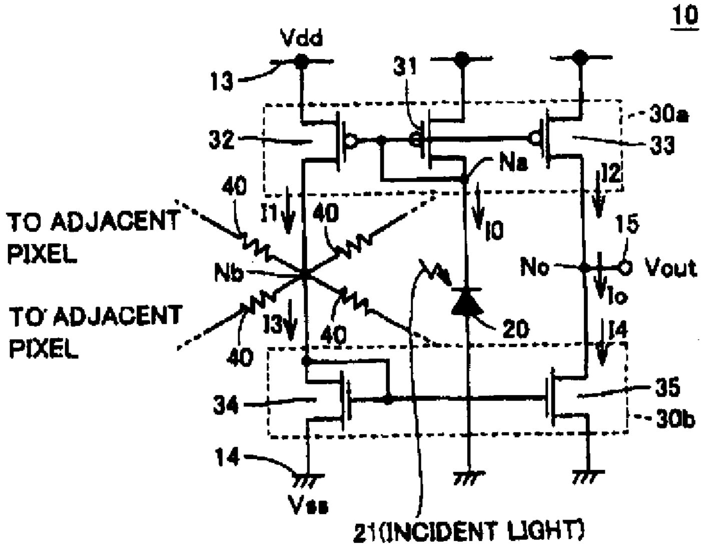
Figure 2:
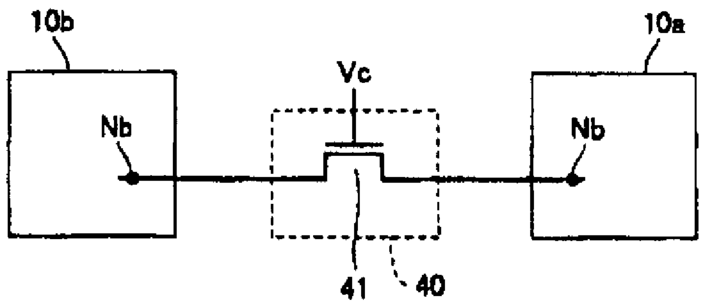
Figure 3:
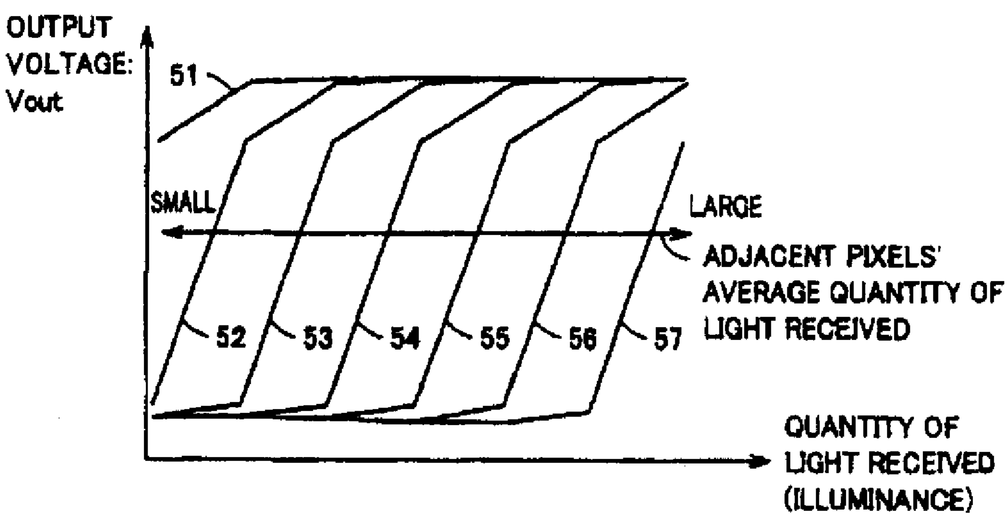
Figure 4:
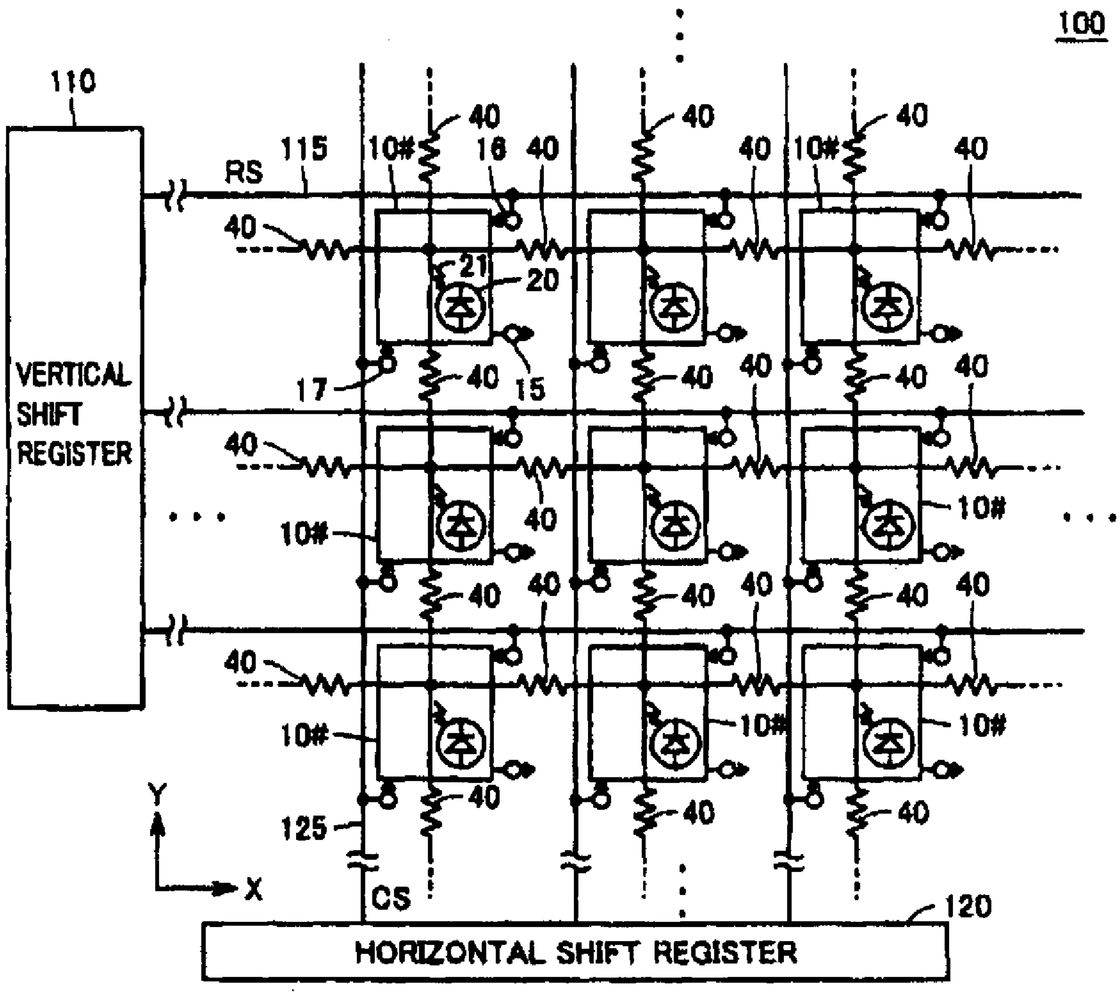
Figure 5:
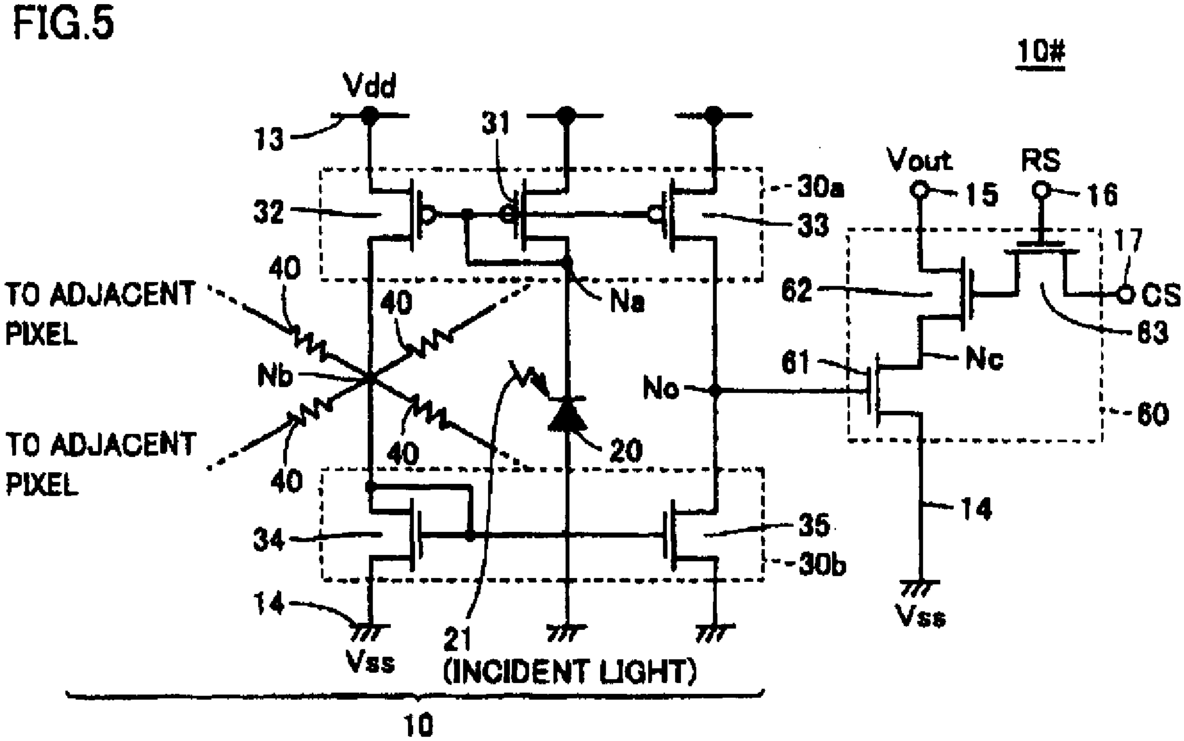
Figure 6:
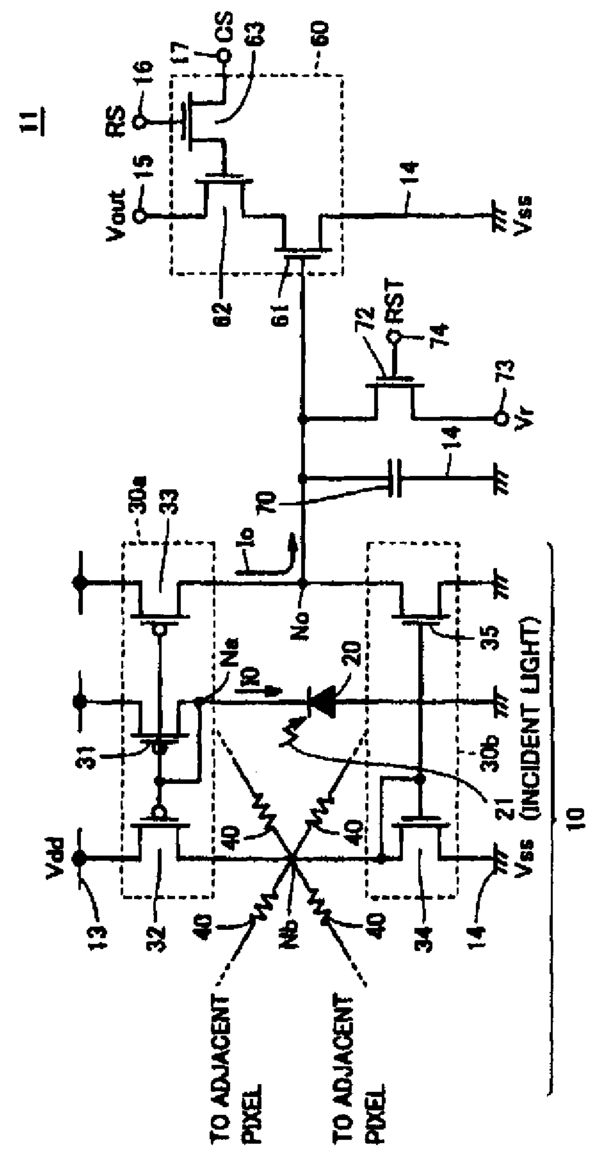
Figure 7:
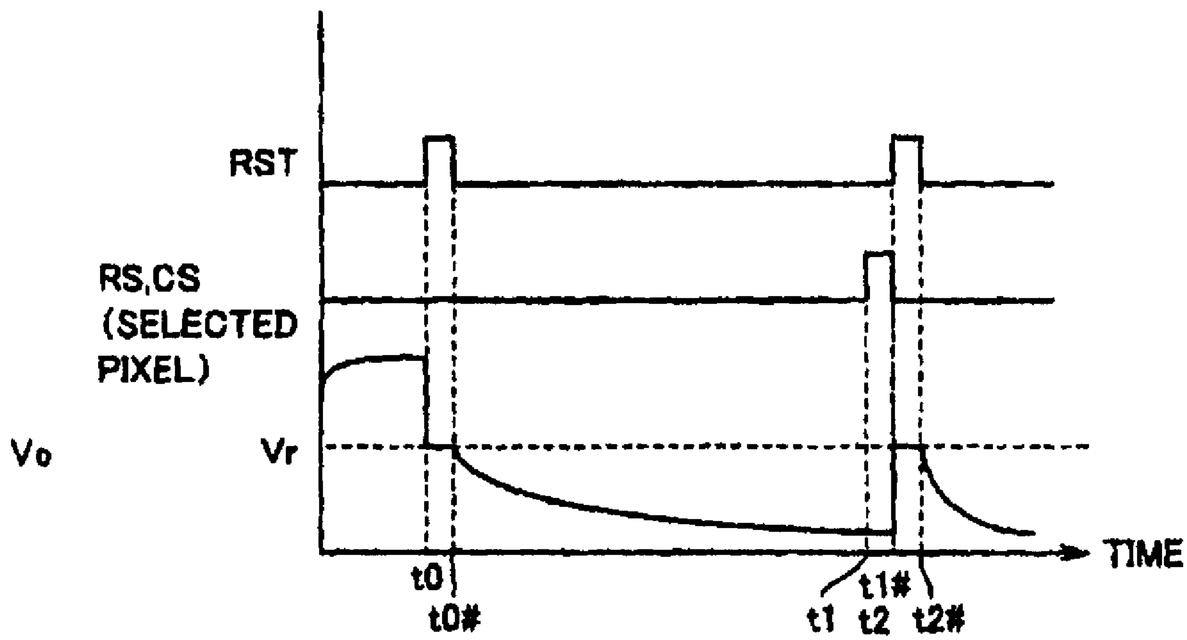
Figure 8:
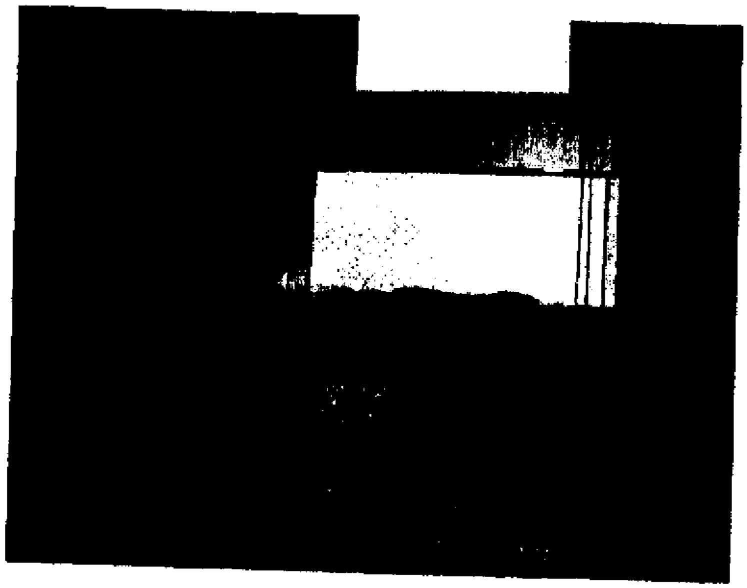
Figure 9:
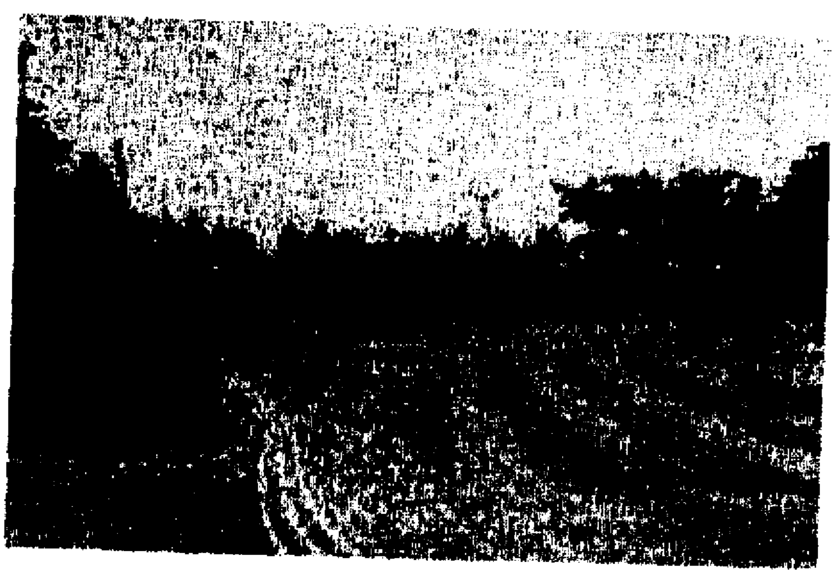
Figure 10:
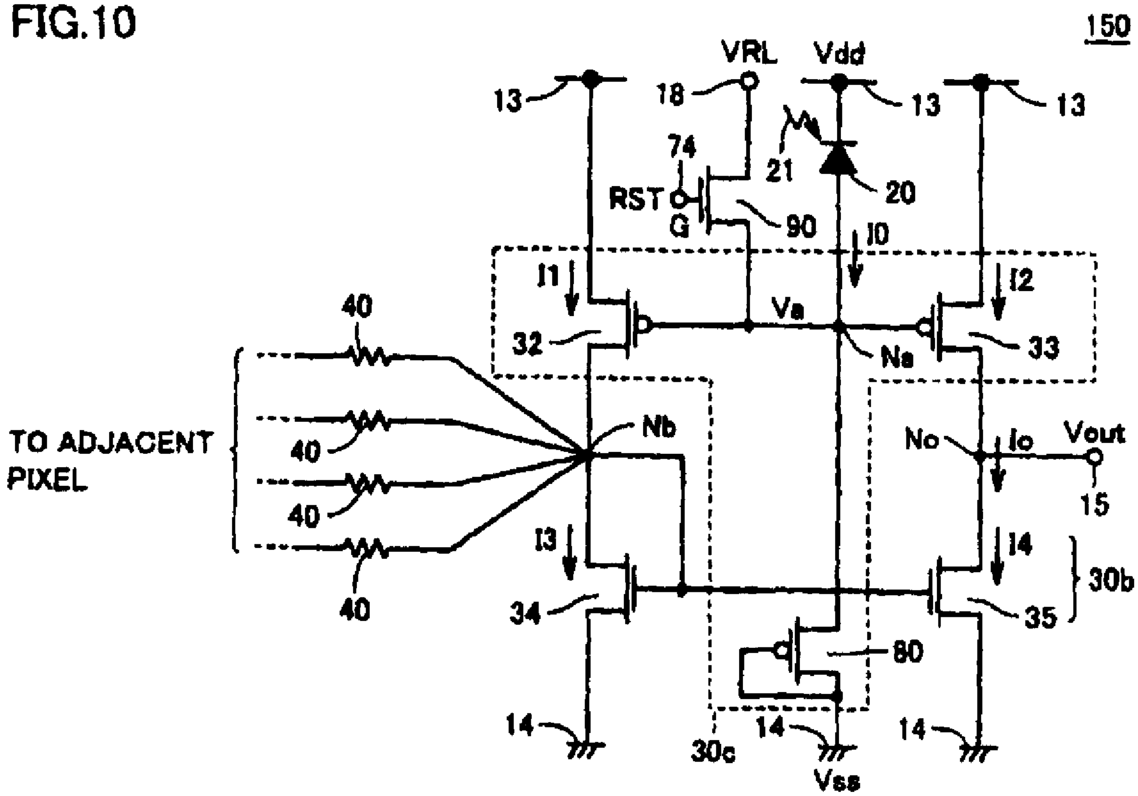
Figure 11:
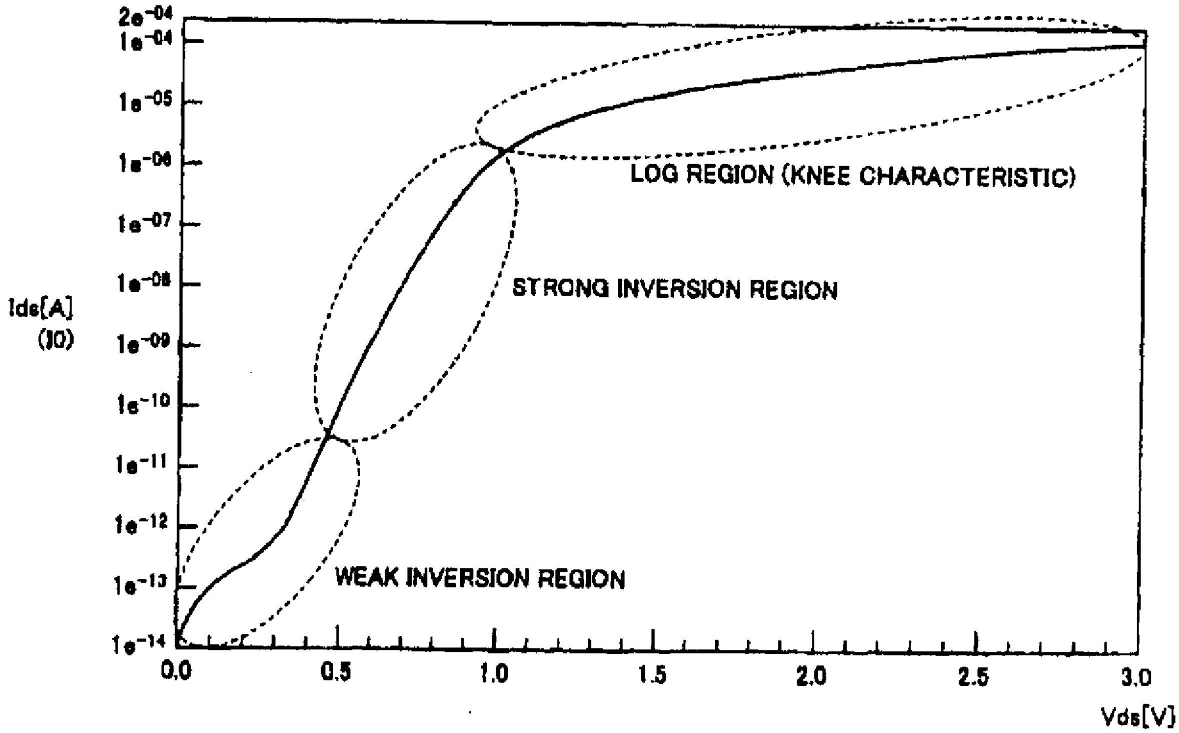
Figure 12:
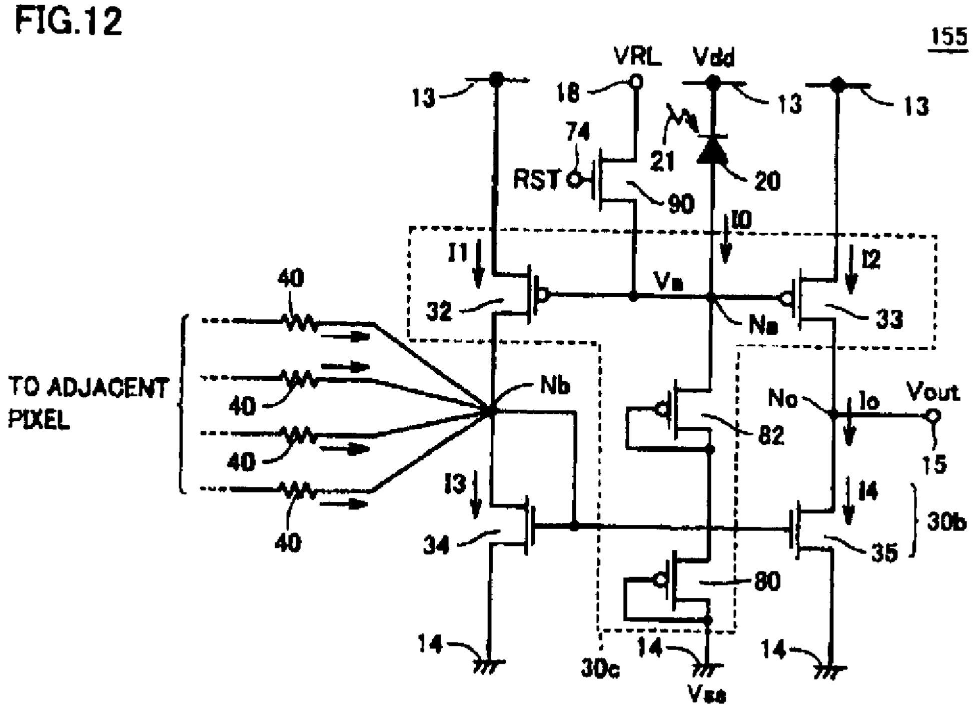
Figure 13:
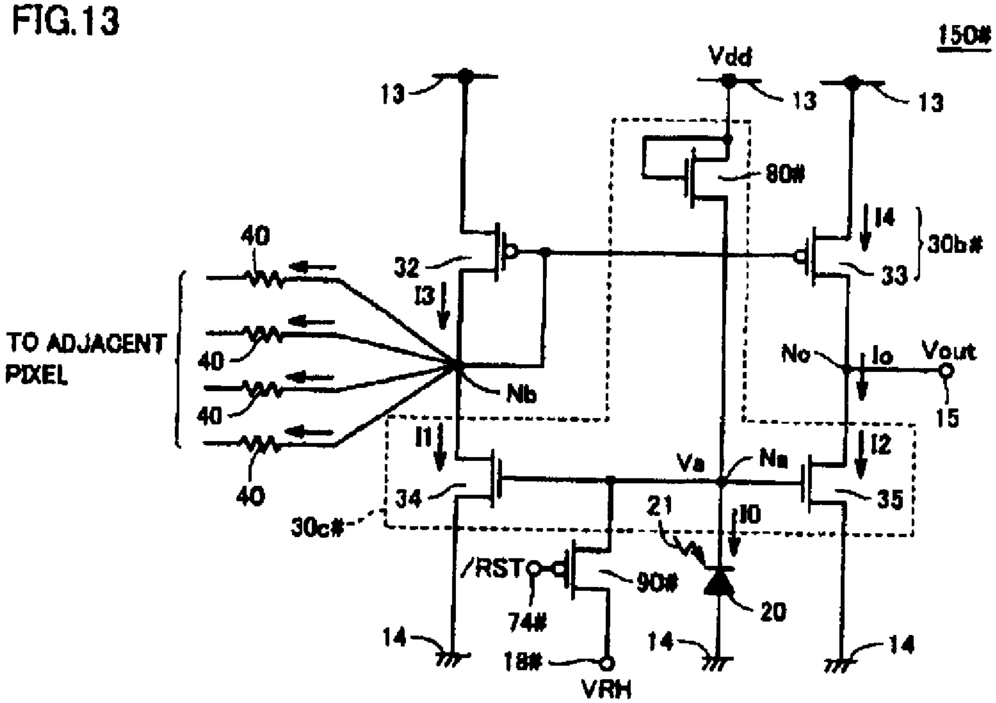
Figure 14:
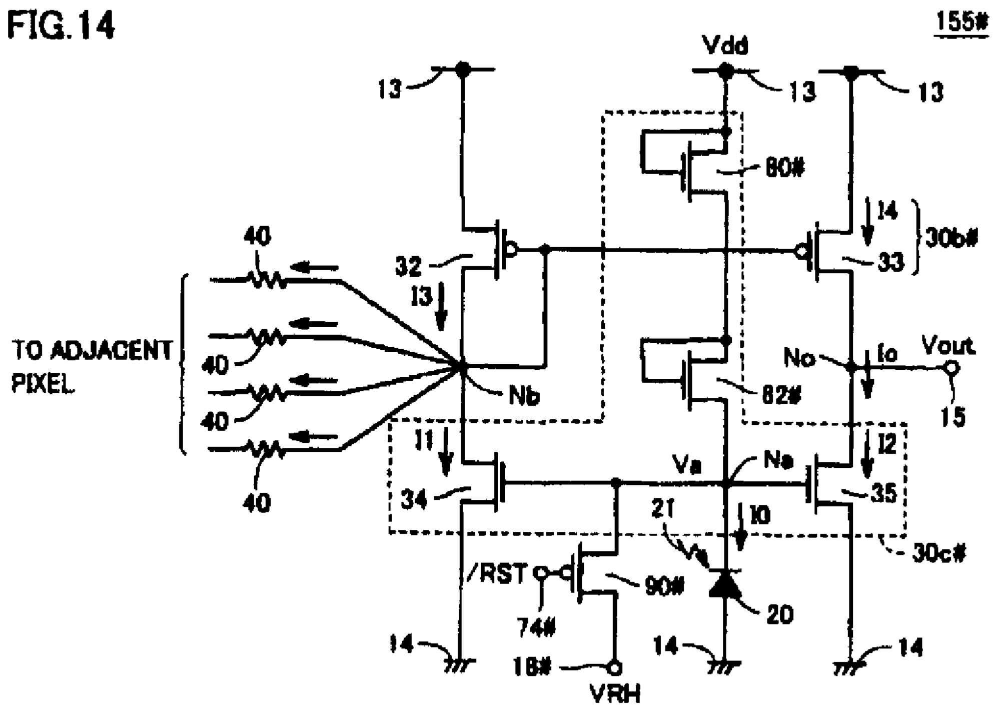
Figure 15:
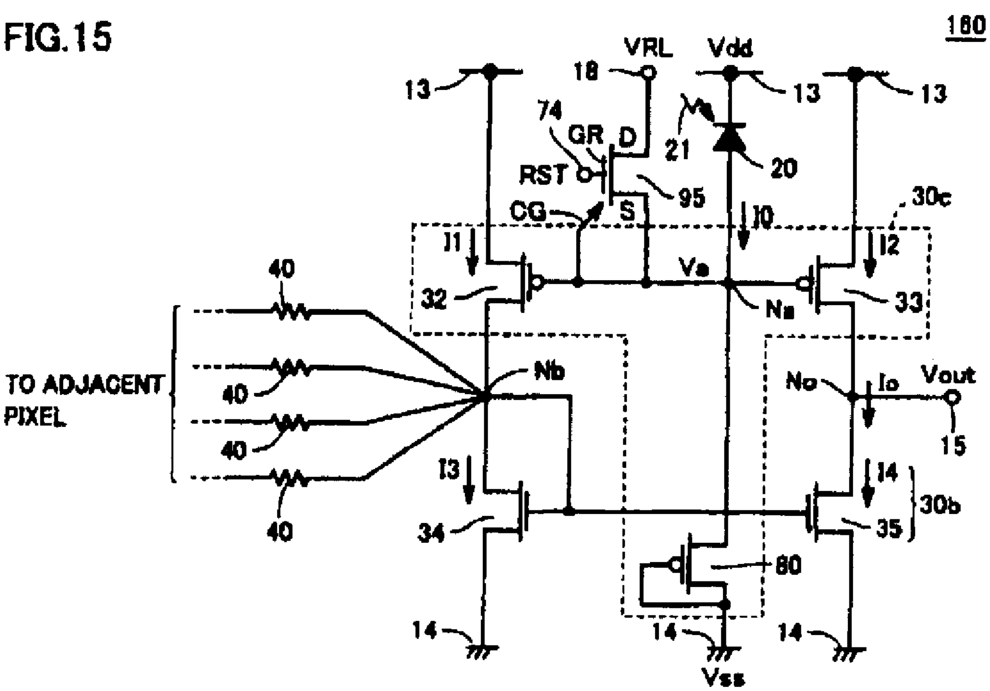
Figure 16A:
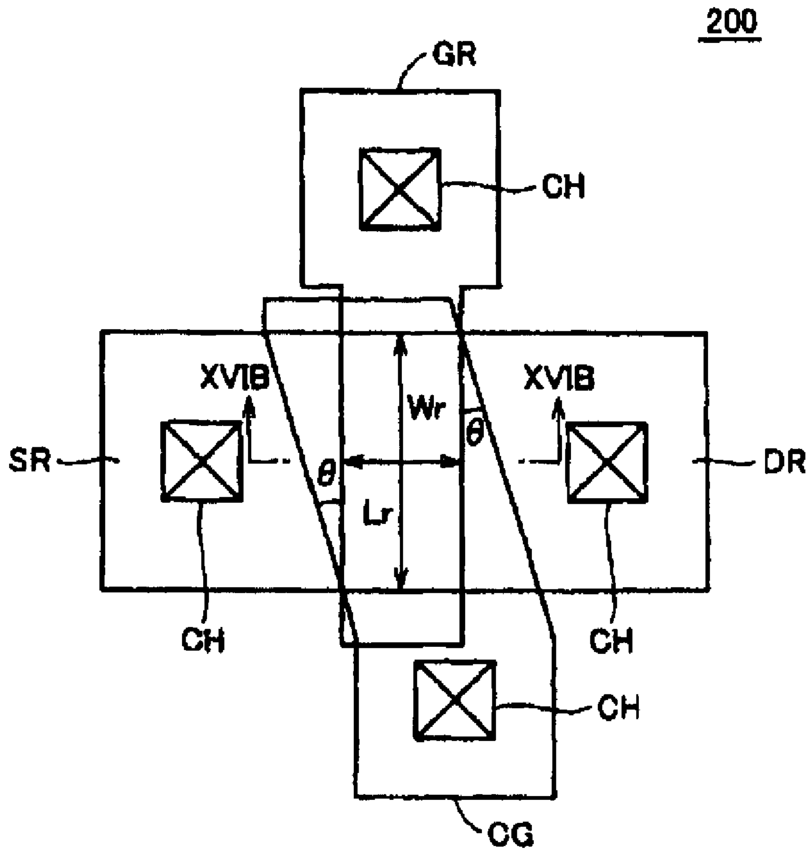
Figure 16B:
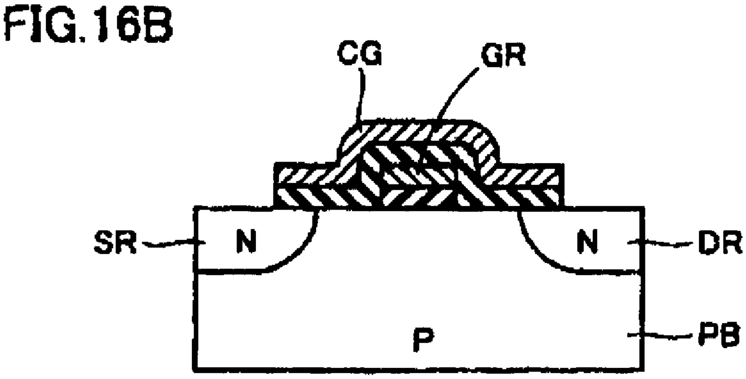
Figure 17A:
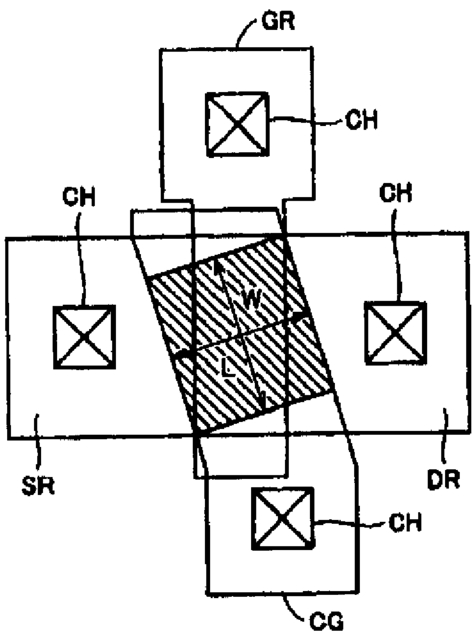
Figure 17B:
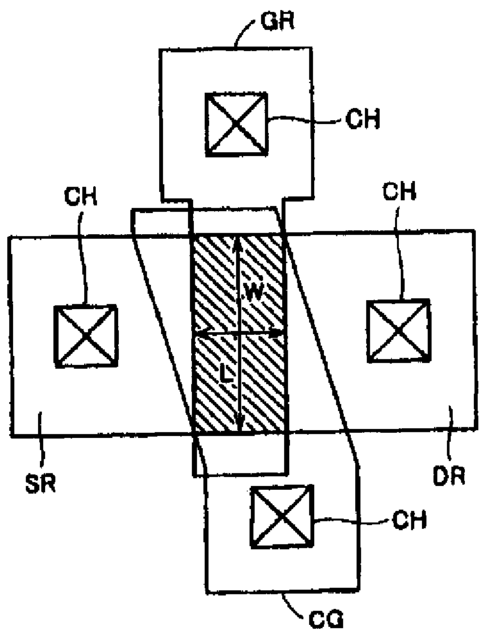
Figure 18:
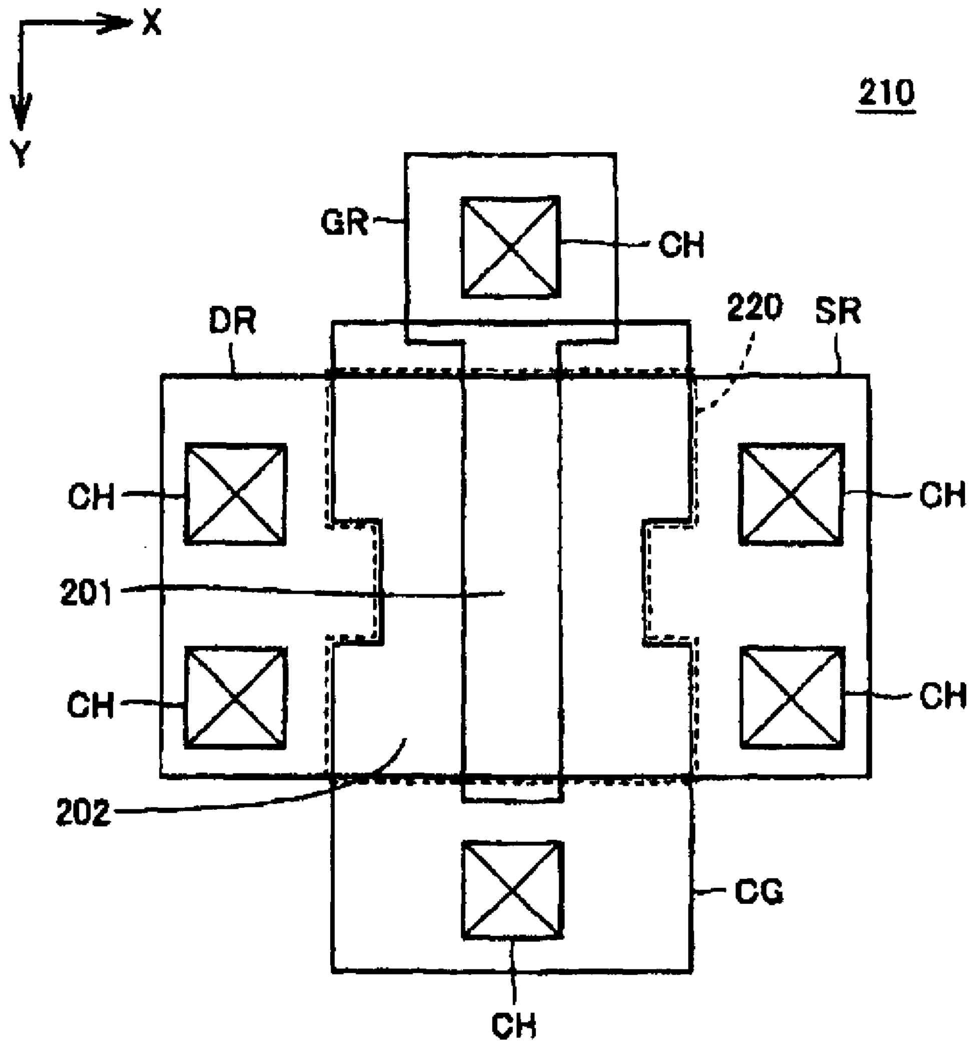
Figure 19:
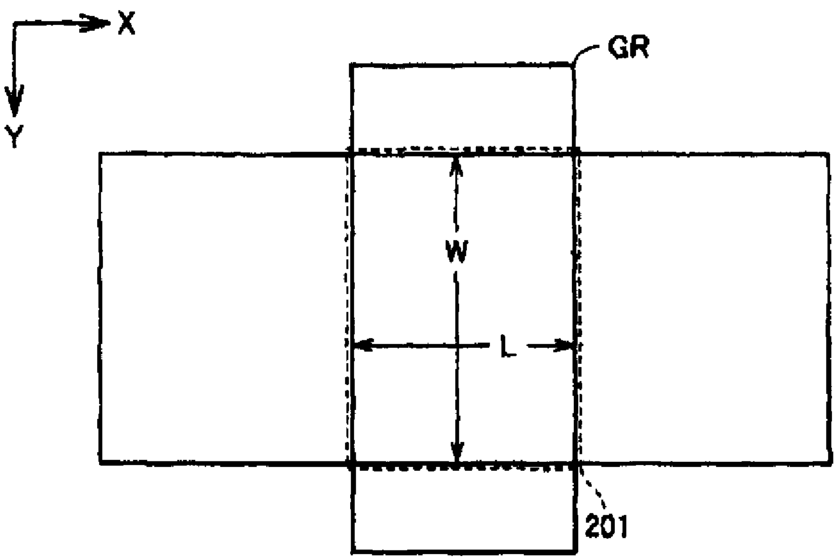
Figure 20:
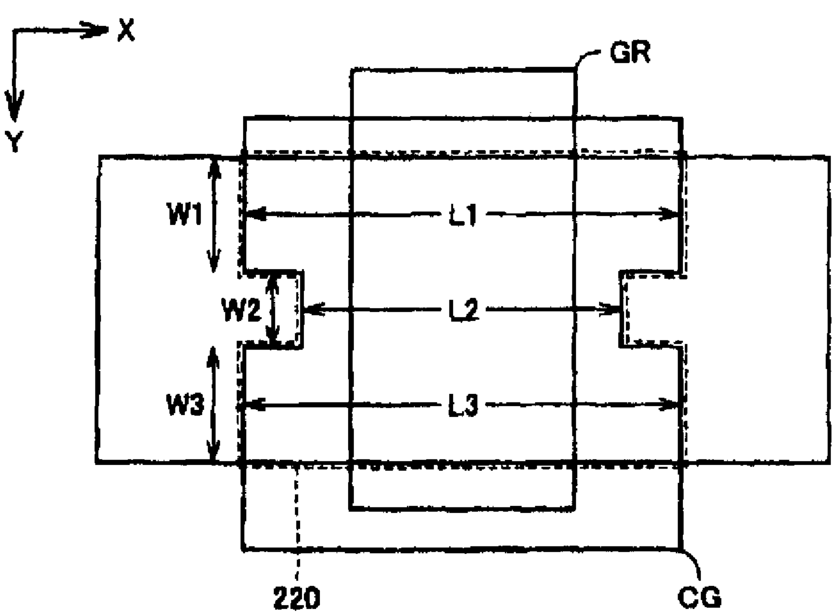
Figure 21:
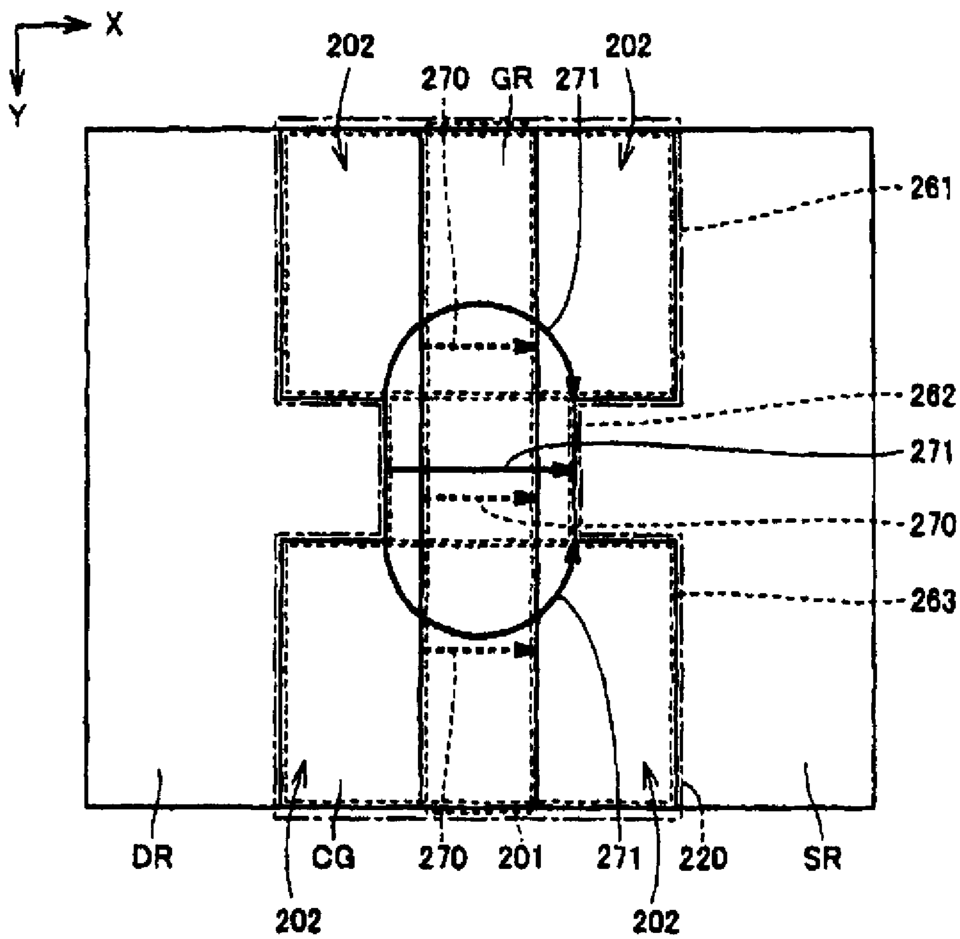
Figure 22:
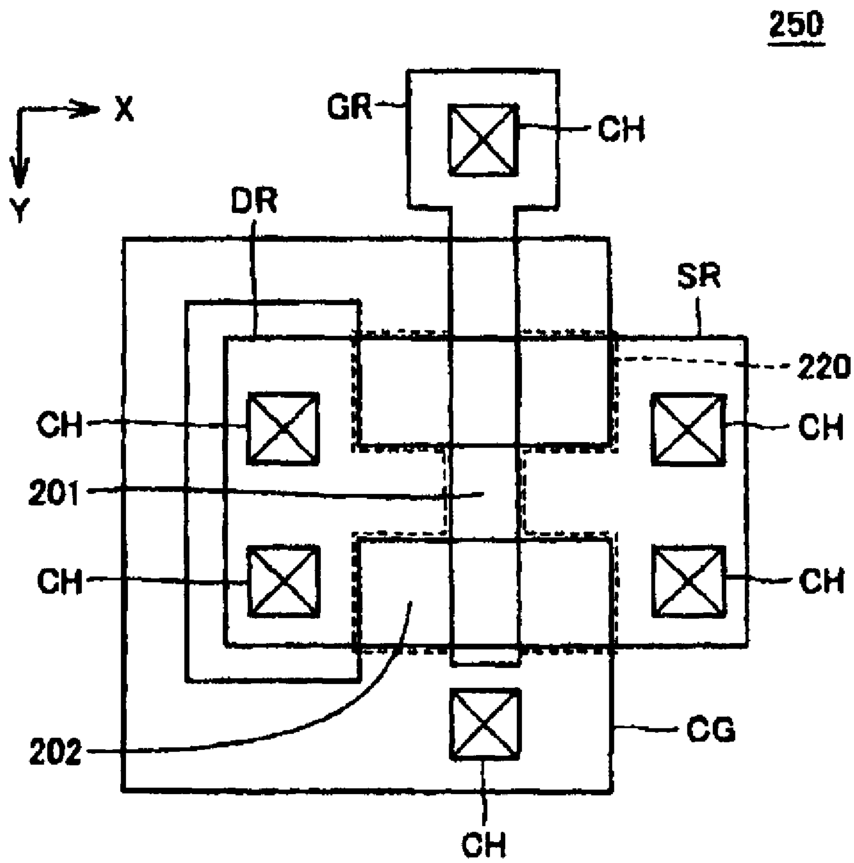
Figure 23:
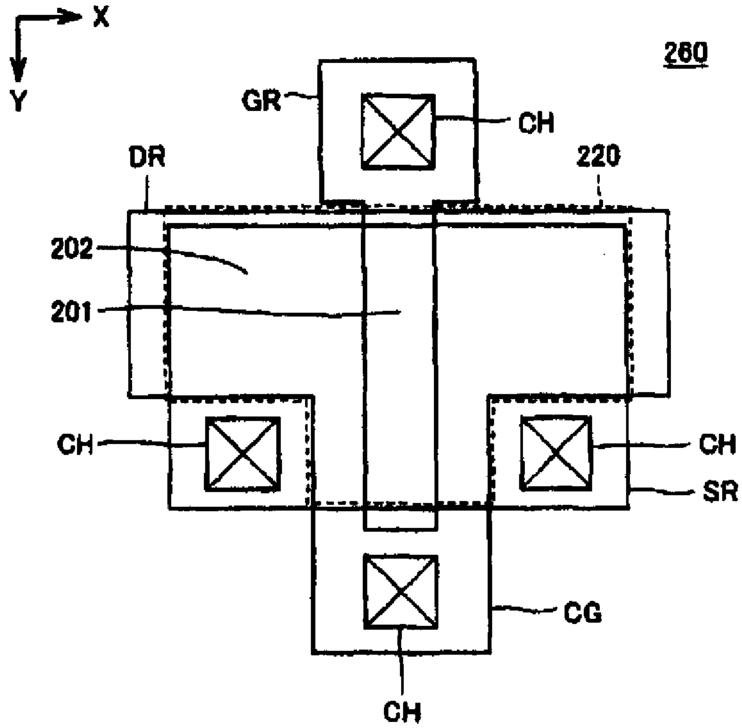
Figure 24:
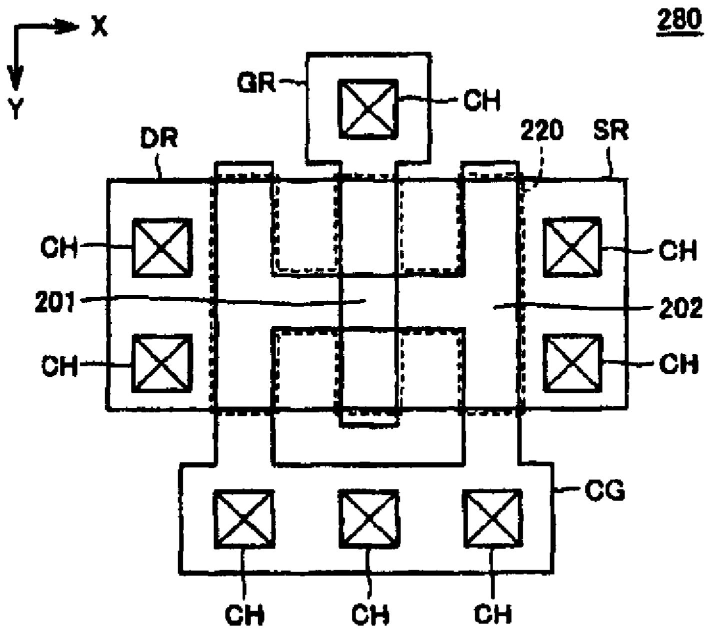
Figure 25:
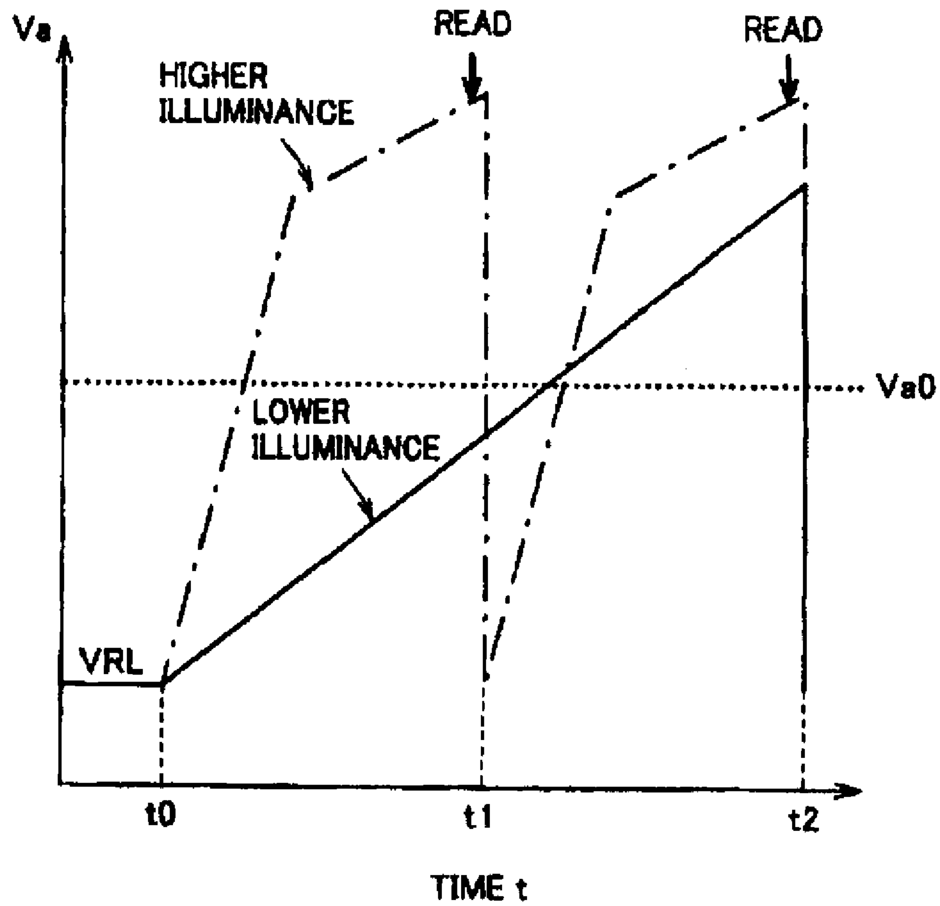
Figure 26:
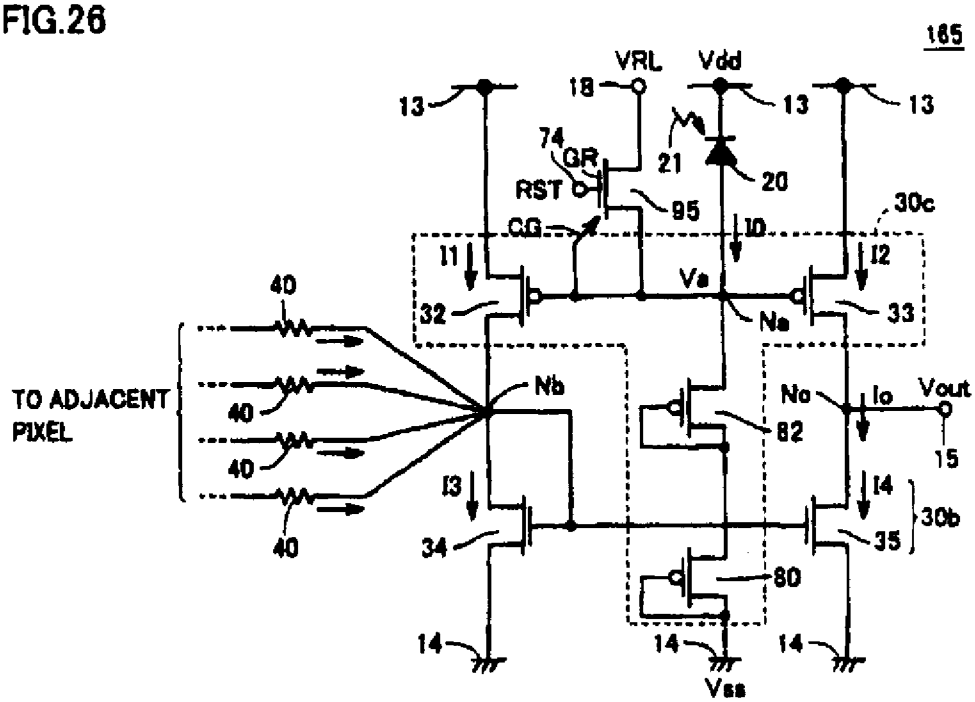
Figure 27:
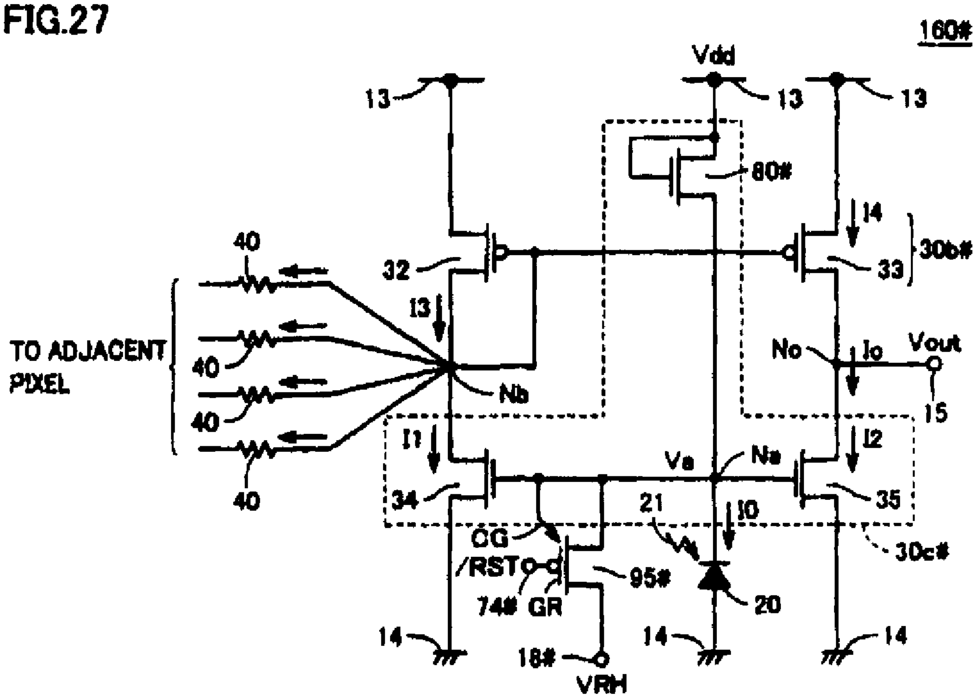
Figure 28:
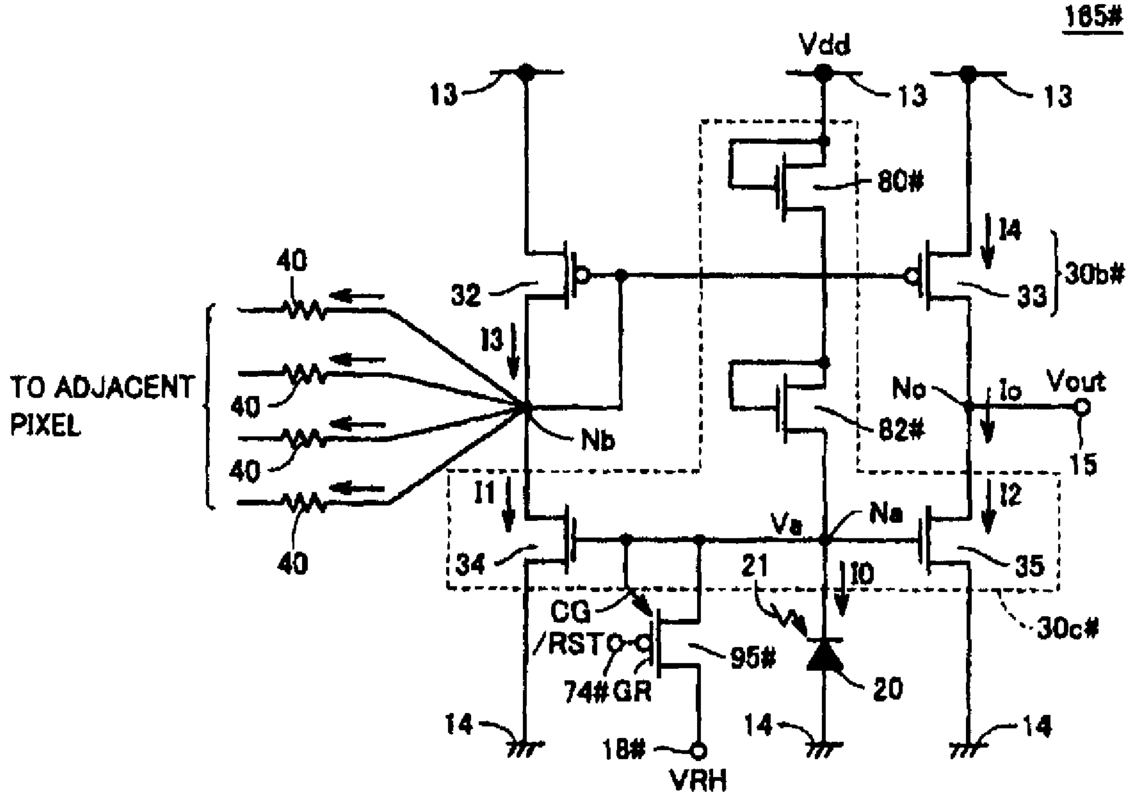
Figure 29:
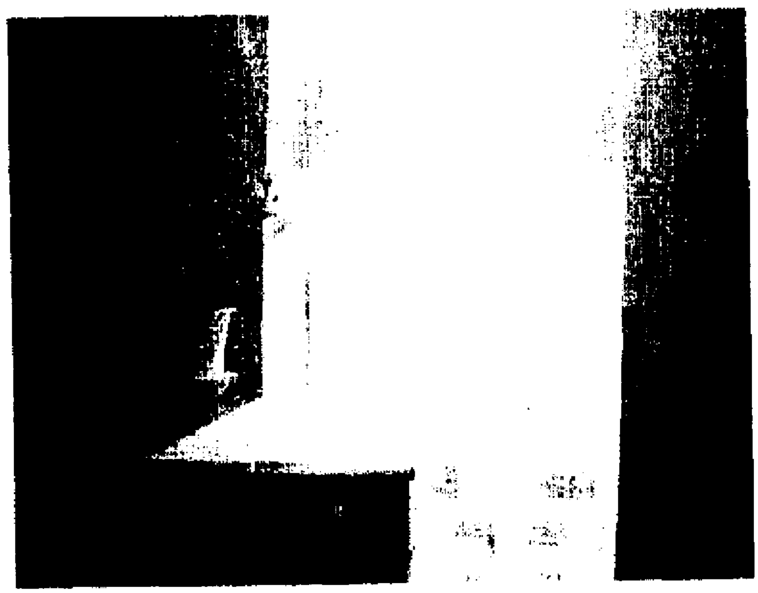
Figure 30:
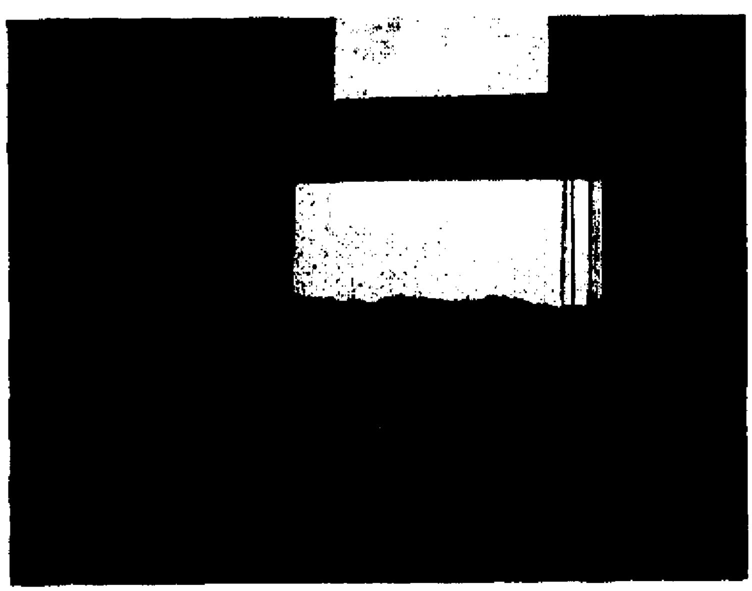
Figure 31:

FIG. 11 shows a result of simulation of the log transistor 80 Vds-Ids characteristic. The simulation was conducted with Vdd=3.3 (V), Vss=0 (V), Vt=0.5 (V) and β=2.5, wherein Vt and β represent the log transistor 80 threshold voltage (in absolute value) and gain coefficient.

With reference to FIG. 11, the log transistor's operation characteristic varies with source-drain voltage Vds. As voltage Vds transitions from a low range to a high range, the log transistor operates in a weak inversion region (Vds<0.5V), a strong inversion region (Vds: 0.5 to 1.0V) and a log region (Vds>1.0V). The weak inversion region generally corresponds to a range associated with Vds lower than the threshold voltage.

In particular, when Vds corresponds to the weak and strong inversion regions, current Ids rapidly increases with Vds. When Vds increases and enters the intensely inversed range, however, the value in resistance of n and p layers of MOS transistor cannot be neglected, and Ids increases with a reduced gradient. This phenomenon is referred to as a diode's knee characteristic. Thus for higher Vds, Ids has smaller gradient, and for a wide optical intensity distribution of ten digits or more, saturation of voltage Va of node Na can be reduced.

Reset transistor 90 conducts for the reset pulse RST activation period to drive node Na to reset voltage VRL. Node Na has voltage Va increased after this reset operation from a state set around ground voltage Vss to a level corresponding to photocurrent I0 by current-voltage conversion provided by log transistor 80. In other words, voltage Va is indicated by Vds provided when Ids corresponding to photocurrent I0 flows through log transistor 80.

In particular, by setting reset voltage VRL in a range that allows log transistor 80 to operate in the reset operation in the weak inversion region, or provides (VRL-Vss)<0.5V or less if the FIG. 11 characteristic is followed, a more sensitive response can also be obtained for picking up an image for low illuminance range.

Again with reference to FIG. 10 p channel MOS transistors 32 and 33 have their gates each connected to node Na. As such, p channel MOS transistor 32 passes to node Nb current I1 corresponding to photocurrent I0 and similarly p channel MOS transistor 33 passes to output node No current I2 corresponding to photocurrent I0.

Pixel circuit 150 also has node Nb electrically connected via resistance component 40 provided as an "inter-pixel connect" to node Nb of at least one adjacent pixel circuit 150. Thus node Nb has passing therethrough current I3 corresponding to an average quantity of light received in mutually connected, adjacent pixel circuits as current I1 is divided and composited between the pixel circuits connected via resistance component 40.

Node Nb passes current I3, which is transferred by current mirror circuit 30*b* to current I4 passing through n channel MOS transistor 35.

As a result, output node No outputs current Io which is, similarly as described for the FIG. 1 pixel circuit 10, a differential current of current I2 corresponding to photocurrent I0 in pixel circuit 150 of interest and current I4 corresponding to an average quantity of light received at adjacent pixel circuits including that of interest. As such, at output terminal 15 is generated output voltage Vout having a value corresponding to output current Io, i.e., a value corresponding to a difference between a quantity of light received at pixel circuit 150 of interest and an average quantity of light received at adjacent pixels including that of interest.

Thus the third embodiment's pixel circuit 150 also enjoys an effect similar to that of pixel circuit 10 of the first embodiment. More specifically, pixel circuit 150 provides a relationship between a quantity of light received and output voltage Vout similar to that shown in FIG. 3, and by providing each pixel circuit with a single photodiode (or photodetection element), a wider photosensitivity range and high contrast detection can be achieved.

Furthermore, current generation circuit 30*c* employing log transistor 80 ensures a wide pickup range and also allows more sensitive photoelectric conversion in picking up an image for a low luminance range. Note that log transistor 80 has a current driving force larger than p channel MOS transistor 31 configuring current mirror circuit 30*a* (FIG. 1), and voltage Va corresponding to photocurrent I0 can be obtained at node Na in a reduced period of time. In other words, rapid response of photoelectric conversion operation from photocurrent to output voltage can also relatively be improved.

Furthermore, setting reset voltage VRL so that immediately after the reset operation log transistor 80 operates within the weak inversion region allows the photoelectric conversion operation to be further faster provided; when photocurrent I0 generated by illuminating photodiode 20 is converted to voltage, log transistor 80 sharing node Na connected to the anode of photodiode 20 operates in the weak inversion region, as also indicated by the FIG. 11 current-voltage characteristic (Ids-Vds characteristic), to ensure a larger variation in voltage relative to that in current than when the transistor operates in the other ranges. Thus reset transistor 90 allows a direct reset operation for node Na so that a pixel circuit can be configured that can reduce lag and also provide quick response.

Note that pixel circuit 150 can also have the p channel MOS transistors 32 and 33 and n channel MOS transistors 34 and 35 current driving abilities (or transistor sizes) appropriately designed so as to generate currents I1-I4 to amplify photocurrent I0 to provide enhanced noise resistance.

Figure 12:
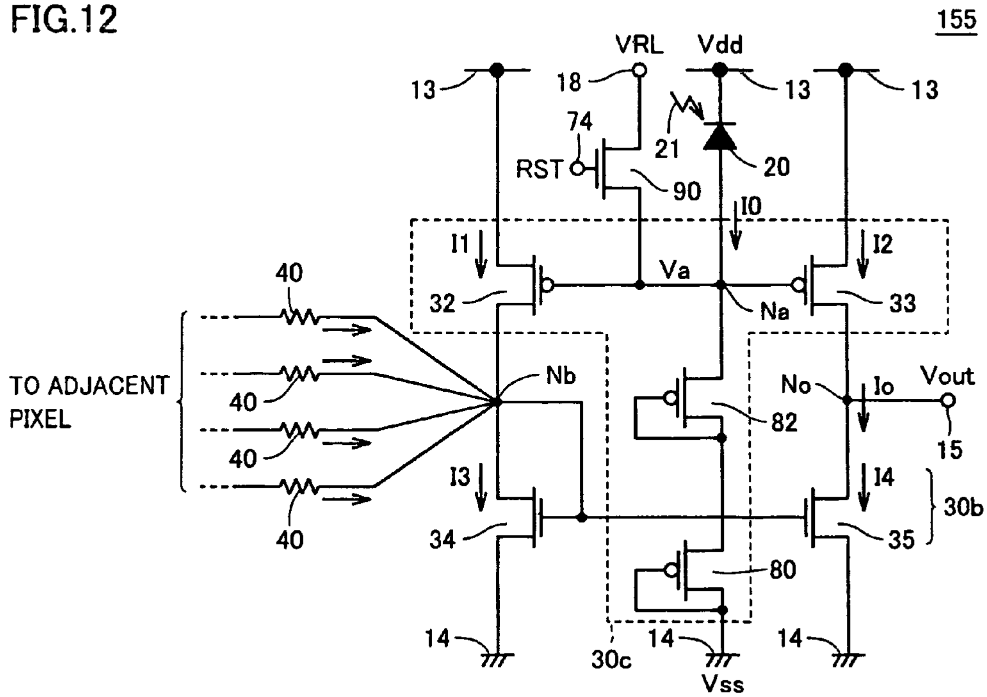
FIG. 12 shows another exemplary configuration of the pixel circuit in accordance with the third embodiment.

With reference to FIG. 12, the third embodiment in another exemplary configuration provides a pixel circuit 155 different from the pixel circuit 150 configuration shown in FIG. 10 in that between node Na and ground node 14 a plurality of log transistors 80 and 82 are connected in series.

Log transistor 82 is implemented by a p channel MOS transistor and connected between log transistor 80 also shown in FIG. 10 and node Na. More specifically, log transistor 82 have its source connected to node Na and has its gate and drain connected to log transistor 80 (pMOS) at the source. Thus log transistor 80 has its source electrically connected via log transistor 82 to node Na, and log transistor 82 has its drain electrically connected via log transistor 80 to ground node 14. Log transistor 82 has a Vds-Ids characteristics similar to that of log transistor 80 shown in FIG. 11.

Thus in pixel circuit 155 photocurrent I0 can be converted to voltage Va at a photoelectric convener rate ($\Delta$Va/$\Delta$I0) approximately twice that in pixel circuit 150. Although pixel circuit 155 has a layout area increased by that introduced by log transistor 82, pixel circuit 155 can substantially be higher in sensitivity than pixel circuit 150 and thus allows an image to be picked up for further lower illuminance.

Note that while the FIG. 12 pixel circuit 155 has two log transistors connected between node Na and ground node I4 in series, the circuit may have three or more log transistors connected in series.

Third Embodiment in Exemplary Variation

The third embodiment provides pixel circuits 150 and 155 having a cathode of photodiode 20 connected to power supply node 13 to reversely bias photodiode 20. In contrast, the third embodiment in an exemplary variation connects an anode of photodiode 20 to ground node 14 to reversely bias photodiode 20 by way of example in configuration, as will be described hereinafter.

Figure 13:
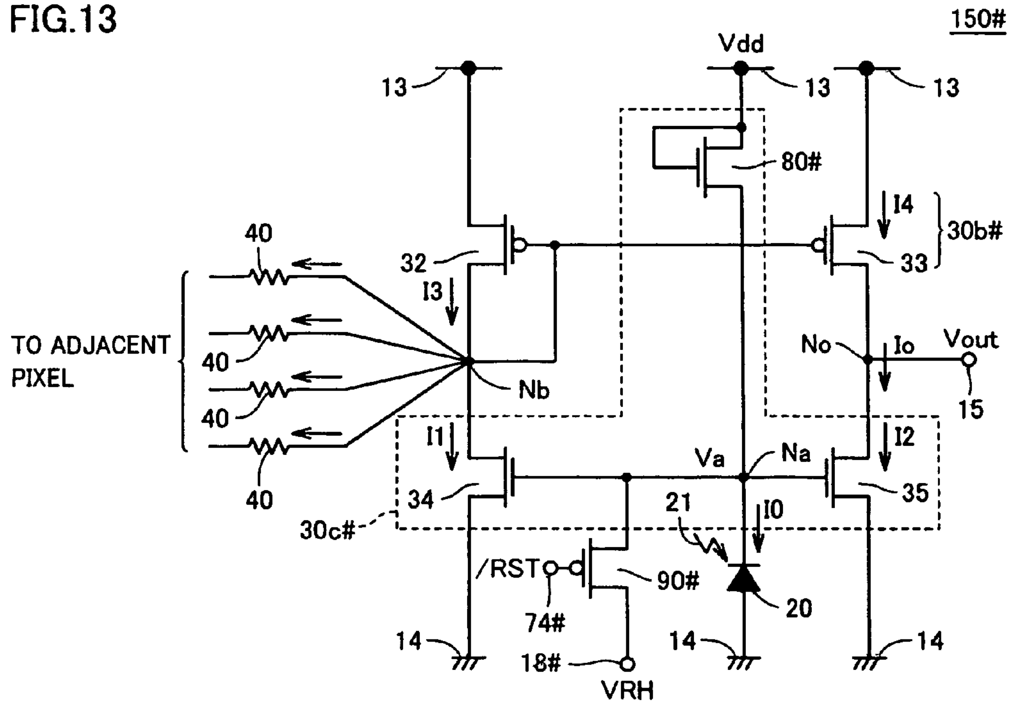
FIG. 13 is a circuit diagram showing a configuration of a pixel circuit in accordance with an exemplary variation of the third embodiment.

With reference to FIG. 13, the third embodiment in the exemplary variation provides a pixel circuit 150#, which is different from the FIG. 10 pixel circuit 150 in that log transistor 80 and reset transistor 90 are replaced with a log transistor 80# and a reset transistor 90#. Furthermore, photodiode 20 is arranged between node Na and ground node 14 and has its cathode and anode electrically connected to node Na and ground node 14, respectively.

Log transistor 80# is implemented by an n channel MOS transistor and has its drain and gate connected to power supply node 13 and its source to node Na. That is, load transistor 80# has a gate voltage fixed at power supply voltage Vdd.

Reset transistor 90# is implemented by a p channel MOS transistor and electrically connected between a reset voltage node 18# and node Na. Reset transistor 90# has its gate connected to a reset terminal 74# applying a reset pulse/RST, a signal opposite in polarity to reset pulse RST and activated periodically as predetermined, for a fixed period of time to the low level.

Reset voltage node 18# supplies a reset voltage VRH, which is set to be equal to or less than power supply voltage Vdd and also around power supply voltage Vdd. In other words, Vss<VRH≦Vdd and VRH≈Vdd. Similarly as has been described in the third embodiment, reset voltage VRH is preferably determined so that immediately after reset operation, log transistor 80# operates within the weak inversion region.

In pixel circuit 150# n channel MOS transistors 34 and 35 have their respective gates each connected to node Na. As such, a current generation circuit 30*c*# configured including n channel MOS transistors 34 and 35 and log transistor 80# generates currents I1 and I2 corresponding to photocurrent I0 at node Nb and output node No, respectively.

Pixel circuit 150# also has node Nb electrically connected via resistance component 40 to node Nb of at least one adjacent pixel circuit. Thus node Nb has passing therethrough current I3 corresponding to an average quantity of light received in mutually connected, adjacent pixel circuits as current I1 is divided and composited between the pixel circuits connected via resistance component 40.

In pixel circuit 150# p channel MOS transistors 32 and 33 have their respective gates each connected to node Nb. Thus current mirror circuit 30*b*# configured of p channel MOS transistors 32 and 33 generates at output node No current I4 corresponding to current I3 passing through node Nb.

The pixel circuit 150# configuration shown in FIG. 13 and the present invention's configuration have a correspondence, as follows: current generation circuit 30*c*# corresponds to the present invention's "first current generation circuit" and current mirror circuit 30*b*# to the present invention's "second current generation circuit." Furthermore in the FIG. 10 configuration ground node 14 corresponds to a "first power supply node" and power supply node 13 to a "second power supply node." More specifically, p channel MOS transistor 80# corresponds to the present invention's (in particular, claim 7's) "first transistor" and n channel MOS transistors 34 and 35 to the present invention's (in particular, claim 7's) "second transistor" and "third transistor," respectively, and p channel MOS transistors 32 and 33 correspond to the present invention's (in particular, claim 7's) "fourth transistor" and "fifth transistor," respectively.

As a result, generated at output terminal 15 is output voltage Vout, similarly as provided in the FIG. 10 pixel circuit 150, having a value corresponding to output current Io serving as a differential current between current I2 corresponding to photocurrent I0 in pixel circuit 150 of interest and current I4 corresponding to an average quantity of light received at adjacent pixel circuits including that of interest. i.e., a value corresponding to a difference between a quantity of light received at pixel circuit 150 of interest and an average quantity of light received at adjacent pixels including that of interest.

Thus the third embodiment in the exemplary variation provides pixel circuit 150# also enjoying an effect similar to that of pixel circuit 150 of the first embodiment. More specifically, providing each pixel circuit with a single photodiode (or photodetection element) allows a wider photosensitivity range and high contrast detection can be achieved, and introducing log transistor 80# and reset transistor 90# allows a pixel circuit to be configured to ensure a wider pickup range and also provide enhanced sensitivity for picking up an image for low illumination range, and reduce lag and also provide quick response. Note that pixel circuit 150# can also have the p channel MOS transistors 32 and 33 and n channel MOS transistors 34 and 35 current driving abilities (or transistor sizes) appropriately designed so as to generate currents I1-I4 to amplify photocurrent I0 to provide enhanced noise resistance.

The FIG. 10 pixel circuit 150 and the FIG. 13 pixel circuit 150# will now be compared in blooming resistance.

As is well-known, blooming is a phenomenon caused as follows: when significantly intense light is incident on a photodiode, minority carrier generated at an electrode biased by fixed voltage flows into an adjacent pixel, rather than recombines with majority carrier and disappears, and a false signal is thus generated. As such, minority carrier at the electrode biased by fixed voltage, having shorter lifetime, allows a configuration superior in blooming resistance.

Pixel circuit 150 (FIG. 10) has a cathode (n polarity) biased to power supply voltage Vdd by fixed voltage. Accordingly, minority carrier at an electrode biased by fixed voltage is a hole. In contrast, pixel circuit 150# (FIG. 13) has an anode (p polarity) biased to ground voltage Vss by fixed voltage. Accordingly, minority carrier at an electrode biased by fixed voltage is an electron. In carrier mobility, a hole is smaller in mobility than an electron and hence effective lifetime. As such, pixel circuit 150 with a hole, relatively shorter in lifetime, serving as minority carrier at an electrode biased by fixed voltage will be superior in blooming resistance. More specifically, while pixel circuits 150 and 150# in accordance with the third embodiment and an exemplary variation thereof, respectively, are similar in function and effect for photoelectric conversion between photocurrent and voltage output, for blooming resistance, pixel circuit 150 is superior.

Figure 14:
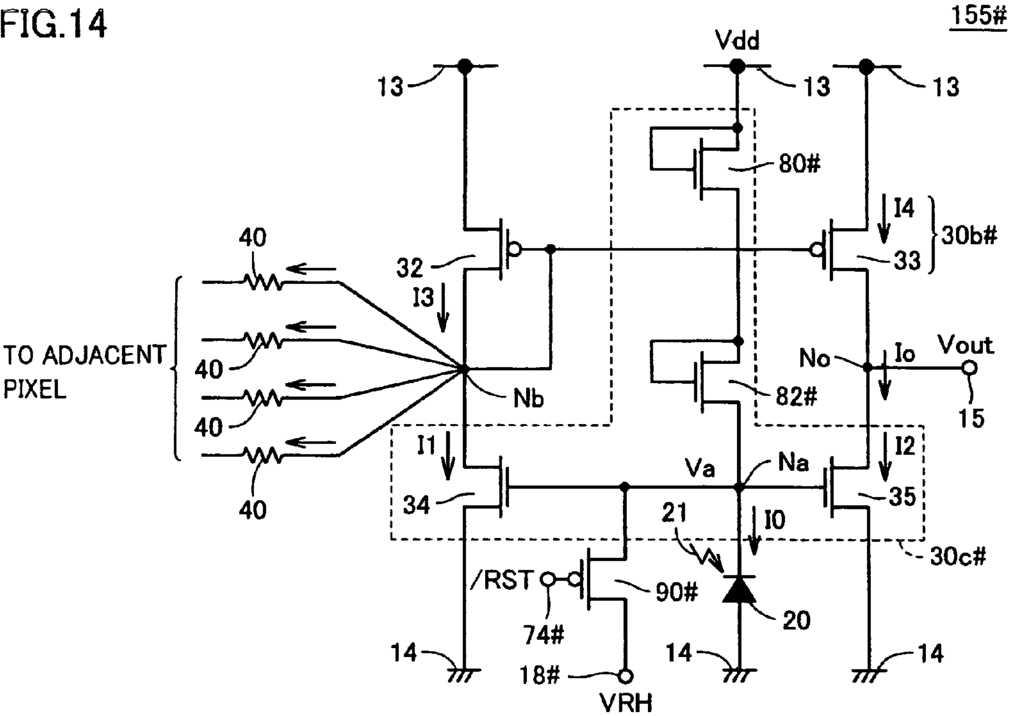
FIG. 14 shows another exemplary configuration of the pixel circuit in accordance with the exemplary variation of the third embodiment.

With reference to FIG. 14, the third embodiment in an exemplary variation having another exemplary configuration provides a pixel circuit 155# different from pixel circuit 155 having the FIG. 13 configuration in that between node Na and power supply node I3 a plurality of log transistors 80# and 82# are connected in series.

Log transistor 82# is implemented by an n channel MOS transistor and connected between log transistor 80# also shown in FIG. 13 and node Na. Log transistor 82# has its source connected to node Na and its gate and drain to log transistor 80# (nMOS) at the source. More specifically, log transistor 80# has its source electrically connected via log transistor 82# to node Na and log transistor 82# has its drain electrically connected via log transistor 80# to power supply node 13. Log transistor 82# has a Vds-Ids characteristic similar to that of log transistor 80#.

Thus in pixel circuit 155# photocurrent I0 can be converted to voltage Va at a photoelectric converter rate ($\Delta Va/\Delta I0$) approximately twice that in pixel circuit 155. Although pixel circuit 155 has a layout area increased by that introduced by log transistor 82#, pixel circuit 155# can substantially be higher in sensitivity than pixel circuit 155 and thus allows an image to be picked up for further lower illuminance.

Note that while the FIG. 14 pixel circuit 155# has two log transistors connected between node Na and power supply node 13 in series, the circuit may have three or more log transistors connected in series.

Fourth Embodiment

In a fourth embodiment will be described a configuration applying a field effect transistor capable of modulating a gain coefficient β (hereinafter referred to as an adjustable gain transistor) as a reset transistor shown in the pixel circuits of the third embodiment and its exemplary variation.

Figure 15:
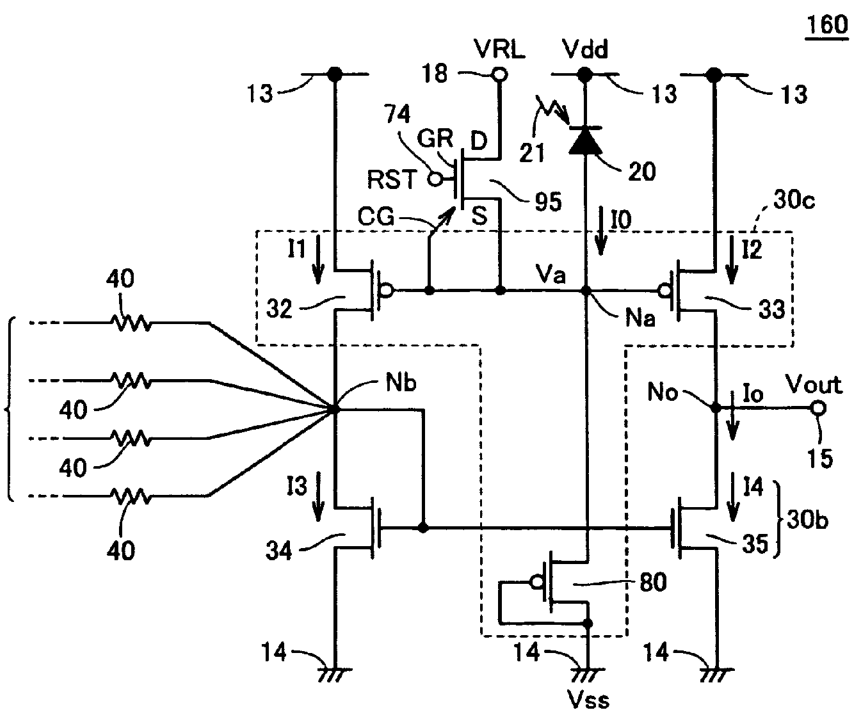
FIG. 15 is a circuit diagram showing a configuration of a pixel circuit in accordance with a fourth embodiment of the present invention.

With reference to FIG. 15, the fourth embodiment provides a pixel circuit 160 different from the third embodiment's pixel circuit 150 (FIG. 10) in that reset transistor 90 is replaced with a reset transistor 95.

Reset transistor 95 is implemented by a p channel, adjustable gain transistor. As will be described hereinafter, an adjustable gain transistor has a gate similar to that of a normal field effect transistor (hereinafter also referred to as a "normal gate"), a source and a drain, and in addition thereto a control gate CG, and its gain coefficient β varies with control gate CG's voltage (hereinafter simply referred to as "control gate voltage").

Description of Adjustable Gain Transistor

Initially, an adjustable gain transistor's principle and operation will be described in detail.

Figure 16A:
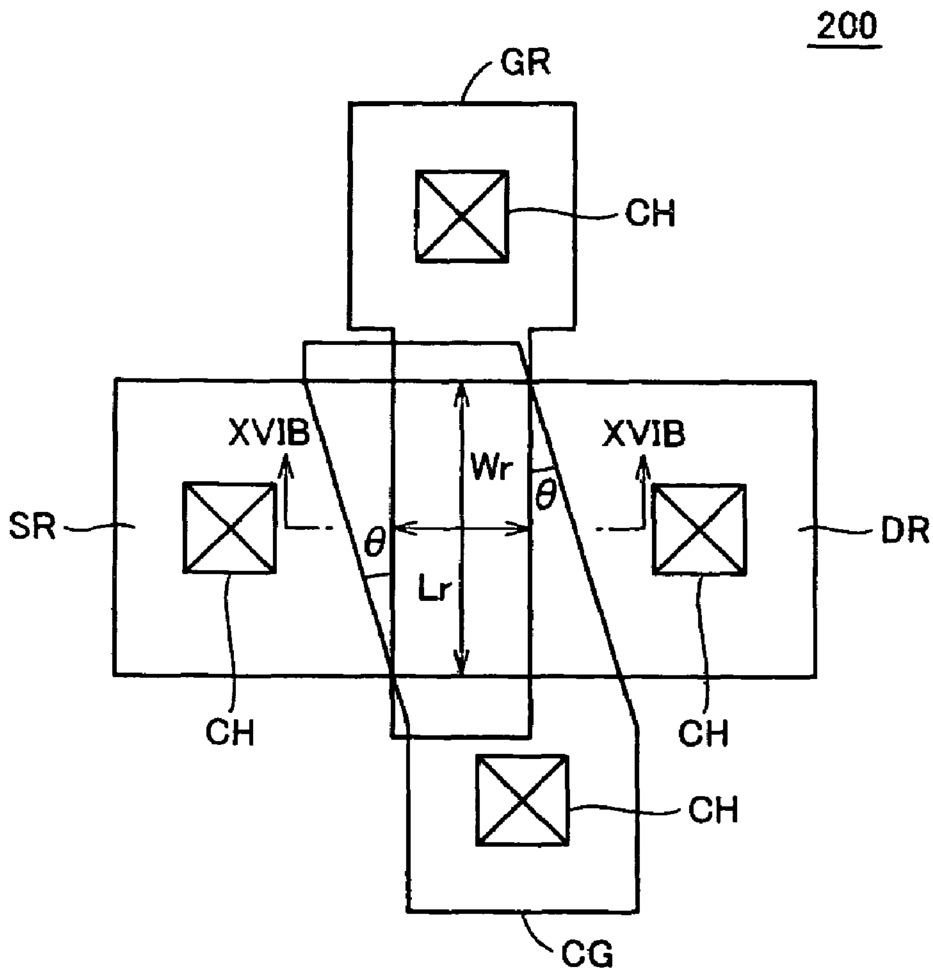
FIGS. 16A and 16B are views for illustrating a first exemplary configuration of an adjustable gain transistor.
Figure 16B:
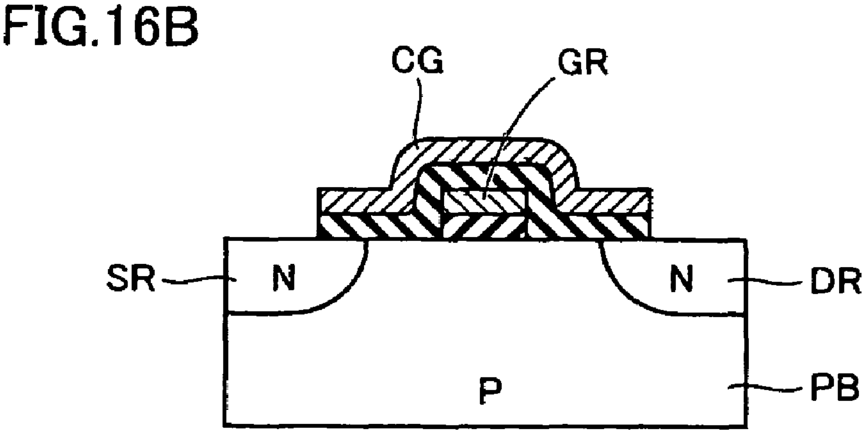

FIG. 16A shows a first exemplary configuration of an adjustable gain transistor (of n channel), and FIG. 16B is a cross section taken along a line XVIB-XVIB of FIG. 16A.

FIGS. 16A and 16B show an n channel, adjustable gain transistor 200, which includes a p silicon substrate PB having a surface provided with a normal gate GR in a strip with an insulation film posed therebetween, and normal gate GR is also covered with control gate CG with an insulation layer therebetween. Control gate CG is arranged obliquely to form an angle θ relative to normal gate GR.

A rectangular region having a center, as seen lengthwise, orthogonal to normal gate GR is doped with n dopant to have a source SR and a drain DR at one and the other sides, respectively, relative to gates GR and CG. Normal gate GR, control gate CG, source SR and drain DR are each connected to another node via a contact hole CH. Adjustable gain transistor 200 has the normal gate GR gate length and width Lr and Wr and angle θ formed by normal gate CR and control gate CG as parameters.

Figure 17B:
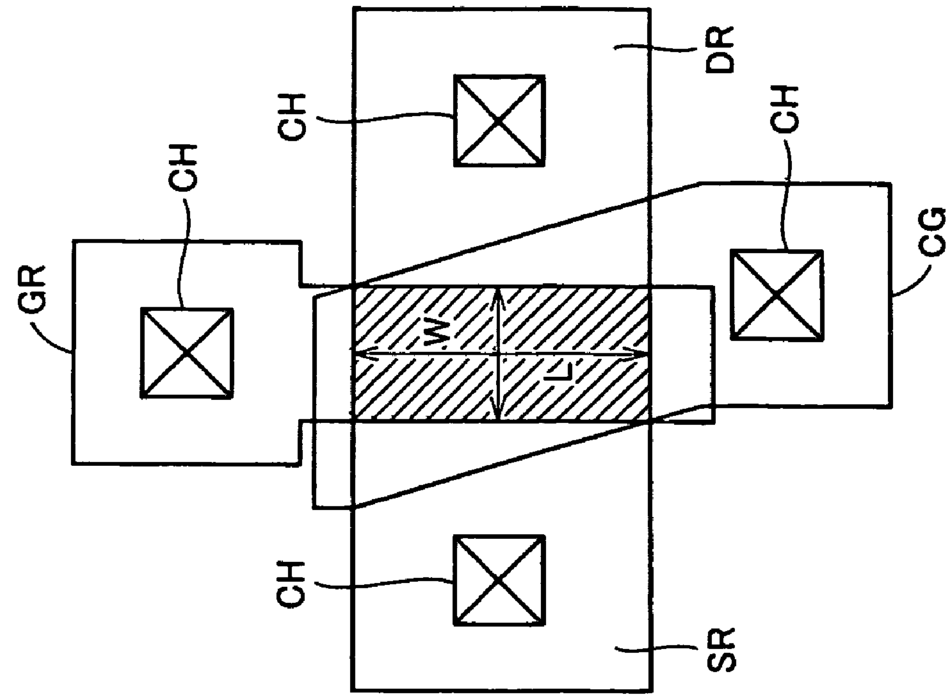
FIGS. 17A and 17B show a theory of $\beta$ modulation of the FIGS. 16A and 16B adjustable gain transistor.
Figure 17A:
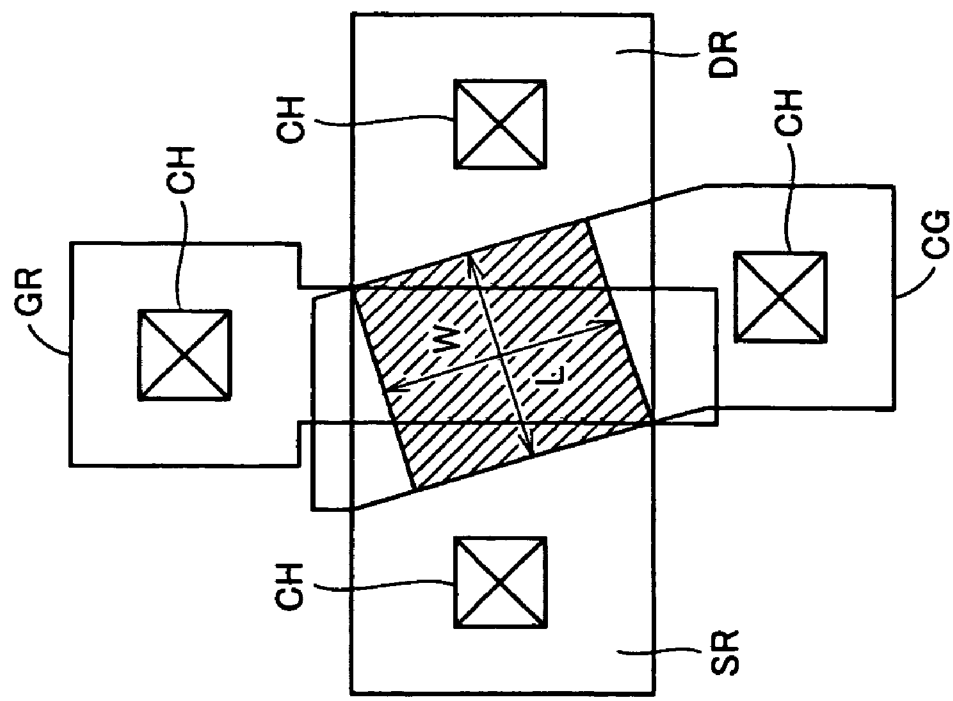

FIGS. 17A and 17B illustrate a theory of β modulation of an adjustable gain transistor. If the control gate voltage is set so that the conductance of a channel under control gate CG is equivalent to or smaller than normal gate GR, a portion shown hatched in FIG. 17A will be an effective gate region. More specifically, effective gate length L and width W are larger and smaller than the normal gate GR gate length Lr and width Wr, respectively, and gain coefficient β decreases.

In contrast, if the control gate voltage is set so that the conductance of the channel under control gate CG is sufficiently larger than normal gate GR, then a portion shown hatched in FIG. 17B will be an effective gate region. More specifically, effective gate length L and width W are equivalent to the normal gate CR gate length Lr and width Wr, and gain coefficient β increases.

Thus by controlling a value in resistance (conductance) of a channel under control gate CG in accordance with control gate voltage an electric field of a direction of a channel applied to that under normal gate GR can be modulated in direction to change effective gate length and width. Thus the adjustable gain transistor 200 gain coefficient β continuously varies with the control gate voltage. Note that the range within which gain coefficient β modulates can be set by the above device geometry parameters Wr, Lr, θ.

In FIGS. 16A and 16B, normal gate GR is covered with control gate CG obliquely arranged. Alternatively, control gate CG may have removed a portion upper than normal gate GR. Alternatively, normal gate GR obliquely arranged may be covered with control gate CG formed in a strip. Alternatively, normal gate GR in the form of the letter V may be covered with control gate CG provided in the form of a trip (see International Publication WO02/059979).

Alternatively, as will be described hereinafter, control gate CG may be provided in a rectangle, rather than in an oblique line traversing control gate GR.

Figure 18:
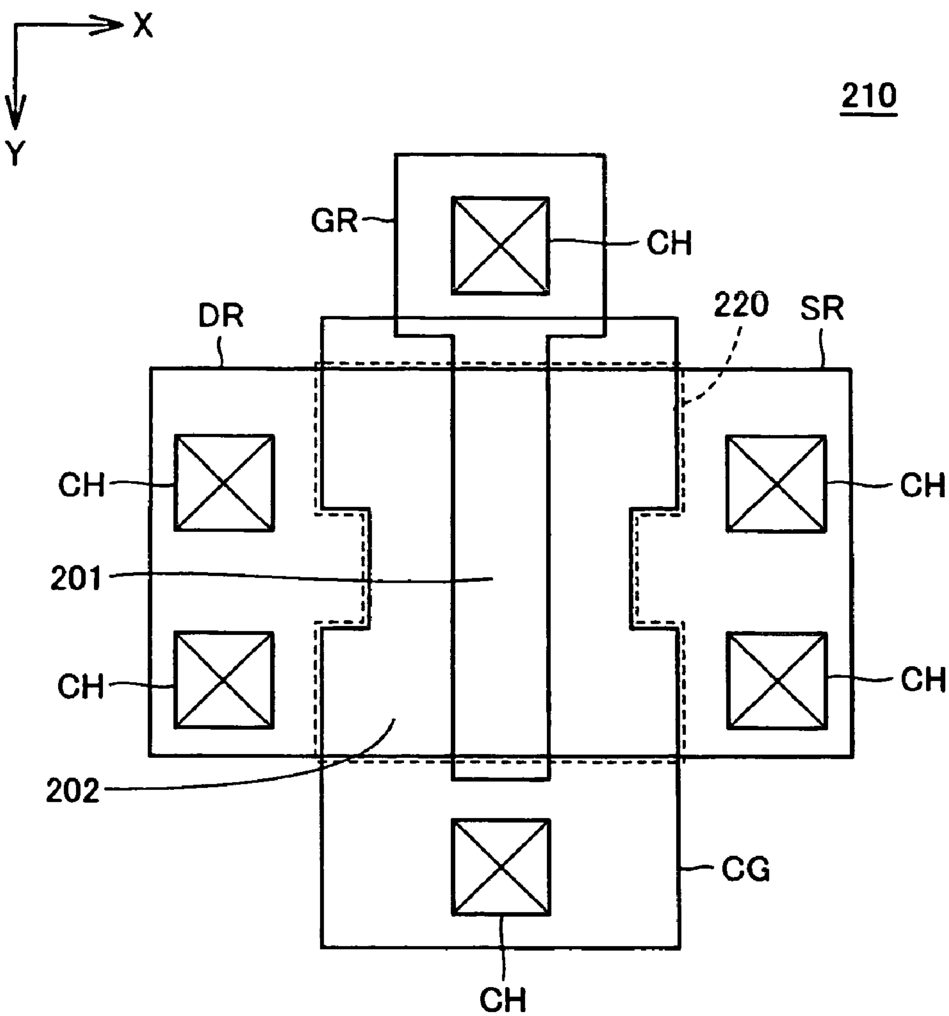
FIG. 18 is a view for illustrating a second exemplary configuration of adjustable gain transistor.
Figure 19:
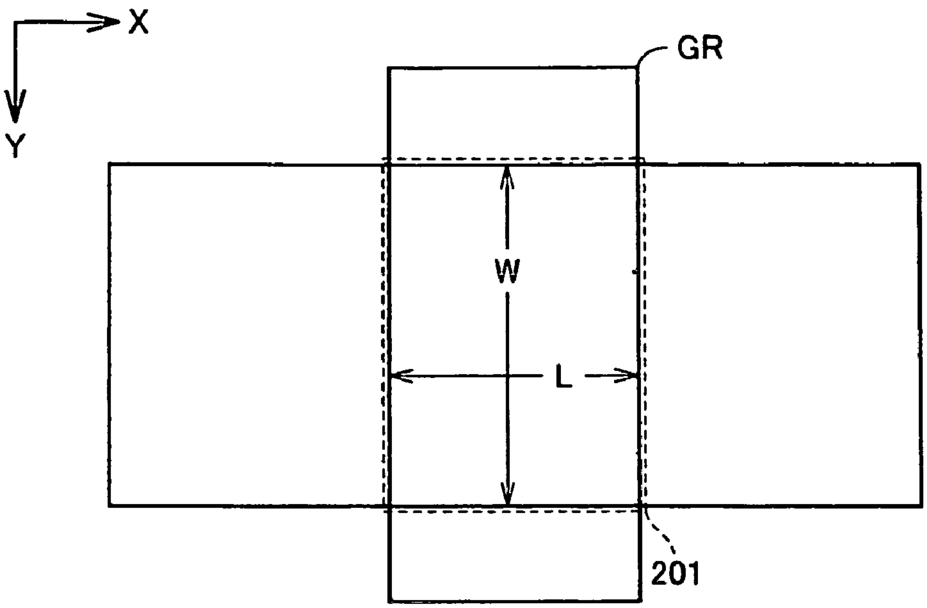
FIGS. 19 and 20 are diagrams for illustrating a geometry parameter of a normal gate shown in FIG. 18.
Figure 20:
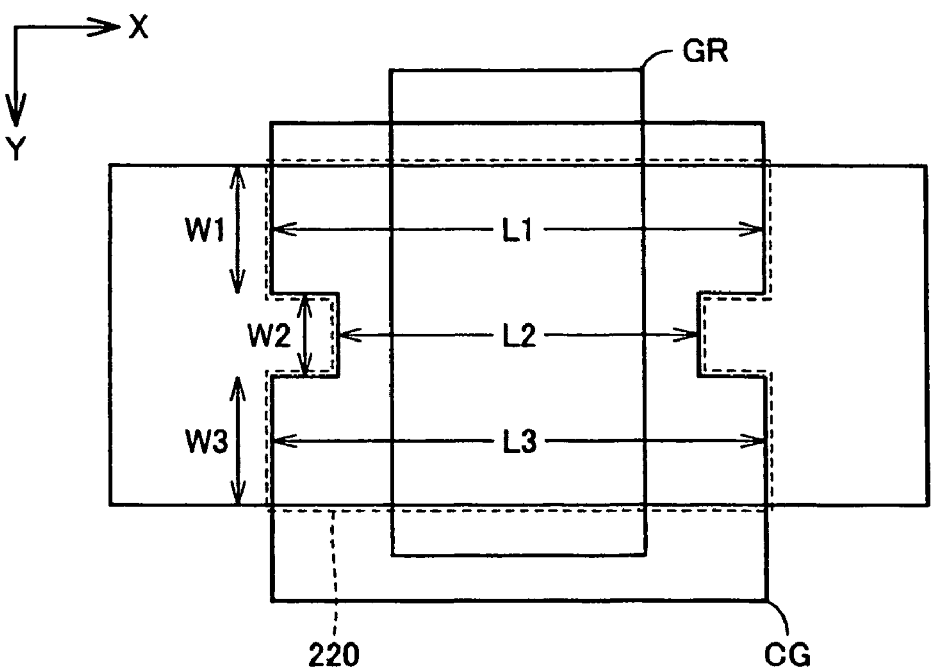

FIGS. 18-20 are diagrams for illustrating the adjustable gain transistor's second exemplary configuration.

With reference to FIG. 18, normal gate GR in the form of a rectangle has a length and a width in directions X and Y, respectively, for the sake of illustration. In other word, normal gate GR has a planar geometry surrounded only by a group of orthogonal straight lines extending in directions X and Y. As shown in FIG. 19, the normal gate GR planar geometry is represented with gate length L and gate width W as geometrical parameters.

Adjustable gain transistor 210 also has a planar geometry surrounded only by a group of straight lines extending in directions X and Y. Normal gate GR, drain DR, source SR and control gate CG are provided with contact hole CH for leading electrodes.

Between drain DR and source SR, normal gate GR forms a channel region 201, and control gate CG forms a channel region 202. Normal gate GR and control gate CG are arranged such that channel regions 201 and 202 may have geometrical continuity.

Control gate CG has a nonuniform gate width, and has such a geometry that discontinuity in gate length occurs at least in a portion as a position changes in the direction (direction Y) of gate width. Further, control gate CG has a portion, which is located between drain DR and source SR, and overlaps at least partially with normal gate GR in a plan view.

For example, control gate CG has an I-shaped planar geometry so that the channel length may have two different values. The I-shaped control gate CG located between drain DR and source SR covers normal gate GR having a rectangular form in a plan view. As shown in FIG. 20, the I-shaped geometry of control gate CG is expressed with local gate widths W1, W2 and W3 as well as local gate lengths L1, L2 and L3 (L1=L3 for adjustable gain transistor 210), which are geometrical parameters, respectively.

In adjustable gain transistor 210 gain coefficient β is modulated as will be described hereinafter.

Figure 21:
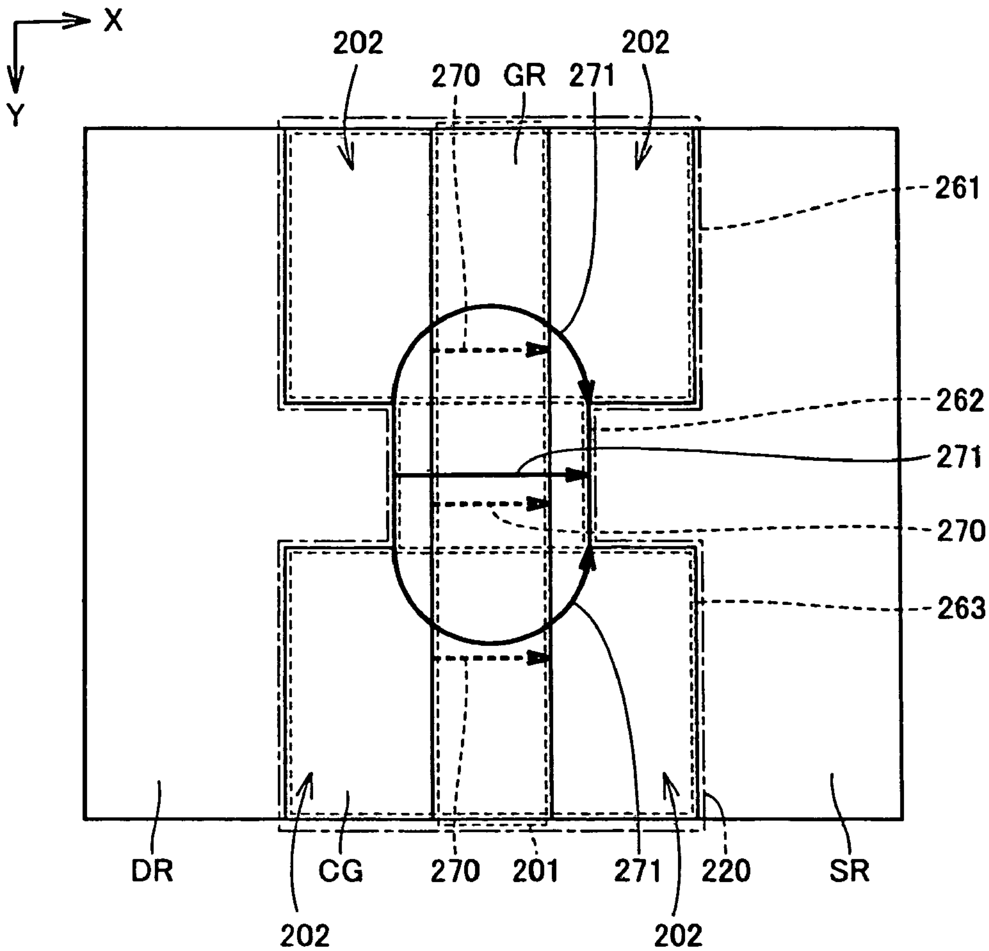
FIG. 21 represents a theory of $\beta$ modulation of the FIG. 18 adjustable gain transistor.

With reference to FIG. 21, in adjustable gain transistor 210 channel region 202 under control gate CG has a substantially concave portion located between normal gate GR, and drain DR and source SR. A combination of channel region 201 provided by normal gate GR and channel region 202 provided by control gate CG provides a whole channel region 220 substantially having an I-shaped-geometry.

Since normal gate GR and control gate CG are both present, the electric field occurring in whole channel region 220 changes depending on the channel conductance under control gate CG. Thus, the electric field changes, in the strict sense, depending on a ratio between voltages applied to control gate CG and normal gate GR (hereinafter referred to as "normal gate voltage"), and changes depending substantially on the control gate voltage.

When the channel conductance under control gate CG is sufficiently high, electric field vectors occurring in whole channel region 220 are uniform in direction X, as indicated in FIG. 21 by a dotted line 270. Consequently, the whole channel region 220 equivalent channel width and length become equivalent to the normal gate GR gate length L and width W.

In contrast, if the channel conductance under control gate CG is sufficiently low, the electric field vectors occurring in whole channel region 220 become irregular in regions 261, 262 and 263, which are divided in accordance with nonuniformity in gate length of control gate CG, as indicated in FIG. 21 by a solid line 271. More specifically, in region 262 having a relatively short gate length, the electric field vectors occur in direction X similarly to those indicated by dotted line 271. In regions 261 and 263 having a relatively large gate length, however, wraparound of the electric fields occurs due to partial or local changes in electric fields.

In regions 261 and 263, the gate length is relatively long so that the electric field in region 262 having a relatively short gate length is larger than those in regions 261 and 263. Thus, region 262 of relatively strong electric fields and regions 261 and 263 of relatively weak electric fields provide nonuniform electric fields in whole channel region 220. In adjustable gain transistor 210 a partial or local change in an electric field can be caused to provide partially changed channel resistance to cause a difference in intensity of the electric fields in the channel region.

As a result, weak electric field regions 261 and 263 have conductances g1 and g3 relatively smaller than a conductance g2 of strong electric field region 262. The conductance of channel region 202 is equal to a sum of conductances g1, g2 and g3 of regions 261, 262 and 263, which are connected in parallel. In this case, therefore, the conductance of whole channel region 220 is smaller than that in the case where uniform electric fields are formed throughout the region, i.e., in the case the channel conductance under the control gate is sufficiently high.

Thus when the channel conductance under control gate CG is sufficiently low, the conductance of whole channel region 220, i.e., the gain coefficient of adjustable gain transistor 210 assumes a minimum value βmin. In this case, a ratio of Wgc/Lgc between effective gate length Lgc and gate width Wgc of whole channel region 220 is smaller than a ratio (W/L) of the gate length and gate width of normal gate GR. Thus, the effective gate length and gate width of whole channel region 220 will be modulated due to the electric field difference occurring in the channel region.

When the channel conductance under control gate CG is sufficiently high, whole channel region 220 provides a region of uniform and strong electric fields, and the conductance of whole channel region 220, i.e., the gain coefficient of adjustable gain transistor 210 assumes a maximum value βmax. As described above, the electric field (maximum wraparound) corresponding to minimum gain coefficient βmin indicated by dotted line 170, the electric field (uniform in direction X) corresponding to maximum gain coefficient βmax indicated by solid line 171, or electric fields intermediate between these electric fields occur in whole channel region 220 in accordance with the ratio between the normal gate voltage and the control gate voltage. In particular, the intermediate electric field changes in an analog manner in accordance with the ratio between the normal gate voltage and the control gate voltage.

Note that for adjustable gain transistor 210 of n channel, the lower control gate voltage Vgc is, the lower the channel region 202 conductance is. In contrast, for adjustable gain transistor 210 of p channel, the higher control gate voltage Vgc is, the lower the channel region 202 conductance is.

Thus adjustable gain transistor 210 can also have a gain coefficient continuously modulated in accordance with the control gate voltage. Note that gain coefficient β can be modulated within a range set by the above mentioned geometrical parameters W1-W3, L1-L3 and the like.

Figure 22:
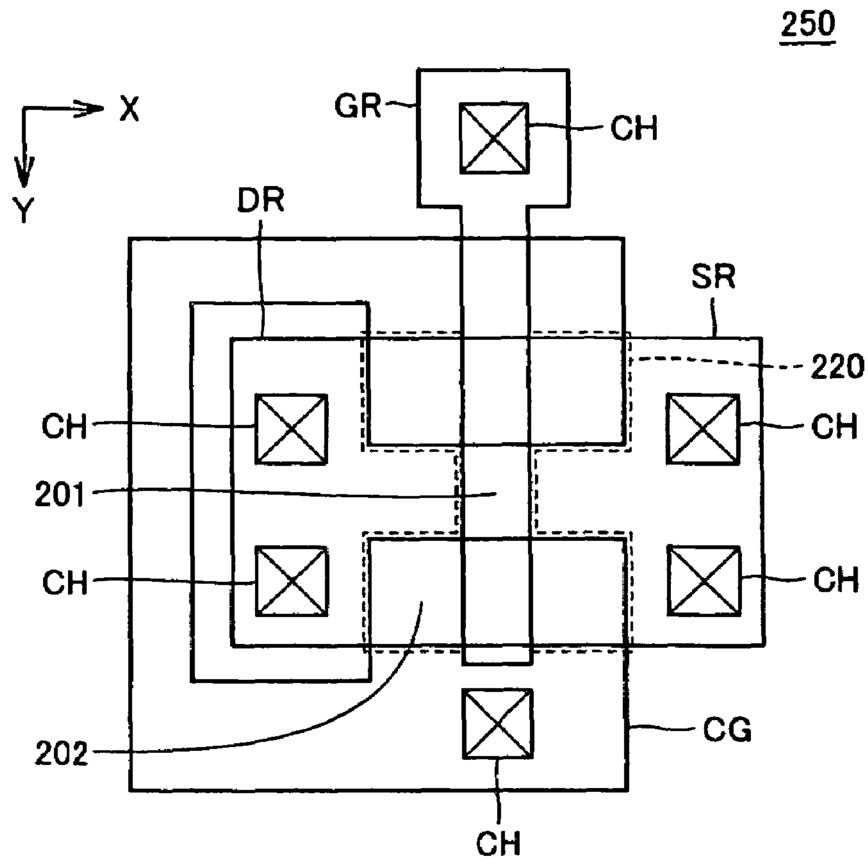
FIGS. 22-24 are diagrams for illustrating third to fifth exemplary configurations of the adjustable gain transistor.
Figure 23:
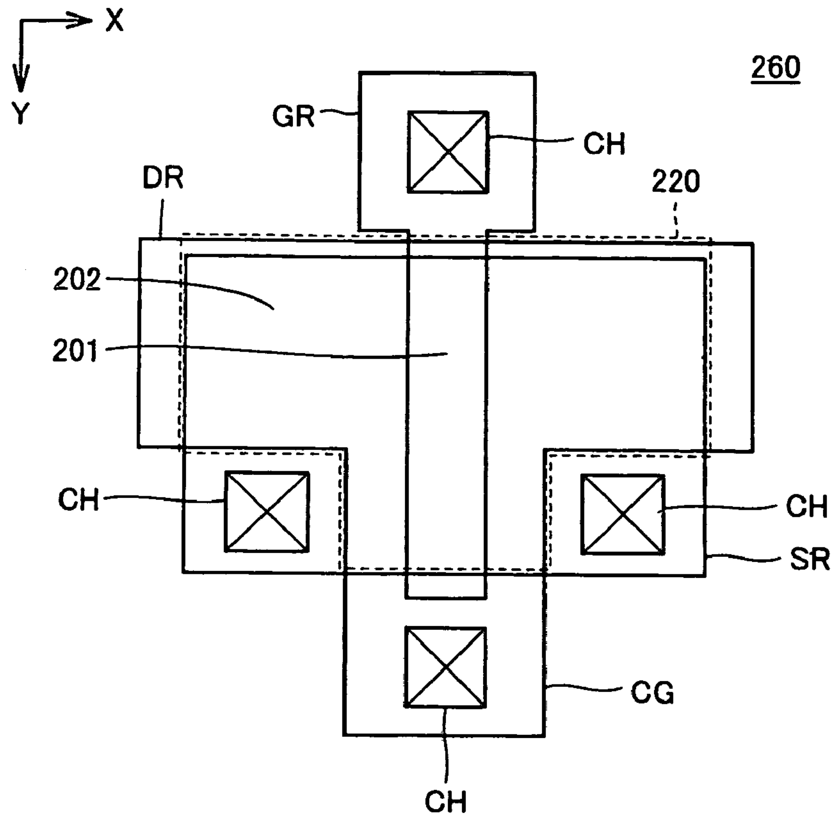
Figure 24:
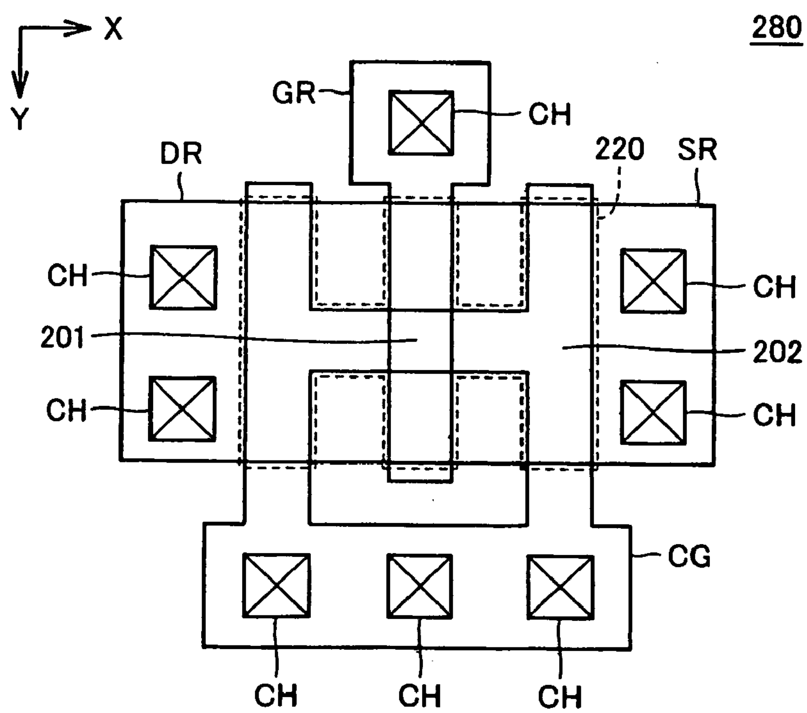

Alternatively, derived from the FIG. 18 adjustable gain transistor 210, control gate CG may have geometries as shown in FIGS. 22-24.

FIG. 22 shows an adjustable gain transistor 250, in which control gate CG has a center, as seen in direction Y, intermittently removed to have a discontinuous geometry, and is also provided at a portion of a region overlapping normal gate GR, as seen in a plane. Control gate CG at the intermittently removed portion has a length different than the remainder, and a mechanism similar to that of adjustable gain transistor 210 shown in FIG. 18 allows adjustable gain transistor 250 to have gain coefficient β modulated in accordance with control gate voltage.

FIG. 23 shows an adjustable gain transistor 260, in which control gate 105 has a T-shaped geometry in a plan view and is located in a region between drain DR and source SR to cover normal gate GR, as seen in a plan view. Furthermore, FIG. 24 shows an adjustable gain transistor 280, in which control gate CG has a bridge-like portion, which extends in direction X only through a central portion of a region overlapping with normal gate GR in a plan view, and is not formed in other portions of the overlapping region. Thus if control gate CG is rectangular, designing it to at least partially overlap normal gate GR, as seen in a plane, and have a length partially varying as seen widthwise can configure an adjustable gain transistor capable of modulating gain coefficient β in accordance with control gate voltage.

It can be understood from the above description that for an adjustable gain transistor of n channel, gain coefficient β increases and decreases as control gate voltage increases and decreases, respectively, and for a p channel, adjustable gain transistor, gain coefficient β increases and decreases as control gate voltage decreases and increases, respectively.

Operation of Pixel Circuit of the Fourth Embodiment

With reference again to FIG. 15, the fourth embodiment's pixel circuit 160 employs the above described adjustable gain transistor (of n channel) as reset transistor 95 with its control gate CG connected to node Na. Thus the reset transistor 95 has gain coefficient β or current driving force varying with the node Na voltage Va. More specifically, reset transistor 95 has a current driving force decreased and increased as voltage Va reaches lower voltage (toward ground voltage Vss) and higher voltage (toward power supply voltage Vdd), respectively.

Thus, at a timing of activation of reset pulse RST, node Na, with voltage Va generated by log transistor 80 in accordance with photocurrent IO, is driven by reset transistor 95 to reset voltage VRL (VRL≈Vss). As such, whether the node Na voltage Va is reset to reset voltage VRL is determined by which of log transistor 80 and reset transistor 95 has relatively larger current driving force. Accordingly, whether reset operation is performed in response to reset pulse RST is determined by the node Na voltage.

Figure 25:
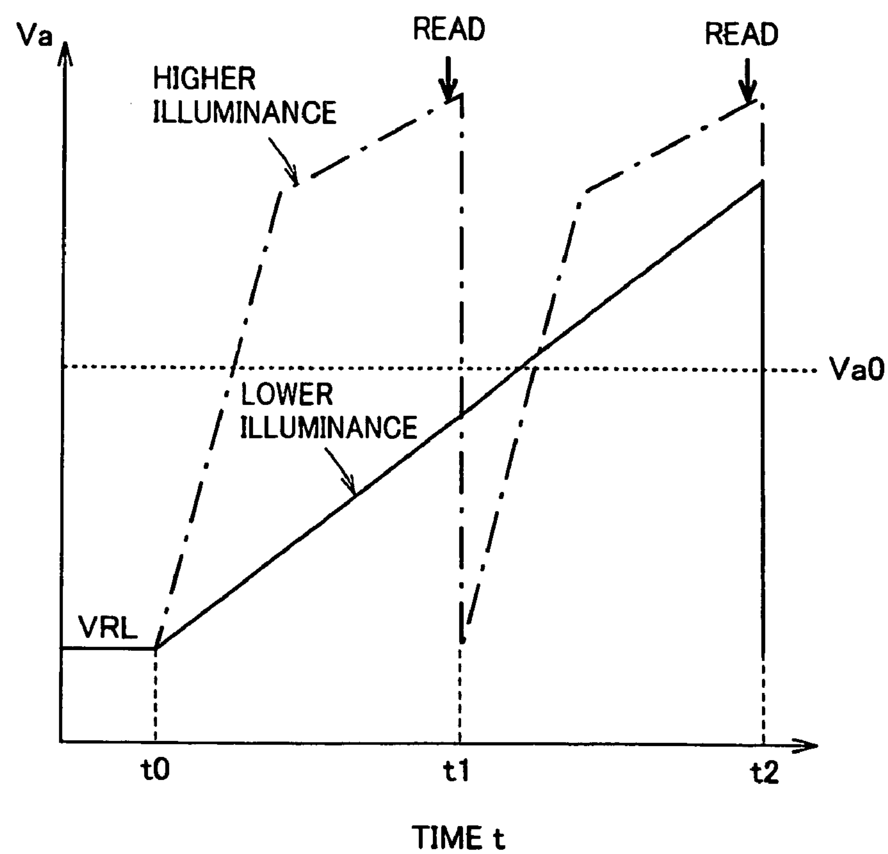
FIG. 25 is a waveform diagram representing an operation of the pixel circuit in accordance with the fourth embodiment.

FIG. 25 is a waveform diagram representing an operation of pixel circuit 160.

FIG. 25 indicates a variation with time of voltage Va of node Na for higher illuminance or when pixel circuit 160 receives light higher in intensity, as indicated by a dashed line, and a variation with time of voltage Va for lower illuminance or when pixel circuit 160 receives light lower in intensity, as indicated by a solid line. Reset pulse RST is set to have an active state (high level) periodically (in FIG. 25, at time points t0, t1, t2) for a fixed period. In initialization, voltage Va is reset to reset voltage VRL for the sake of illustration.

For voltage Va higher than a boundary voltage Va0, the reset transistor 95 current driving force is larger than the log transistor 80 current driving force. In that case, when reset pulse RST is activated and in response reset transistor 95 conducts, voltage Va is reset to reset voltage VRL.

In contrast, for voltage Va lower than boundary voltage Va0, the reset transistor 95 current driving force is smaller than the log transistor 80 current driving force. In that case, when reset pulse RST is activated and in response reset transistor 95 conducts, voltage Va is not reset to reset voltage VRL.

Boundary voltage Va0 can be set to a prescribed voltage between reset voltage VRL and power supply voltage Vdd by designing a transistor size of log transistor 80 and a geometrical parameter of the adjustable gain transistor.

For higher illuminance (indicated by the dashed line), photodiode 20 has a relatively large photocurrent I0 flowing therethrough and voltage Va rapidly increases. When the log transistor 80 log operation range is entered, however, voltage Vp increases at a reduced rate (or gradient). Voltage output from pixel circuit 160 is read immediately before the subsequent timing for reset, i.e., immediately before time t1.

The generation of output voltage Vout via that of currents I1, I2 in accordance with voltage Va, i.e., the voltage Va to output voltage Vout conversion operation is similar to that provided in pixel circuit 15 of the third embodiment.

After the output voltage is read, at time t1 voltage Va is higher than boundary voltage Va0 and the reset transistor 95 gain coefficient β is high. In response to reset pulse RST being activated, reset transistor 95 conducts with large current driving force and voltage Va is reset to voltage VRL. If incident light's illumination level is uniform, an operation similar to that for time t0-t1 is also performed for time t1-t2.

In contrast, for lower illuminance (indicated by the solid line) photodiode 20 has a relatively small photocurrent I0 flowing therethrough and voltage Va gradually increases. The log transistor 80 log operation range is not entered, and voltage Va increases substantially with a fixed gradient.

Immediately before time t1 the output voltage is read, and thereafter at time t1 voltage Va is lower than boundary voltage Va0 and the reset transistor 95 gain coefficient β is low, and even when reset pulse RST is activated and in response reset transistor 95 conducts, voltage Va is not reset to reset voltage VRL and voltage Va further, gradually increases with fixed gradient.

The output voltage is read again immediately before time t2 corresponding to a subsequent timing for reset. At time t2, voltage or Va is higher than boundary voltage Va0 and the reset transistor 95 gain coefficient β is high, and when reset pulse RST is activated reset transistor 95 responsively conducts with large current driving force, and voltage Va is reset to reset voltage VRL.

Thus at each timing for reset when reset pulse RST is activated, the execution of a reset operation is controlled in accordance with the node Na voltage Va, or the illuminance of light incident on pixel circuit 160 itself. Thus the fourth embodiment's pixel circuit 160 provides an effect of the third embodiment's pixel circuit 150 and in addition an increased resetting period for lower illuminance to equivalently reduce a frame rate.

For typical semiconductor image pickup devices, all pixel circuit's frame rates are set to have the same value. As such, if for a frame rate (for example of 30 frames/second) a satisfactory image is obtained for the subject's lower illuminance area as well as higher illuminance area, for increased frame rates, however, minimum illuminance required for pickup is reduced, resulting in a blackout image for the lower illuminance area. In other words, if a semiconductor image pickup device having a wide dynamic range can be used to ensure a bandwidth of illuminance allowing an image to be picked up, minimum illuminance required for pickup cannot be ensured. This is not simply a problem associated only with high speed cameras or similar, specific applications but also all semiconductor image pickup device applications as the number of pixels tends to increase in recent years.

Accordingly in the fourth embodiment's pixel circuit 160 when incident light has low intensity a frame rate can equivalently be reduced to also ensure a sufficient quantity of light for lower illuminance area to allow a lowered minimum illuminance required for pickup as an additional effect.

Fourth Embodiment in Exemplary Variation

Figure 26:
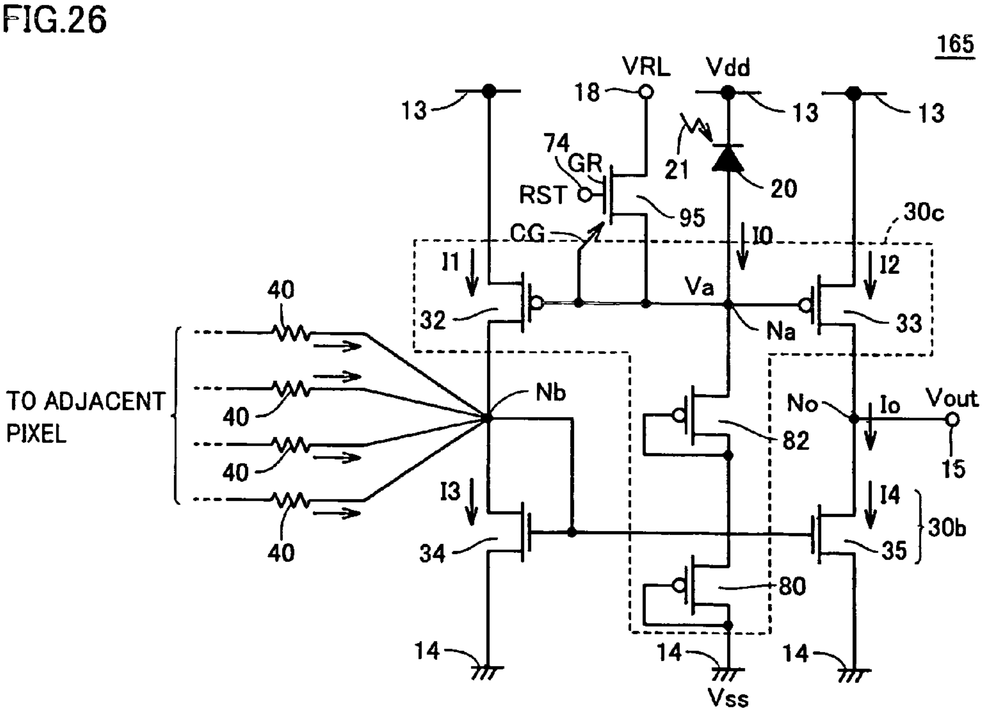
FIGS. 26-28 are circuit diagrams showing configurations of pixel circuits in accordance with first to third exemplary variations, respectively, of the fourth embodiment.

With reference to FIG. 26, the fourth embodiment in a first exemplary variation provides a pixel circuit 165 corresponding to the FIG. 12 pixel circuit 155 although reset transistor 90 implemented by a typical n channel MOS transistor is replaced with reset transistor 95 implemented by an n channel, adjustable gain transistor.

A configuration with a plurality of log transistors connected in series that includes a reset transistor implemented by an n channel, adjustable gain transistor, similarly as provided in pixel circuit 160, can also vary a frame rate in each pixel circuit with intensity of incident light. Consequently the FIG. 26 pixel circuit 165 can achieve an effect of pixel circuit 155 and in addition also obtain a sufficient quantity of light for a lower illumination area to allow a lowered minimum illuminance required for pickup.

Figure 27:
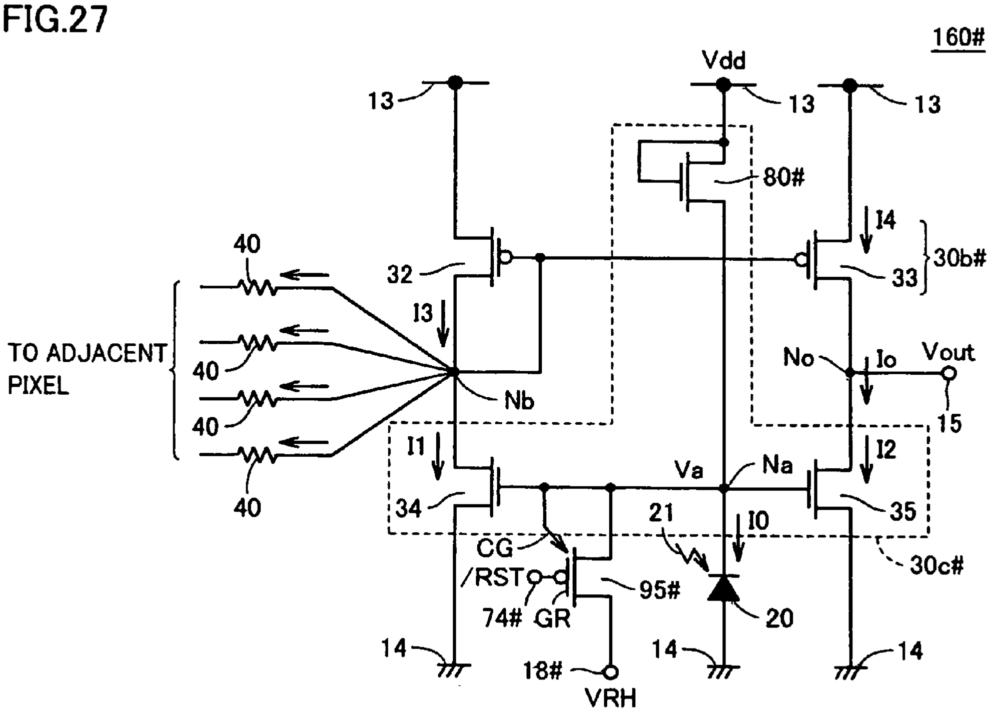

With reference to FIG. 27, the fourth embodiment in a second exemplary variation provides a pixel circuit 160#, which corresponds to the FIG. 13 pixel circuit 150#, although reset transistor 90# implemented by a typical p channel MOS transistor is replaced with a reset transistor 95# implemented by a p channel, adjustable gain transistor.

In pixel circuits 150#, 160# photodiode 20 is connected in such a manner that the node Na voltage Va is reset at reset voltage VRH in the vicinity of power supply voltage Vdd, and after a reset operation is performed, voltage Va reaches lower voltage (toward ground voltage Vss) for higher illuminance of incident light and reaches higher voltage (toward power supply voltage Vdd) for lower illuminance of incident light. As such by connecting to node Na control gate CG of the p channel, adjustable gain transistor implementing reset transistor 95#, the transistor's current driving force decreases for higher voltage Va (or lower illuminance) and increases for lower voltage Va (or high illuminance).

As such, as well as pixel circuit 160, the pixel circuit 160# configuration also allows a reset operation to be performed as controlled in accordance with incident light's illuminance so that for a pixel circuit of lower illuminance an increased resetting period can be set to reduce a frame rate equivalently. Thus the FIG. 27 pixel circuit 160# can achieve an effect of pixel circuit 160 and in addition also obtain a sufficient quantity of light for a lower illumination area to allow a lowered minimum illuminance required for pickup.

Figure 28:
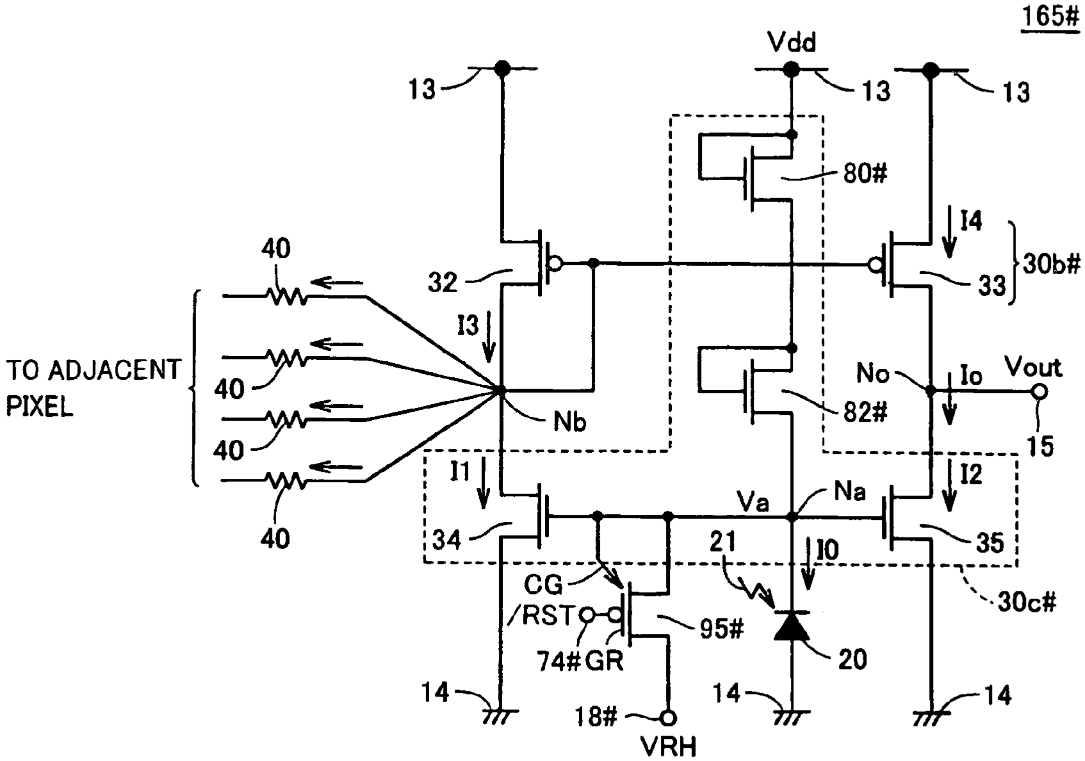

With reference to FIG. 28, the fourth embodiment in a third exemplary variation provides a pixel circuit 165#, which corresponds to the FIG. 14 pixel circuit 155#, although reset transistor 90# implemented by a typical p channel MOS transistor is replaced with reset transistor 95# implemented by a p channel, adjustable gain transistor.

A configuration with a plurality of log transistors connected in series that includes a reset transistor implemented by a p channel, adjustable gain transistor, similarly as provided in pixel circuit 160#, can also vary a frame rate in each pixel circuit with intensity of incident light. Consequently the FIG. 28 pixel circuit 165# can achieve an effect of pixel circuit 1 55# and in addition also obtain a sufficient quantity of light for a lower illumination area to allow a lowered minimum illuminance required for pickup.

Note that pixel circuits 150, 155, 150#, 155#, 160, 165, 160#, 165# described in the third embodiment et seq. can also be provided with the FIG. 5 output select circuit 69 at a stage subsequent to output terminal I5 to provide a configuration capable of reading output voltage Vout in accordance with selection of a row and that of a column. For example, pixels configured of a combination of the pixel circuits and output select circuit 60 can be arranged in a matrix to configure a semiconductor image pickup device, similarly as shown in FIG. 4.

Note that the configuration allowing output voltage Vout to be read from a pixel circuit and the technique employing arranging pixels in an array to configure a semiconductor image pickup device are not limited to the above described configuration and can be implemented by any configuration.

Furthermore, power supply voltage Vdd and ground voltage Vss supplied by power supply node 13 and ground node 14, respectively, may be any voltage. In particular, as long as the photodiode can be reversely biased, ground node 14 may be replaced with a power supply node supplying a prescribed voltage other than -ground voltage Vss.

Thus the present semiconductor image pickup device can be used in a variety of situations as a pickup device having high visual detection capability, and it can be utilized for indoor as well as outdoor monitoring cameras, vehicle mounted cameras and the like. Furthermore, it can also reduce a pixel circuit in size so that it is suitable for increased numbers of pixels and mounting in mobile equipment.

Although the present invention has been described and illustrated in detail, it is clearly understood that the same is by way of illustration and example only and is not to be taken by way of limitation, the spirit and scope of the present invention being limited only by the terms of the appended claims.

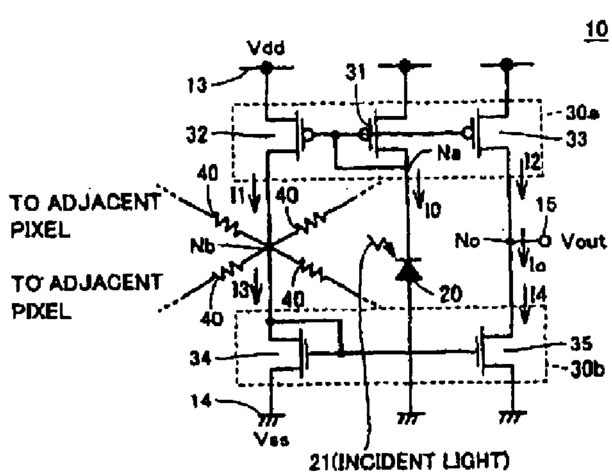

What is claimed is:

1. A semiconductor image pickup device comprising:

a plurality of pixel circuits each including a photodetection element generating at a first node a photocurrent corresponding to a quantity of light received, a first current generation circuit connected to said first node and a second node and an output node to generate first and second currents corresponding to said photocurrent flowing through said first node and pass said first and second currents to said second node and said output node, respectively, and a second current generation circuit connected to said second node and said output node to generate a fourth current corresponding to a third current passing through said second node and allow a differential current between said second and fourth currents to flow through said output node; and an inter-pixel connect electrically connecting said second node of each of said pixel circuits to said second node of an adjacent, at least one of said pixel circuits.

2. The semiconductor image pickup device of claim 1, wherein said inter-pixel connect includes a resistance component connected between said second nodes of different ones of said pixel circuits, respectively.

3. The semiconductor image pickup device of claim 1, wherein said first current generation circuit is designed to provide said first and second currents larger than said photocurrent.

4. The semiconductor image pickup device of claim 1, wherein said pixel circuits each further include:

an integrator circuit operative to provide an integral of a current passing through said output node; and a reset circuit operative to reset said integral.

5. The semiconductor image pickup device of claim 1, wherein:

said first current generation circuit includes a first transistor electrically connected between a first power supply node supplying a first prescribed voltage and said first node, a second transistor electrically connected between said first power supply node and said second node, and a third transistor electrically connected between said first power supply node and said output node;

said second current generation circuit includes a fourth transistor electrically connected between a second power supply node supplying a second prescribed voltage different from said first prescribed voltage and said second node, and a fifth transistor electrically connected between said output node and said second power supply node; and said first, second and third transistors each have a control electrode electrically connected to said first node;

said fourth and fifth transistors each have a control electrode electrically connected to said second node.

6. The semiconductor image pickup device of claim 5, wherein said pixel circuits each further include a capacitor electrically connected to said output node, and a sixth transistor electrically connected between a node supplying a prescribed reset voltage and said output node to turn on when reset.

7. The semiconductor image pickup device of claim 1, wherein:

said photodetection element is implemented by a photodiode electrically connected between a first power supply node supplying a first prescribed voltage and said first node to be reversely biased; and said first current generation circuit includes a first transistor electrically connected between a second power supply node supplying a second prescribed voltage different from said first prescribed voltage and said first node to generate at said first node a voltage corresponding to said photocurrent, a second transistor electrically connected between said first power supply node and said second node and having a control electrode electrically connected to said first node, and a third transistor electrically connected between said first power supply node and said output node and having a control electrode electrically connected to said first node;

said second current generation circuit includes a fourth transistor electrically connected between said second power supply node and said second node and having a control electrode electrically connected to said second node, and a fifth transistor electrically connected between said second power supply node and said output node and having a control electrode electrically connected to said second node.

8. The semiconductor image pickup device of claim 7, wherein:

said first prescribed voltage is higher than said second prescribed voltage;

said first transistor is implemented by a p channel field effect transistor having a gate and a drain mutually connected, and a source electrically connected to said first node; and said photodiode has a cathode electrically connected to said first power supply node, and an anode electrically connected to said first node.

9. The semiconductor image pickup device of claim 8, wherein more than one said field effect transistor are connected in series between said second power supply node and said first node.

10. The semiconductor image pickup device of claim 7, wherein:

said first prescribed voltage is lower than said second prescribed voltage;

said first transistor is implemented by an n channel field effect transistor having a gate and a drain mutually connected, and a source electrically connected to said first node; and said photodiode has a cathode electrically connected to said first node, and an anode electrically connected to said first power supply node.

11. The semiconductor image pickup device of claim 10, wherein more than one said field effect transistor are connected in series between said second power supply node and said first node.

12. The semiconductor image pickup device of claim 7, wherein said pixel circuits each include a reset circuit provided between a reset voltage node supplying a prescribed reset voltage and said first node and operative at prescribed periods to electrically connect said first node to said reset voltage node, said reset voltage being determined to have a difference in voltage from said second prescribed voltage to fall within a range of a gate-source voltage corresponding to a weak inversion region of said first transistor.

13. The semiconductor image pickup device of claim 7, wherein said pixel circuits each include a reset circuit provided between a reset voltage node supplying a prescribed reset voltage and said first node to operate at prescribed periods, said reset circuit in each operation being driven by a difference between a current level in voltage of said first node and said reset voltage to determine whether to perform a reset operation setting said first node's voltage to said reset voltage.

14. The semiconductor image pickup device of claim 13, wherein:

said first prescribed voltage is higher than said second prescribed voltage;

said photodiode has a cathode electrically connected to said first power supply node, and an anode electrically connected to said first node;

said reset circuit includes an n channel, adjustable gain transistor connected between said reset voltage node and said first node and having a gain coefficient increasing in analog manner in response to a control gate increasing in potential; and said n channel, adjustable gain transistor has a normal gate receiving a reset signal activated to a logically high level at said prescribed periods for a fixed period of time, and said control gate electrically connected to said first node.

15. The semiconductor image pickup device of claim 13, wherein:

said first prescribed voltage is lower than said second prescribed voltage;

said photodiode has a cathode electrically connected to said first node, and an anode electrically connected to said first power supply node;

said reset circuit includes a p channel, adjustable gain transistor connected between said reset voltage node and said first node and having a gain coefficient increasing in analog manner in response to a control gate decreasing in potential; and said p channel, adjustable gain transistor has a normal gate receiving a reset signal activated to a logically low level at said prescribed periods for a fixed period of time, and said control gate electrically connected to said first node.

16. The semiconductor image pickup device of claim 13, wherein said reset voltage is determined to have a difference in voltage from said second prescribed voltage to fall within a range of a gate-source voltage corresponding to a weak inversion region of said first transistor.

* * * * *

UNITED STATES PATENT AND TRADEMARK OFFICE
CERTIFICATE OF CORRECTION

PATENT NO. : 7,435,935 B2
APPLICATION NO. : 10/975993
DATED : October 14, 2008
INVENTOR(S) : Hirotsu et al.

It is certified that error appears in the above-identified patent and that said Letters Patent is hereby corrected as shown below:

In Figures, delete sheet 1 of 23 through sheet 23 of 23 and replace with the attached Page 1 of 23 through Page 23 of 23.

FIG.1

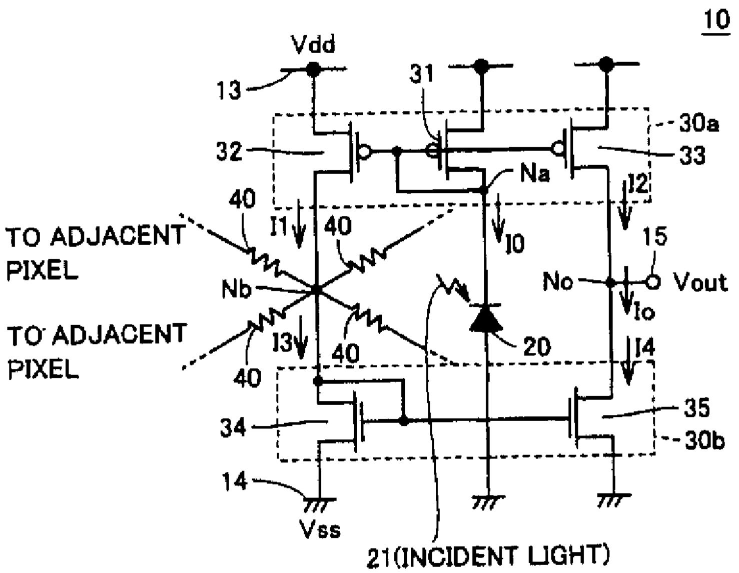

Signed and Sealed this

Twenty-seventh Day of July, 2010

David J. Kappos
*Director of the United States Patent and Trademark Office*

UNITED STATES PATENT AND TRADEMARK OFFICE

CERTIFICATE OF CORRECTION

PATENT NO. : 7,435,935 B2
APPLICATION NO. : 10/975993
DATED : October 14, 2008
INVENTOR(S) : Hirotsu et al.

It is certified that error appears in the above-identified patent and that said Letters Patent is hereby corrected as shown below:

Delete the title page and substitute therefore the attached title page consisting of the corrected illustrative figure 1.

In Figures, delete sheet 1 of 23 through sheet 23 of 23 and replace with the attached Page 1 of 23 through Page 23 of 23.

This certificate supersedes the Certificate of Correction issued July 27, 2010.

Signed and Sealed this

Fifth Day of October, 2010

David J. Kappos
*Director of the United States Patent and Trademark Office*

(12) United States Patent
Hirotsu et al.

(10) Patent No.: US 7,435,935 B2
(45) Date of Patent: Oct. 14, 2008

(54) SEMICONDUCTOR IMAGE PICKUP DEVICE WITH DUAL CURRENT GENERATION CIRCUIT CAPABLE OF SENSING LIGHT OVER WIDER RANGE

(75) Inventors: Fusayoshi Hirotsu, 2-6, Hanatachibana 1-chome, Shingumachi, Kasuya-gun, Fukuoka (JP); Junichi Hirotsu, Kitakyushu (JP)

(73) Assignee: Fusayoshi Hirotsu, Fukuoka (JP)

(*) Notice: Subject to any disclaimer, the term of this patent is extended or adjusted under 35 U.S.C. 154(b) by 897 days.

(21) Appl. No.: 10/975,993

(22) Filed: Oct. 29, 2004

(65) Prior Publication Data

US 2005/0117042 A1 Jun. 2, 2005

(30) Foreign Application Priority Data

Oct. 30, 2003 (JP) ............................ 2003-370574
Sep. 17, 2004 (JP) ............................ 2004-271378

(51) Int. Cl.
*H01L 27/00* (2006.01)

(52) U.S. Cl. ................................ 250/208.1; 250/214 R

(58) Field of Classification Search .............. 250/208.1, 250/214 R; 348/296–314; 257/290–292, 257/440

See application file for complete search history.

(56) References Cited

U.S. PATENT DOCUMENTS 5,481,118 A 1/1996 Tew
6,323,479 B1 11/2001 Hynecek et al.
7,139,024 B2 * 11/2006 Lu et al. ..................... 348/303

FOREIGN PATENT DOCUMENTS

JP 2000-340779 12/2000
WO WO 02/059979 A1 8/2002

OTHER PUBLICATIONS

Taiwanese Office Action dated Aug. 30, 2005 for Appln. No. 093131581, inventor Fusayoshi Hirotsu.
Takada, K. et al., "Chapter 3: Logarithmic Transformation CMOS Image Sensor Technology and Application in Minolta/ROHM in *CCD/CMOS Image Sensor Technology*", TRICEPS, pp. 107-117, (Jul. 2000).

* cited by examiner

*Primary Examiner*—Quc T Le
(74) *Attorney, Agent, or Firm*—Finnegan, Henderson, Farabow, Garrett & Dunner, L.L.P.

(57) ABSTRACT

A semiconductor image pickup device's pixel circuits each include a photodetection element, and first and second current mirror circuits provided as current generation circuit. The photodetection element generates at a node a photocurrent corresponding to a quantity of light received. The first current mirror circuit passes first and second currents corresponding to the photocurrent to an internal node and an output node, respectively. The second current mirror circuit is connected to generate a fourth current corresponding to a third current passing through the internal node and also allow a differential current between the second and fourth currents to flow through the output node. Each pixel circuit has its internal node electrically connected by a resistance component, which implements an inter-pixel connect, to the internal node of at least one of adjacent pixel circuits. An output current will be a current corresponding to a relative difference between the photocurrent of the pixel circuit of interest and the third current corresponding to an average quantity of light received at adjacent pixels. Thus a high precision, miniaturized semiconductor image pickup device can be provided that can detect bright and dark portions in sufficient contrast even if there is a large brightness distribution within a single field of view.

16 Claims, 23 Drawing Sheets